(12) United States Patent
Takizawa

(10) Patent No.: US 7,582,391 B2
(45) Date of Patent: *Sep. 1, 2009

(54) TWO-PHOTON ABSORPTION DECOLORIZABLE MATERIAL, TWO-PHOTON ABSORPTION REFRACTIVE INDEX MODULATION MATERIAL, TWO-PHOTON ABSORPTION POLYMERIZATION MATERIAL, TWO-PHOTON ABSORPTION POLYMERIZATION METHOD AND THREE-DIMENSIONAL OPTICAL RECORDING MATERIAL

(75) Inventor: Hiroo Takizawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 574 days.

This patent is subject to a terminal disclaimer.

(21) Appl. No.: 11/219,737

(22) Filed: Sep. 7, 2005

(65) Prior Publication Data

US 2006/0083890 A1    Apr. 20, 2006

(30) Foreign Application Priority Data

Sep. 10, 2004    (JP)    ............................ 2004-264202

(51) Int. Cl.
*G03H 1/04* (2006.01)

(52) U.S. Cl. ................... 430/1; 430/2; 430/945; 430/280.1; 430/281.1; 430/290.1; 359/3

(58) Field of Classification Search ................ None
See application file for complete search history.

(56) References Cited

U.S. PATENT DOCUMENTS

| | | | | |
|---|---|---|---|---|
| 3,707,371 A | * | 12/1972 | Files | ................ 430/270.1 |
| 2004/0086803 A1 | * | 5/2004 | Takizawa et al. | ........ 430/270.18 |
| 2004/0191679 A1 | * | 9/2004 | Shibuya | ................. 430/270.1 |
| 2004/0245432 A1 | * | 12/2004 | Takizawa | ................. 250/208.1 |
| 2005/0003133 A1 | * | 1/2005 | Akiba et al. | ............... 428/64.2 |
| 2005/0019711 A1 | * | 1/2005 | Takizawa | .................... 430/561 |
| 2005/0214650 A1 | * | 9/2005 | Takizawa et al. | ............... 430/1 |
| 2005/0221198 A1 | * | 10/2005 | Takizawa et al. | ............... 430/1 |
| 2006/0077870 A1 | * | 4/2006 | Inoue et al. | ............. 369/275.1 |
| 2006/0077875 A1 | * | 4/2006 | Inoue et al. | ............. 369/275.1 |
| 2006/0078803 A1 | * | 4/2006 | Takizawa et al. | ............... 430/1 |
| 2006/0188789 A1 | * | 8/2006 | Takizawa et al. | ............... 430/1 |
| 2006/0188790 A1 | * | 8/2006 | Takizawa | ...................... 430/1 |
| 2006/0194122 A1 | * | 8/2006 | Takizawa | ...................... 430/1 |
| 2007/0207390 A1 | * | 9/2007 | Takizawa et al. | ............... 430/1 |

FOREIGN PATENT DOCUMENTS

| | | |
|---|---|---|
| JP | 6-028672 A | 2/1994 |
| JP | 6-118306 A | 4/1994 |
| JP | 2000-512061 A | 9/2000 |
| JP | 2001-508221 A | 6/2001 |
| JP | 2001-524245 A | 11/2001 |

* cited by examiner

*Primary Examiner*—Martin J Angebranndt
(74) *Attorney, Agent, or Firm*—Sughrue Mion, PLLC

(57) ABSTRACT

A two-photon absorption decolorizable material comprising: a two-photon absorption dye executing a two-photon absorption; and a decolorizable dye having a molar absorption coefficient equal to or less than 100 at a wavelength of a light irradiated at the two-photon absorption, wherein the decolorizable dye is decolorized by an electron transfer or an energy transfer utilizing an excitation energy obtained by the two-photon absorption of the two-photon absorption dye.

9 Claims, No Drawings

TWO-PHOTON ABSORPTION DECOLORIZABLE MATERIAL, TWO-PHOTON ABSORPTION REFRACTIVE INDEX MODULATION MATERIAL, TWO-PHOTON ABSORPTION POLYMERIZATION MATERIAL, TWO-PHOTON ABSORPTION POLYMERIZATION METHOD AND THREE-DIMENSIONAL OPTICAL RECORDING MATERIAL

BACKGROUND OF THE INVENTION

1. Field of the Invention

The present invention relates to a two-photon absorption decolorizable material characterized in having a large non-resonant two-photon absorbing cross section and capable of decolorizing the non-resonant two-photon absorption dye itself or a separately added decolorizable dye, and a two-photon absorption material for refractive index modulation or absorbance modulation utilizing the same, and a three dimensional optical recording medium.

2. Description of the Related Art

A non-linear optical effect generally indicates a non-linear optical response proportional to a second, third or higher power of an applied photoelectric field, and a second-order non-linear optical effect, proportional to a square of an applied photoelectric field includes a second harmonic wave generation (SHG), a photorectification, a photorefractive effect, a Pockels effect, a parametric amplification, a parametric oscillation, a photofrequency additive mixing and a photofrequency subtractive mixing. Also a third-order non-linear optical effect, proportional to a cube of an applied photoelectric field includes a third harmonic wave generation (THG), an optical Kerr effect, a self-induced change in refractive index, and a two-photon absorption.

A non-linear optical material showing such non-linear optical effect, various inorganic materials have been found. In such inorganic materials, however, a practical application is very difficult because of a difficulty in so-called molecular designing for optimizing the desired non-linear optical characteristics and physical properties required for the preparation of a device. On the other hand, organic compounds have a higher possibility of practical application as they can be optimized, by a molecular designing, to desired non-linear optical characteristics and can be controlled in various physical properties, and are attracting attention as a promising non-linear optical material.

Among the non-linear optical characteristics of the organic compounds, a third-order non-linear optical effect is recently attracting attention, and a non-resonant two-photon absorption is attracting a particular attention. A two-photon absorption means a phenomenon of an excitation of a compound by simultaneously absorbing two photons, and a case where the two-photon absorption takes place in an energy region in which the compound does not have a (linear) absorption band is called a non-resonant two-photon absorption. In the following description, a two-photon absorption means a non-resonant two-photon absorption unless specified otherwise.

An efficiency of the non-resonant two-photon absorption is proportional to a square of a photoelectric field (square characteristics of two-photon absorption). Therefore, in case of a laser irradiation on a two-dimensional plane, the two-photon absorption takes place only in a position of a high electric field strength at a center of the laser spot, and does not take place at all in a peripheral portion where the electric field strength is lower. On the other hand, in a three-dimensional space, the two-photon absorption takes place only in a region of a high electric field strength at a focal point where the laser beam is condensed by a lens, and does not take place at all in a region outside the focal point because of a lower electric field strength. In contrast to a linear absorption which causes an excitation in all the positions in proportion to the strength of the applied photoelectric field, the non-resonant two-photon absorption causes an excitation only in a point within the space, based on the square characteristics, and can therefore significantly improve the spatial resolution.

In case of inducing a non-resonant two-photon absorption, there is generally employed a short pulsed laser of a near infrared region which is longer in wavelength than the wavelength region of the (linear) absorption band of the compound and in which the compound does not have an absorption. Such near infrared exciting light of so-called transparent region can reach the interior of a sample without being absorbed or scattered, and can excite a point in the interior of the sample with an extremely high spatial resolution, owing to the square characteristics of the non-resonant two-photon absorption.

On the other hand, an optical information recording medium (optical disk) capable recording information only once with a laser light is already known, and an add-on type CD (so-called CD-R), an add-on type DVD (so-called DVD-R) and the like are already commercialized.

A DVD-R is representatively constituted, on a transparent disk-shaped substrate having a guiding groove (pregroove) for tracking of an irradiating laser beam with a pitch of 0.74-0.8 μm less than half of that in a CD-R, of a recording layer of a dye, also a reflective layer normally formed on the recording layer, and a protective layer if necessary.

An information recording on the DVD-R is executed by an irradiation of a visible laser light (normally within a range of 630-680 nm) whereby an irradiated portion of the recording layer absorbs such light to cause a local temperature elevation, thereby causing a physical or chemical change (such as a pit formation) thereby changing the optical characteristics. On the other hand, an information reading (reproduction) is also executed by an irradiation with a laser light of a wavelength same as that of the recording laser light, and the information is reproduced by detecting a difference in the reflectance between a portion of the recording layer where the optical characteristics are changed (recorded portion) and a portion where the optical characteristics are not changed (unrecorded portion). Such difference in reflectance is based on so-called "refractive index modulation", and a larger difference in the reflectance between the recorded portion and the unrecorded portion favorably results in a larger ratio of the optical reflectances, namely a higher S/N ratio of reproduction.

On the other hand, the recent progress of so-called information society rapidly promotes pervasiveness of networks such as Internet and the high-vision TV. Also the broadcasting of the HDTV (high definition television) is planned shortly, and there is anticipated an increasing demand, also in consumer applications, for a high-density recording medium capable of recording image information of 50 GB or more, preferably 100 GB or more inexpensively and easily.

Also in business applications such as computer backup or broadcasting backup, a demand for an ultra high-density recording medium capable of inexpensively recording information of a large capacity of 1 TB or more, at a high speed.

However, in an existing two-dimensional optical recording medium such as DVD-R, a storage capacity is limited to about 25 GB at maximum because of the physical principle even if a short wavelength is employed for recording and reproduction, and a sufficiently large recording capacity capable of meeting the future demand cannot be anticipated.

Therefore, as an ultimate high-density recording medium, a three-dimensional optical recording medium is recently attracting attention. The three-dimensional optical recording medium is to achieve an ultra high density and an ultra high capacity of tens or hundreds of times of those of the prior two-dimensional recording medium by superposing tens or hundreds of recording layers in a third dimensional direction (direction of thickness). For realizing a three-dimensional optical recording medium, there is required an access and a writing in an arbitrary position in the third dimensional direction (direction of thickness), and candidates therefor include a method utilizing a two-photon absorption material and a method utilizing holography (interference).

A three-dimensional optical recording medium utilizing a two-photon absorption material is capable of so-called bit recording of tens or hundreds of times by the above-described physical principle and can achieve a recording of a higher density, and can therefore called an optical recording medium of an ultimate high density and an ultimate high capacity.

For a three-dimensional optical recording medium utilizing a two-photon absorption material, there are proposed, for example, a method of utilizing a fluorescent material for recording and reproduction and executing a reading by a fluorescence (Levich, Eugene, Polis et al., JP-T No. 2001-524245, Pavel, Eugene et al., JP-T No. 2000-512061), and a method of utilizing a photochromic compound and executing a reading by an absorption or a fluorescence (Corotiv, Nicolai-Ai et al., JP-T No. 2001-522119, Arsenov, Vradimir et al., JP-T No. 2001-508221), but these literatures do not disclose a specific two-photon absorption material, also only utilize, in the abstractively shown examples of two-photon absorption compound, two-photon absorption compounds of an extremely low two-photon absorption efficiency, and are unsatisfactory in a non-destructive readout, a prolonged storability of the record and an S/N ratio in the reproduction, so that these methods cannot be considered a practically acceptable system.

Also for achieving a non-destructive readout and a prolonged storability of the recording, it is desirable to employ an irreversible material and to execute a reproduction by a change in the reflectance (refractive index), but a two-photon absorption material having such functions has not been disclosed.

Also JP-A No. 6-28672 (Satoshi Kawata and Yoshimasa Kawada) and JP-A No. 6-118306 (Satoshi Kawata and Yoshimasa Kawada) disclose a recording apparatus, a reproducing apparatus and a readout method utilizing a three-dimensional recording by a refractive index modulation, but a method utilizing a two-photon absorption decolorizable material is not described.

SUMMARY OF THE INVENTION

A modulation in refractive index or in absorbance can be realized with an extremely high spatial resolution in an arbitrary position within a three-dimensional space, by causing a decolorization with an excitation energy obtained by a non-resonant two-photon absorption, thereby inducing a modulation in refractive index or in absorbance between a focused position and an unfocused position of a laser beam.

Also a modulation in refractive index or in absorbance can be realized with an extremely high spatial resolution in an arbitrary position within a three-dimensional space, by inducing a polymerization involving a refractive index modulation utilizing a decolorizable dye remaining in the decolorization as a latent image, thereby inducing a modulation in refractive index or in absorbance between a focused position and an unfocused position of a laser beam.

Both methods are applicable to a three-dimensional optical recording medium that can be considered as an ultimate high-density recording medium, and a practically satisfactory storability can also be anticipated because an irreversible material is employed.

Also they are applicable to a three-dimensional display and a three-dimensional photoshaping material.

However, a currently available two-photon absorption dye, because of a low two-photon absorption ability, requires a laser of a very high output as a light source, and requires a long recording time.

Particularly for use in a three-dimensional optical recording material, in order to achieve a high transfer rate, it is necessary to construct a two-photon absorption dye and a decolorizable dye capable of decolorize the two-photon absorption dye at a high sensitivity.

Also a two-photon absorption dye and a decolorizer or a decolorizer precursor capable of decolorizing the two-photon absorption dye by an excitation energy of a two-photon absorption thereby achieving a three-dimensional modulation in refractive index or absorbance have not been disclosed at all, and it is essential to construct also such materials.

An object of the present invention is to provide a two-photon absorption decolorizable material characterized in including a two-photon absorption dye having a large non-resonant two-photon absorbing cross section and a decolorizable dye, and in that the decolorizable dye can be efficiently decolorized by a non-resonant two-photon absorption of the two-photon absorption dye, and a two-photon absorption material capable of a refractive index modulation or an absorbance modulation utilizing the same.

Another object is to provide a two-photon absorption polymerization method characterized in including a first step in which a two-photon absorption dye executes a two-photon absorption to generate an excited state, and, utilizing an excitation energy thereof, decolorizes a decolorizable dye, thereby forming a latent image by a residual decolorizable dye that is not decolorized; and a second step of irradiating the latent image of the residual decolorizable dye with a light thereby inducing a polymerization based on a linear absorption of the residual decolorizable dye, and a two-photon absorption refractive index modulation material utilizing such method.

Still another object is to provide a three-dimensional optical recording material, a recording-reproducing method for a three-dimensional optical recording material, a three-dimensional display and a three-dimensional photoshaping material, utilizing such two-photon absorption decolorizable material, two-photon absorption material capable of modulation in a refractive index or an absorbance, or two-photon absorption polymerization material.

As a result of intensive investigation of the present inventor, the aforementioned objects can be attained by following configurations:

(1) A two-photon absorption decolorizable material comprising: a two-photon absorption dye executing a two-photon absorption; and a decolorizable dye having a molar absorption coefficient equal to or less than 100 at a wavelength of a light irradiated at the two-photon absorption, wherein the decolorizable dye is decolorized by an electron transfer or an energy transfer utilizing an excitation energy obtained by the two-photon absorption of the two-photon absorption dye.

(2) A two-photon absorption decolorizable material described in (1), wherein the decolorizable dye does have an absorption at a wavelength of an irradiating light at the two-photon absorption.

(3) A two-photon absorption decolorizable material described in (1) or (2), wherein the decolorizable dye is a cyanine dye, a squarilium cyanine dye, a styryl dye, a pyrilium dye, a merocyanine dye, an arylidene dye, an oxonol dye, a coumarin dye, a pyran dye, a xanthene dye, a thioxanthene dye, a phenothiazine dye, a phenoxazine dye, a phenazine dye, a phthalocyanine dye, an azaporphiline dye, a porphiline dye, a condensed-ring aromatic dye, a perylene dye, an azomethine dye, an azo dye, an anthraquinone dye, or a metal complex dye.

(4) A two-photon absorption decolorizable material described in (1), (2) or (3), wherein the decolorizable dye is a cyanine dye, a styryl dye, a a merocyanine dye, an arylidene dye, an oxonol dye, a coumarin dye, a xanthene dye, an azomethine dye, an azo dye, or a metal complex dye.

(5) A two-photon absorption decolorizable material described in any one of (1) to (4), wherein the decolorizable dye is a dissociated substance of a dissociable arylidene dye, a dissociable oxonol dye, a dissociable xanthene dye or a dissociable azo dye.

(6) A two-photon absorption decolorizable material described in any one of (1) to (5), further comprising a decolorizer precursor different from the decolorizable dye and the two-photon absorption dye, wherein the two-photon absorption dye, after generating an excited state by the two-photon absorption, executes an energy transfer or an electron transfer with the decolorizer precursor to generate a decolorizer therefrom, and the decolorizer decolorizes the decolorizable dye.

(7) A two-photon absorption decolorizable material described in (6), wherein the decolorizer is at least one of a radical, an acid, a base, a nucleophilic agent, an electrophilic agent and a singlet oxygen.

(8) A two-photon absorption decolorizable material described in (6) or (7), characterized in that the decolorizer precursor is at least one of a radical generator, an acid generator, a base generator, a nucleophilic agent generator, an electrophilic agent generator and a triplet oxygen.

(9) A two-photon absorption decolorizable material described in (8), wherein the decolorizer precursor is a radical generator, an acid generator, or a base generator.

(10) A two-photon absorption decolorizable material described in any one of (6) to (9), wherein the decolorizer precursor has a function of a radical generator and/or an acid generator, and is any one of 1) a ketone radical generator, 2) an organic peroxide radical generator, 3) a bisimidazole radical generator, 4) a trihalomethyl-substituted triazine radical/acid generator, 5) a diazonium salt radical/acid generator, 6) a diaryliodonium salt radical/acid generator, 7) a sulfonium salt radical/acid generator, 8) a borate salt radical generator, 9) a diaryliodonium-organic boron complex radical generator, 10) a sulfonium-organic boron complex radical generator, 11) a cationic dye-organic boron complex radical generator, 12) an anionic dye-onium salt complex radical generator, 13) a metal allene complex radical/acid generator, and 14) a sulfonate ester acid generator, wherein 11) or 12) serves also as the two-photon absorption dye or the decolorizable dye.

(11) A two-photon absorption decolorizable material described in any one of (6) to (10), wherein the decolorizer precursor has a function of a radical generator, and is any one of 1) a ketone radical generator, 2) an organic peroxide radical generator, 3) a bisimidazole radical generator, 4) a trihalomethyl-substituted triazine radical generator, 5) a diazonium salt radical generator, 6) a diaryliodonium salt radical generator, 7) a sulfonium salt radical generator, 8) a borate salt radical generator, 9) a diaryliodonium-organic boron complex radical generator, 10) a sulfonium-organic boron complex radical generator, 11) a cationic dye-organic boron complex radical generator, 12) an anionic dye-onium salt complex radical generator, and 13) a metal allene complex radical generator, wherein 11) or 12) serves also as a two-photon absorption dye or a decolorizable dye.

(12) A two-photon absorption decolorizable material described in any one of (6) to (10), wherein the decolorizer precursor is an acid generator, and is any one of 4) a trihalomethyl-substituted triazine acid generator, 5) a diazonium salt acid generator, 6) a diaryliodonium salt acid generator, 7) a sulfonium salt acid generator, 13) a metal allene complex acid generator, and 14) a sulfonate ester acid generator.

(13) A two-photon absorption decolorizable material described in any one of (6) to (10), wherein the decolorizer precursor has functions of a radical generator and an acid generator, and is any one of 4) a trihalomethyl-substituted triazine radical and acid generator, 5) a diazonium salt radical and acid generator, 6) a diaryliodonium salt radical and acid generator, 7) a sulfonium salt radical and acid generator, and 13) a metal allene complex radical and acid generator.

(14) A two-photon absorption decolorizable material described in any one of (6) to (10), (12) and (13), wherein the decolorizer precursor is an acid generator, and the decolorizable dye is a dissociated substance of a dissociable dye.

(15) A two-photon absorption decolorizable material described in any one of (6) to (9), wherein the decolorizer precursor is a photobase generator represented by any one of following general formulas (21-1) to (21-4):

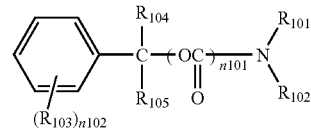

(21-1)

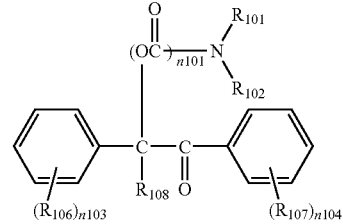

(21-2)

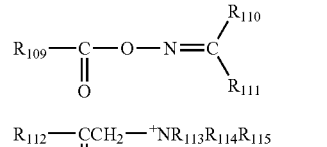

(21-3)

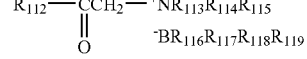

(21-4)

wherein $R_{101}$, $R_{102}$, $R_{113}$, $R_{114}$ and $R_{115}$ each independently represents a hydrogen atom, an alkyl group, an alkenyl group, a cycloalkyl group, an aryl group, or a heterocyclic group, $R_{101}$ and $R_{102}$ may be mutually bonded to form a ring, and $R_{113}$, $R_{114}$ and $R_{115}$ may be mutually bonded to form a ring; $R_{104}$, $R_{105}$, $R_{108}$, $R_{110}$ and $R_{111}$ each independently represents a hydrogen atom or a substituent and $R_{110}$ and $R_{111}$ may be mutually bonded to form a ring; $R_{116}$, $R_{117}$, $R_{118}$ and $R_{119}$ each independently represents an alkyl group or an aryl group; $R_{112}$ represents an aryl group or a heterocyclic group; n101 represents an integer of 0 or 1; and n102 to n104 each independently represents an integer of 0 to 5.

(16) A two-photon absorption decolorizable material described in (15), wherein, in the general formula (21-1) or (21-2), n101 is 1.

(17) A two-photon absorption decolorizable material described in (15) or (16), wherein $R_{103}$ represents a nitro group substituted in 2-position or nitro groups substituted in 2- and 6-positions or alkoxy groups substituted in 3- and 5-positions.

(18) A two-photon absorption decolorizable material described in (15) or (16), wherein $R_{106}$ represents alkoxy groups substituted in 3- and 5-positions.

(19) A two-photon absorption decolorizable material described in any one of (15) to (17), wherein that the photobase generator is represented by the general formula (21-1) or (21-3).

(20) A two-photon absorption decolorizable material described in (19), wherein the photobase generator is represented by the general formula (21-1).

(21) A two-photon absorption decolorizable material described in any one of (6) to (9) and (15) to (20), wherein the decolorizer precursor is a base generator, and the decolorizable dye is a color developed substance of an acid color-developing dye such as a triphenylmethane dye, a xanthene dye or a fluoran dye.

(22) A two-photon absorption decolorizable material described in any one of (1) to (21), wherein the decolorizable dye has an absorption of a longer wavelength than in a linear absorption of the two-photon absorption dye.

(23) A two-photon absorption decolorizable material described in (22), wherein that the decolorizable dye has a linear absorption $\lambda_{max}$ of a wavelength longer than a linear absorption $\lambda_{max}$ of the two-photon absorption dye by a range of 0 to 300 nm.

(24) A two-photon absorption decolorizable material described in any one of (1) to (23), further comprising an electron donating compound capable of reducing a radical cation of the two-photon absorption dye.

(25) A two-photon absorption decolorizable material described in (24), wherein the electron donating compound is an alkylamine, an aniline, a phenylenediamine, a triphenylamine, a carbazole, a phenothiazine, a phenoxazine, a phenazine, a hydroquinone, a cathecol, an alkoxybenzene, an aminophenol, an imidazole, a pyridine, a metallocene, a metal complex, or semiconductor fine particles.

(26) A two-photon absorption decolorizable material described in (24) or (25), wherein the electron donating compound is a triphenylamine, a phenothiazine, a phenoxazine, or a phenazine.

(27) A two-photon absorption decolorizable material described in any one of (24) to (26), wherein the electron donating compound is a phenothiazine.

(28) A two-photon absorption decolorizable material described in any one of (1) to (23), further comprising an electron accepting compound having an ability of oxidizing a radical anion of the two-photon absorption dye.

(29) A two-photon absorption decolorizable material described in (28), wherein the electron accepting compound is an aromatic compound having an electron attracting group such as dinitrobenzene or dicyanobenzene, a heterocyclic compound or a heterocyclic group having an electron attracting group, an N-alkylpyridinium salt, a benzoquinone, an imide, a metal complex or semiconductor fine particles.

(30) A two-photon absorption refractive index modulation material utilizing a two-photon absorption decolorizable material described in any one of (1) to (29).

(31) A two-photon absorption absorbance modulation material utilizing a two-photon absorption decolorizable material described in any one of (1) to (29).

(32) A three-dimensional optical recording material comprising a two-photon absorption decolorizable material described in any one of (1) to (31).

(33) A write-once three-dimensional optical recording material comprising a two-photon absorption decolorizable material described in any one of (1) to (31).

(34) A three-dimensional display comprising a two-photon absorption decolorizable material described in any one of (1) to (31).

(35) A two-photon absorption refractive index modulation method comprising in irradiating a two-photon absorption decolorizable material described in any one of (1) to (34) with a laser light of a wavelength which is longer than that of a linear absorption band of the two-photon absorption dye and a linear absorption band of the decolorizable dye and in which no linear absorption exists, and utilizing an induced two-photon absorption for causing a decolorization.

(36) A two-photon absorption refractive index modulation method comprising irradiating a two-photon absorption decolorizable material described in any one of (1) to (34) with a laser light of a wavelength which is longer than that of a linear absorption band of the two-photon absorption dye and a linear absorption band of the decolorizable dye and in which no linear absorption exists, utilizing a two-photon absorption induced in a laser focus portion (recording portion) for causing a decolorization, and utilizing, for recording, a three-dimensional refractive index modulation by a change in a refractive index from a non-focus portion (non-recording portion or non-decolorized portion).

(37) A three-dimensional optical recording method comprising irradiating a two-photon absorption decolorizable material described in any one of (1) to (36) with a laser light of a wavelength which is longer than that of a linear absorption band of the two-photon absorption dye and a linear absorption band of the decolorizable dye and in which no linear absorption exists, utilizing a two-photon absorption induced in a laser focus portion (recording portion) for causing a decolorization, and utilizing, for recording, a three-dimensional absorbance modulation by a change in an absorbance from a non-focus portion (non-recording portion or non-decolorized portion).

(38) A reproduction method for a three-dimensional optical recording material comprising irradiating a three-dimensional optical recording medium, recorded by a decolorization by a method described in (36), with a light and detecting a difference in reflectance or transmittance between a recorded portion and a non-recorded portion.

(39) A reproduction method for a three-dimensional optical recording material described in (38), comprising irradiating a three-dimensional optical recording medium, recorded by a decolorization by a method described in (38), with a laser same as or different from, in a power or a pulse shape, a laser employed for recording, and detecting a difference in reflectance or transmittance between a recorded portion and a non-recorded portion.

(40) A reproduction method for a three-dimensional optical recording material comprising irradiating a three-dimensional optical recording medium, recorded by a decolorization by a method described in (37), with a light and detecting a difference in optical absorbance between a recorded portion and a non-recorded portion.

(41) A two-photon absorption polymerization method comprising: a first step in which a two-photon absorption dye described in (1) executes a two-photon absorption to generate an excited state, and, utilizing an excitation energy thereof, decolorizes a decolorizable dye having a molar absorption coefficient equal to or less than 100 at a wavelength of a light irradiated at the two-photon absorption, thereby forming a latent image by a residual decolorizable dye that is not decolorized, and a second step of irradiating the latent image of the residual decolorizable dye with a light, thereby inducing a polymerization based on a linear absorption of the residual decolorizable dye.

(42) A two-photon absorption polymerization method described in (41), comprising a first step in which the two-photon absorption dye executes a two-photon absorption to generate an excited state, and executes an energy transfer or an electron transfer with a decolorizer precursor described in any one of (6) to (21) to generate therefrom a decolorizer, which decolorizes the decolorizable dye, thereby forming a latent image by a residual decolorizable dye that is not decolorized, and a second step of irradiating the latent image of the residual decolorizable dye with a light to generate an excited state based on a linear absorption of the residual decolorizable dye, and activating a polymerization initiator by an energy transfer or an electron transfer thereby inducing a polymerization.

(43) A two-photon absorption polymerization method described in (41) or (42), wherein the light irradiated for causing a two-photon absorption in the first step in (41) or (42) has a wavelength longer than that of a linear absorption of the two-photon absorption dye and a linear absorption of the decolorizable dye.

(44) A two-photon absorption polymerization method described in any one of (41) to (43), wherein the light irradiated in the second step has a wavelength shorter than that of the light irradiated at the two-photon absorption.

(45) A two-photon absorption polymerization method described in any one of (41) to (44), wherein the light irradiated in the second step is within a wavelength region in which the two-photon absorption dye has a molar absorption coefficient equal to or less than 1,000.

(46) A two-photon absorption polymerization method described in any one of (41) to (45), wherein the light irradiated in the second step in (45) is within a wavelength region in which the two-photon absorption dye has a molar absorption coefficient equal to or less than 100.

(47) A two-photon absorption polymerization method described in any one of (41) to (46), wherein the light irradiated in the second step is within a wavelength region in which the decolorizable dye has a molar absorption coefficient equal to or higher than 5,000.

(48) A two-photon absorption polymerization method described in any one of (41) to (47), wherein the decolorizable dye has $\lambda_{max}$ of a linear absorption within a region from a wavelength of the light irradiated at the two-photon absorption to a wavelength shorter by 300 nm.

(49) A two-photon absorption polymerization method described in any one of (41) to (48), wherein the two-photon absorption dye is decomposed and fixed in any one of the first step, the second step and a subsequent fixing step by a light irradiation and/or a heat application.

(50) A two-photon absorption polymerization method described in any one of (41) to (49), wherein the two-photon absorption dye is decomposed and fixed in any one of the first step, the second step and a subsequent fixing step by a light irradiation and/or a heat application, and the residual decolorizable dye is decomposed and fixed in any one of the second step and a subsequent fixing step by a light irradiation and/or a heat application.

(51) A two-photon absorption polymerization material comprising a group of compounds capable of a two-photon absorption polymerization method described in any one of (41) and (43) to (50), comprising at least:
  1) a two-photon absorption dye capable of executing a two-photon absorption to generate an excited state in the first step;
  2) a decolorizable dye having a molar absorption coefficient equal to or less than 100 at a wavelength of a light irradiated at the two-photon absorption, that can be decolorized as a result of an electron transfer or an energy transfer directly from the excited state of the two-photon absorption dye in the first step;
  3) a polymerization initiator capable of initiating a polymerization of a polymerizable compound by an electron transfer or an energy transfer from an excited state of the residual decolorizable dye in the second step;
  4) a polymerizable compound; and
  5) a binder.

(52) A two-photon absorption polymerization material comprising a group of compounds capable of a two-photon absorption polymerization method described in any one of (41) to (50), comprising at least:
  1) a two-photon absorption dye capable of executing a two-photon absorption to generate an excited state in the first step;
  2) a decolorizable dye having a molar absorption coefficient equal to or less than 100 at a wavelength of a light irradiated at the two-photon absorption, that can be decolorized as a result of an electron transfer or an energy transfer from the excited state of the two-photon absorption dye to a decolorizer precursor in the first step;
  3) a decolorizer precursor capable of generating a decolorizer by an electron transfer or an energy transfer from the excited state of the two-photon absorption dye in the first step;
  4) a polymerization initiator capable of initiating a polymerization of a polymerizable compound by an electron transfer or an energy transfer from an excited state of the residual decolorizable dye in the second step, the polymerization initiator being servable also as 3) decolorizer precursor;
  5) a polymerizable compound; and
  6) a binder.

(53) A two-photon absorption refractive index modulation material described in (30), wherein a recording by a refractive index modulation is enabled by a fact that the polymerizable compound and the binder, in (51) or (52), have different refractive indexes and that a composition ratio of the polymerizable compound or a polymerization product thereof and the binder becomes uneven, in a photopolymerization in the second step, between a portion where a two-photon absorption takes plate and a portion where a two-photon absorption does not take place.

(54) A two-photon absorption refractive index modulation material described in (53), wherein either of the polymerizable compound and the binder contains, and the other does not contain, at least an aryl group, at aromatic heterocyclic group, a chlorine atom, a bromine atom, an iodine atom or a sulfur atom.

(55) A two-photon absorption refractive index modulation material described in (53) or (54), wherein at least one of the polymerizable compounds is a liquid having a boiling point equal to or higher than 100° C.

(56) A two-photon absorption polymerization material described in (52) or (53), wherein the polymerization initiator includes at least a radical generator and the polymerizable compound includes at least a radical polymerizable compound executing a polymerization by a radical.

(57) A two-photon absorption polymerization material described in (56), wherein the radical generator of at least a type is a ketone, an organic peroxide, bisimidazole, a trihalomethyl-substituted triazine, a diazonium salt, a diaryliodonium salt, a sulfonium salt, a triphenylaklylborate salt, a diaryliodonium-organic boron complex, a sulfonium-organic boron complex, a cationic two-photon absorption dye-organic boron complex, an anionic two-photon absorption dye-onium salt complex, or a metal allene complex.

(58) A two-photon absorption polymerization material described in (52) or (53), wherein the polymerization initiator includes at least an acid generator and the polymerizable compound includes at least a cation polymerizable compound executing a polymerization by an acid.

(59) A two-photon absorption polymerization material described in (58), wherein the acid generator of at least a type is a trihalomethyl-substituted triazine, a diazonium salt, a diaryliodonium salt, a sulfonium salt, a metal allene complex, or a sulfonate ester.

(60) A two-photon absorption polymerization material described in (59), wherein the acid generator is a diaryliodonium salt, a sulfonium salt, or a sulfonate ester.

(61) A two-photon absorption polymerization material described in (52) or (53), wherein the polymerization initiator includes at least a base generator and the polymerizable compound includes at least an anion polymerizable compound executing a polymerization by a base.

(62) A two-photon absorption polymerization material described in (61), wherein the base generator of at least a type is represented by the general formulas (21-1) to (21-4) described in (15).

(63) A two-photon absorption polymerization material described in any one of (51), (52) and (56) to (62), wherein, in (53), the decolorizer precursor and the polymerization initiator are partially or entirely same and serving for both functions.

(64) A three-dimensional optical recording material employing a two-photon absorption polymerization material or a two-photon absorption refractive index modulation material described in any one of (51) to (63).

(65) A reproduction method for a three-dimensional optical recording material comprising irradiating a recorded three-dimensional optical recording medium described in (64), with a light and detecting a difference in a reflectance or a transmittance between a recorded portion and a non-recorded portion.

(66) A reproduction method for a three-dimensional optical recording material described in (65), comprising irradiating a recorded three-dimensional optical recording medium with a laser same as or different from, in a power or a pulse shape, a laser employed for recording, and detecting a difference in reflectance or transmittance between a recorded portion and a non-recorded portion.

(67) A three-dimensional photoshaping composition employing a two-photon absorption polymerization material or a two-photon absorption refractive index modulation material described in any one of (51) to (63).

(68) A two-photon absorption decolorizable material, a two-photon absorption polymerization material, a two-photon absorption polymerization method, a two-photon absorption refractive index modulation material or a three-dimensional optical recording material described in any one of (1) to (67), wherein the two-photon absorption dye employed in any one of (1) to (67) is a methine dye or a phthalocyanine dye.

(69) A two-photon absorption decolorizable material, a two-photon absorption polymerization material, a two-photon absorption polymerization method, a two-photon absorption refractive index modulation material or a three-dimensional optical recording material described in (68), wherein the two-photon absorption dye is a cyanine dye, a merocyanine dye, an oxonol dye, a phthalocyanine dye or a compound represented by a following general formula (1):

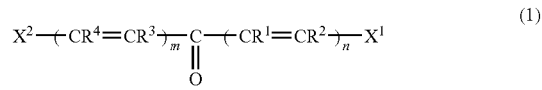

wherein $R^1$, $R^2$, $R^3$ and $R^4$ each independently represents a hydrogen atom, or a substituent, and some of $R^1$, $R^2$, $R^3$ and $R^4$ may be mutually bonded to form a ring; n and m each independently represents an integer of 0 to 4, and in case n or m is equal to or larger than 2, $R^1$, $R^2$, $R^3$ or $R^4$ present in plural units may be mutually same or different, but n and m do not become 0 at the same time; and $X^1$ and $X^2$ independently represents an aryl group, a heterocyclic group or a group represented by a general formula (2):

wherein $R^5$ represents a hydrogen atom or a substituent; $R^6$ represents a hydrogen atom, an alkyl group, an alkenyl group, an aryl group or a heterocyclic group; and $Z^1$ represents an atomic group constituting a 5- or 6-membered ring.

(70) A two-photon absorption decolorizable material, a two-photon absorption polymerization material, a two-photon absorption polymerization method, a two-photon absorption refractive index modulation material or a three-dimensional optical recording material described in (69), wherein, in the compound represented by the general formula (1), $R^1$ and $R^3$ are bonded to form a ring.

(71) A two-photon absorption decolorizable material, a two-photon absorption polymerization material, a two-photon absorption polymerization method, a two-photon absorption refractive index modulation material or a three-dimensional optical recording material described in (70), wherein, in the compound represented by the general formula (1), $R^1$ and $R^3$ are bonded to constitute a cyclopentanone ring together with a carbonyl group.

(72) A two-photon absorption decolorizable material, a two-photon absorption polymerization material, a two-photon absorption polymerization method, a two-photon absorption refractive index modulation material or a three-dimensional optical recording material described in any one of (69) to (71), wherein, in the compound represented by the general formula (1), $X^1$ and $X^2$ each is represented by the general formula (2).

(73) A two-photon absorption decolorizable material, a two-photon absorption polymerization material, a two-photon absorption polymerization method, a two-photon absorption refractive index modulation material or a three-dimensional optical recording material described in (72), wherein, in the compound represented by the general formula (1), $X^1$ and $X^2$ each is represented by the general formula (2), $R^6$ represents an alkyl group, and a ring formed by $Z^1$ is represented by any one of an indolenine ring, an azaindolenine ring, a pyrrazoline ring, a benzothiazole ring, a thiazole ring, a thiazoline ring, a benzoxazole ring, an oxazole ring, an oxazoline ring, a benzoimidazole ring, a thiadiazole ring, and a quinoline ring.

(74) A two-photon absorption decolorizable material, a two-photon absorption polymerization material, a two-photon absorption polymerization method, a two-photon absorption refractive index modulation material or a three-dimensional optical recording material described in (73), wherein, in the compound represented by the general formula (1), $X^1$ and $X^2$ each is represented by the general formula (2), $R^6$ represents an alkyl group, and a ring formed by $Z^1$ is represented by any one of an indolenine ring, an azaindolenine ring, a benzothiazole ring, a benzoxazole ring, or a benzoimidazole ring.

(75) A two-photon absorption decolorizable material, a two-photon absorption polymerization material, a two-photon absorption polymerization method, a two-photon absorption refractive index modulation material or a three-dimensional optical recording material described in (69), wherein the cyanine dye is represented by a general formula (3), the merocyanine dye is represented by a general formula (4), and the oxonol dye is represented by a general formula (5):

ton absorption polymerization method, a two-photon absorption refractive index modulation material or a three-dimensional optical recording material described in any one of (1) to (75), wherein the two-photon absorption dye in any one of (1) to (75) has at least a hydrogen bonding group.

(77) A two-photon absorption decolorizable material, a two-photon absorption polymerization material, a two-photon absorption polymerization method, a two-photon absorption refractive index modulation material or a three-dimensional optical recording material described in (76), wherein the hydrogen bonding group is a —COOH group or a —CONH$_2$ group.

(78) A two-photon absorption decolorizable material, a two-photon absorption polymerization material, a two-photon absorption polymerization method, a two-photon absorption refractive index modulation material or a three-dimensional optical recording material described in any one of (1) to (77), wherein a recording by a decolorization, a polymerization or a refractive index modulation is executed in an unrewritable method.

(79) A three-dimensional optical recording medium described in any one of (32), (33), (64) and (68) to (77), including, on a front surface and/or a rear surface of the three-dimensional optical recording medium, a light-shielding filter capable of cutting off a part of ultraviolet, visible and infrared wavelength regions other than those a recording light and a reproducing light.

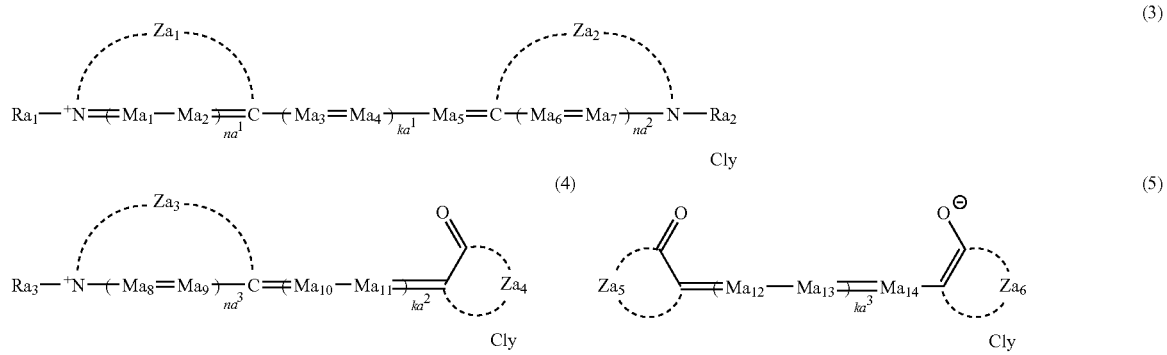

wherein, in the general formulas (3) to (5), $Za_1$, $Za_2$ and $Za_3$ each represents an atomic group constituting a 5- or 6-membered nitrogen-containing heterocycle; $Za_4$ $Za_5$ and $Za_6$ each represents an atomic group constituting a 5- or 6-membered ring; and $Ra_1$, $Ra_2$ and $Ra_3$ each independently represents a hydrogen atom, an alkyl group, an alkenyl group, an aryl group or a heterocyclic group;

$Ma_1$ to $Ma_{14}$ each independently represents a methine group, that may have a substituent or may form a ring another methine group; $na^1$, $na^2$ and $na^3$ each represents 0 or 1; $ka^1$ and $ka^2$ each represents an integer of 0 to 3, and in case $ka^1$ is 2 or larger, plural $Ma_3$s or $Ma_4$s may be mutually same or different, also case $ka^3$ is 2 or larger, plural $Ma_{12}$s or $Ma_{13}$s may be mutually same or different; $ka^2$ represents an integer of 0-8, and in case $ka^2$ is 2 or larger, plural $Ma_{10}$s or $Ma_{11}$s may be mutually same or different;

CI represents a charge-neutralizing ion; and y represents a number required for neutralizing the charge.

(76) A two-photon absorption decolorizable material, a two-photon absorption polymerization material, a two-pho-

(80) A three-dimensional optical recording medium described in any one of (32), (33), (64) and (68) to (77), being stored in a high-shielding cartridge at a storage.

DETAILED DESCRIPTION OF THE INVENTION

In the following, a two-photon absorption decolorizable material of the present invention will be explained in detail.

The two-photon absorption decolorizable material of the present invention is characterized in including at least a two-photon absorption dye executing a two-photon absorption and a decolorizable dye, and in that the two-photon absorption dye, utilizing an excitation energy obtained by the two-photon absorption, decolorizes the decolorizable dye by an electron transfer or an energy transfer.

The decolorizable dye has a molar absorption coefficient of 100 or less at a wavelength of a light irradiated at the two-photon absorption, more preferably 10 or less, further preferably 5 or less, and most preferably does not have an absorption at the wavelength of the light irradiated at the two-photon absorption.

In the two-photon absorption decolorizable material of the present invention, it is preferable that the two-photon absorption dye, utilizing an excitation energy obtained by the two-photon absorption, executes an electron transfer or an energy transfer directly to the decolorizable dye thereby decolorizing the same, and also preferable that a decolorizer precursor is included separately from the decolorizable dye and the two-photon absorption dye, and, the two-photon absorption dye, after generating an excited state by a two-photon absorption, executes an energy transfer or an electron transfer with the decolorizer precursor to generate therefrom a decolorizer, which decolorizes the decolorizable dye.

In case of an energy transfer mechanism, it may be a Felster mechanism in which an energy transfer takes place from a singlet excited state generated by a two-photon absorption of the two-photon absorption dye, or a Dexter mechanism in which an energy transfer takes place from a triplet excited state, and, in order to achieve an efficient energy transfer, the two-photon absorption dye preferably has an excitation energy larger than that of the decolorizer precursor.

On the other hand, in case an electron transfer mechanism, it may be a mechanism in which an electron transfer takes place from a singlet excited state generated by a two-photon absorption of the two-photon absorption dye, or a mechanism in which an electron transfer takes place from a triplet excited state.

In such case, the excited state of the two-photon absorption dye may donate or accept an electron to or from the decolorizer precursor. In case the excited state of the two-photon absorption dye donates an electron, in order to achieve an efficient electron transfer, the two-photon absorption dye in the excited state has an energy of an orbit (LUMO) in which an excited electron is present preferably higher than an energy of the LUMO orbit of the decolorizer precursor.

On the other hand, in case the excited state of the two-photon absorption dye accepts an electron, in order to achieve an efficient electron transfer, the two-photon absorption dye in the excited state has an energy of an orbit (HOMO) in which a hole is present preferably lower than an energy of the HOMO orbit of the decolorizer precursor.

The decolorizer is preferably a radical, an acid, a base, a nucleophilic agent, an electrophilic agent or a singlet oxygen, and more preferably a radical, an acid, or a base. Also the decolorizer precursor is preferably a radical generator, an acid generator, a base generator, a nucleophilic agent generator, an electrophilic agent generator or triplet oxygen, and more preferably a radical generator, an acid generator, or a base generator. The decolorizer precursor preferred in the invention will be explained later in more details.

In the invention, a decolorizable dye generally means a dye which has an absorption in ultraviolet, visible and infrared wavelength regions of 200-2000 nm, and which causes a change of $\lambda_{max}$ to a shorter wavelength or a decrease in the molar absorption coefficient of the absorption directly or indirectly by a light irradiation, more preferably a dye which causes both changes. A decolorizing reaction more preferably takes place in a wavelength region of 200-1000 nm, and further preferably in a wavelength region of 300-900 nm.

The decolorizable dye preferred in the invention will be explained later in more details.

A refractive index of a dye generally assumes a high value within a longer wavelength region starting from about a wavelength ($\lambda$max) of a linear absorption maximum, and assumes a very high value particularly in a region from $\lambda$max to a wavelength longer than $\lambda$max by about 200 nm, exceeding 2 in certain dyes and also exceeding 2.5 in certain cases.

On the other hand, non-dye organic compounds such as a binder polymer generally have a refractive index of about 1.4 to 1.6.

It is therefore possible, by causing a decolorization utilizing an excitation energy obtained by a two-photon absorption in the aforementioned method, to induce not only a modulation in absorbance but also a modulation in refractive index, between a laser focused position (recorded part) and an unfocused position (unrecorded part) with an extremely high spatial resolution in an arbitrary position with a three-dimensional space.

As a result, by irradiating the recorded material with a light, the modulation in absorbance or in refractive index can be reproduced by a change in the transmittance or reflectance, and such material can therefore be applied to a three-dimensional optical recording medium what is considered an ultimate high-density recording medium. For the reproduction there is preferred a method by refractive index modulation that does not involve a photoexcitation and enables a non-destructive readout, and, in such case, it is preferable to irradiate a light in the vicinity of a wavelength at the two-photon absorption dye shows a maximum refractive index, namely a light in the vicinity of a longer wavelength end of the linear absorption, thereby reading a change in the reflectance.

Also the light to be employed in the reproduction is preferably a laser light, and the reproduction is preferably executed by irradiating a three-dimensional optical recording medium recorded by a decolorization, by a laser, which is same as that employed in the recording but is same or different in a power or a pulse shape, thereby detecting a difference in the reflectance or the transmittance between the recorded part and the unrecorded part.

It is also possible to provide a three-dimensional display, utilizing a difference in the absorbance between a decolorized recorded part and an unrecorded part.

The two-photon absorption decolorizable material of the invention is preferably not subjected to a wet process after a two-photon absorption.

The two-photon absorption decolorizable material of the invention is preferably an unrewritable system. The unrewritable system indicates a system which is recorded by an irreversible reaction and in which the data once recorded can be stored without being rewritten even in a rewriting operation by overwriting. It is therefore suitable for storage of data that are important and require a prolonged storage. It is however naturally possible to execute a new recording in an area that is not yet recorded. For this reason, it is generally called a "add-on type" or a "write once" type.

In the two-photon absorption decolorizable material of the invention, it is preferable to irradiate the material a laser light of a wavelength which is longer than that of a linear absorption band of the two-photon absorption dye and a linear absorption band of the decolorizable dye and in which no linear absorption exists, and, utilizing the induced two-photon absorption, to cause a decolorization thereby achieving a modulation in the refractive index or the absorbance.

A laser to be employed in the invention is not particularly restricted, and can specifically be a solid-state laser or a fiber laser, such as Ti-sapphire laser having an oscillation wavelength at about a central wavelength of 1000 nm, a semiconductor laser or a solid-state laser having an oscillation wavelength of about 780 nm and utilized also in CD-R, a fiber laser, a semiconductor laser or a solid-state laser having an oscillation wavelength of about 620-680 nm and utilized also in DVD-R, and a GaN laser having an oscillation wavelength of about 405-415 nm.

There can also be advantageously employed a solid-state SHG laser or a semiconductor SHG laser such as a YAG-SHG laser having an oscillation wavelength in the visible range.

Also the laser employed in the invention can be a pulse-oscillated laser or a CW laser.

In the two-photon absorption decolorizable material of the invention, after a decolorizing reaction by a two-photon absorption, there may be executed a fixing step for decomposing the two-photon absorption dye or deactivating the decolorizer precursor by a light and/or a heat.

Particularly in case of employing an acid amplifier or a base amplifier in the two-photon absorption decolorizable material of the invention, a heating is preferably employed for the fixing, also for causing the acid amplifier or the base amplifier to function effectively.

In case of a fixation by a light, the two-photon absorption decolorizable material is subjected to a flush exposure to an ultraviolet or visible light. A light source to be employed can be a visible light laser, an ultraviolet light laser, a carbon arc lamp, a high-pressure mercury lamp, a xenon lamp, a metal halide lamp, a fluorescent lamp, a tungsten lamp, an LED or an organic EL.

In case of a thermal fixation, the fixing step is preferably executed at 40 to 160° C., more preferably at 60 to 130° C.

In case of executing both an optical fixation and a thermal fixation, the light and the heat may be applied simultaneously or separately.

The two-photon absorption decolorizable material of the invention may advantageously include, in addition to the two-photon absorption dye, the decolorizable dye and the decolorizer precursor, various additives if necessary, such as a binder formed by a polymer compound, a polymerizable monomer, a polymerizable oligomer, an electron donating compound, an electron accepting compound, a crosslinking agent, a thermal stabilizer, a plasticizer, and a solvent.

In the two-photon absorption decolorizable material of the invention, a decolorized part to be generated preferably has a size within a range of 10 nm to 100 µm, more preferably 50 nm to 5 µm and further preferably 50 nm to 2 µm.

Also in order to enable a reproduction of the recording material or a function as an optical material, by a change in reflection, scattering or diffraction of light, it is preferably ¹⁄₂₀ to 20 times of the wavelength of the irradiating light, more preferably ¹⁄₁₀ to 10 times and most preferably ¹⁄₅ to 5 times.

In the two-photon absorption decolorizable material of the invention, the decolorization of the decolorizable dye by the two-photon absorption preferably takes place, particularly for the purpose of attaining a high sensitivity, by a reaction not relying on a thermal decomposition, namely by a photon mode.

It is thus preferable, particularly in consideration of a writing transfer rate and an S/N ratio in a recording material, to decolorize the decolorizable dye by a two-photon absorption, namely by a mechanism different from that practiced in CD-R or DVD-R.

In the following, a detailed explanation will be given on each of the components constituting the two-photon absorption decolorizable material of the invention.

At first, an explanation will be given on a two-photon absorption dye employed in the two-photon absorption decolorizable material of the invention.

The two-photon absorption dye of the invention is a compound capable of a non-resonant two-photon absorption (a phenomenon of being excited by simultaneously absorbing two photons, in an energy region in which the compound does not have a (linear) absorption band.

Particularly in case of applying the two-photon absorption decolorizable material of the invention to a three-dimensional recording medium or a three-dimensional display, for achieving a high transfer (recording) rate, there is required a two-photon absorption dye capable of executing a two-photon absorption with a high sensitivity to efficiently generate an excited state.

An efficiency of the two-photon absorption by the two-photon absorption dye is represented by a two-photon absorbing cross section δ and is defined by 1 GM=1×10$^{-50}$ cm$^{4}$·s/photon. In the two-photon absorption decolorizable material of the invention, the two-photon absorption dye preferably has a two-photon absorbing cross section δ of 100 GM or higher, for achieving a higher writing rate, a reduction in the size of the laser and a lower cost, more preferably 1,000 GM or higher, further preferably 5,000 GM or higher and most preferably 10,000 GM or higher.

The two-photon absorption dye of the invention is preferably an organic compound.

In the invention, when a specified portion is called a "group", it means that such group may be substituted with one or more (up to maximum possible) substituents or may not be substituted, unless specified otherwise. For example an "alkyl group" means a substituted or non-substituted alkyl group. Also a substituent employable in the compound of the invention may be any substituent.

Also in the invention, when a specified portion is called a "ring", or in case a "ring" is included in a "group", such ring may be a single ring or condensed rings unless specified otherwise, and may be substituted or non-substituted.

For example, an "aryl group" may be a phenyl group or a naphthyl group, or a substituted phenyl group.

Also a dye generally means a compound having a part of an absorption in an ultraviolet region (preferably 200-400 nm), a visible region (400-700 nm) or a near infrared region (preferably 700-2000 nm), and more preferably a compound having a part of an absorption in the visible region.

In the invention, there may be employed any two-photon absorption dye, such as a cyanine dye, a hemicyanine dye, a streptocyanine dye, a styryl dye, a pyrilium dye, a merocyanine dye, a 3-nuclei merocyanine dye, a 4-nuclei merocyanine dye, a rhodacyanine dye, a complex cyanine dye, a complex merocyanine dye, an aropolar dye, an arylidene dye, an oxonol dye, a hemioxonol dye, a squarilium dye, a chroconium dye, an azulenium dye, a coumarin dye, a ketocoumarin dye, a styrylcoumarin dye, a pyran dye, an anthraquinone dye, a quinone dye, a triphenylmethane dye, a diphenylmethane dye, a xanthene dye, a thioxanthene dye, a phenothiazine dye, a phenoxazine dye, a phenazine dye, an azo dye, an azomethine dye, a fluorenone dye, a diarylethene dye, a spiropyran dye, a fulgide dye, a perylene dye, a phtaloperylene dye, an indigo dye, a polyene dye, an acrizine dye, an acrizinone dye, a diphenylamine dye, a quinacridone dye, a quinophthalone dye, a porphiline dye, an azaporphiline dye, a chlorophil dye, a phthalocyanine dye, a condensed-ring aromatic dye, a styrene dye, a metallocene dye, a metal complex dye, a phenylenevinylene dye, or a stilbazolium dye, preferably a cyanine dye, a hemicyanine dye, a streptocyanine dye, a styryl dye, a pyrilium dye, a merocyanine dye, a 3-nuclei merocyanine dye, a 4-nuclei merocyanine dye, a rhodacyanine dye, a complex cyanine dye, a complex merocyanine dye, an aropolar dye, an arylidene dye, an oxonol dye, a hemioxonol dye, a squarilium dye, a chroconium dye, an azulenium dye, a coumarin dye, a ketocoumarin dye, a styrylcoumarin dye, a pyran dye, an anthraquinone dye, a quinone dye, a triphenylmethane dye, a diphenylmethane dye, a thioxanthene dye, a phenothiazine dye, a phenoxazine dye, a phenazine dye, an azo dye, an azomethine dye, a perylene dye, a phthaloperylene dye, an indigo dye, a polyene dye, an acrizine dye, an acrizinone dye, a diphenylamine dye, a quinacridone dye, a quinophthalone dye, a porphiline dye, an azaporphiline dye, a chlorophil dye, a phthalocyanine dye, a condensed-ring aromatic dye, a styrene dye, a metallocene dye, a metal complex dye, or a stilbazolium dye, preferably a cyanine dye, a hemicyanine dye, a streptocyanine dye, a styryl dye, a pyrilium dye, a merocyanine dye, a 3-nuclei merocyanine dye, a 4-nuclei merocyanine dye, a rhodacyanine dye, a complex cyanine dye, a complex merocyanine dye, an aropolar dye, an arylidene dye, an oxonol dye, a hemioxonol dye, a squarilium dye, a chroconium dye, an azulenium dye, a ketocoumarin dye, a styrylcoumarin dye, a pyran dye, an anthraquinone dye, a quinone dye, a triphenylmethane dye, a diphenylmethane dye, a thioxanthene dye, a phenothiazine dye, a phenoxazine dye, a phenazine dye, an azo dye, an azomethine dye, an indigo dye, a polyene dye, an acrizine dye, an acrizinone dye, a diphenylamine dye, a quinacridone dye, a quinophthalone dye, an azaporphiline dye, a chlorophil dye, a phthalocyanine dye, a condensed-ring aromatic dye, a metallocene dye, or a metal complex dye, more preferably a cyanine dye, a hemicyanine dye, a streptocyanine dye, a styryl dye, a pyrilium dye, a merocyanine dye, an arylidene dye, an oxonol dye, a squarilium dye, a ketocoumarin dye, a styrylcoumarin dye, a pyran dye, a thioxanthene dye, a phenothiazine dye, a phenoxazine dye, a phenazine dye, an azo dye, a polyene dye, an azaporphiline dye, a chlorophil dye, a phthalocyanine dye, or a metal complex dye, further preferably a cyanine dye, a merocyanine dye, an arylidene dye, an oxonol dye, a squarilium dye, an azo dye or a phthalocyanine dye, further preferably a cyanine dye, a merocyanine dye or an oxonol dye (these being a preferred methine dye) and most preferably a cyanine dye.

These dyes are described in detail, for example, by F. M. Harmer, "Heterocyclic Compounds-Cyanine Dyes and Related Compounds", John Wiley & Sons, New York-London, 1964, D. M. Sturmer, "Heterocyclic Compounds-Special topics in heterocyclic chemistry", chap. 18, paragraph 14, p. 482-515, John Wiley & Sons, New York-London, 1977, and "Rodd's Chemistry of Carbon Compounds", 2nd Ed. vol. IV, part B, 1977, chap. 15, p. 369-422, Elsevier Science Publishing Company Inc., New York.

Specific examples of the cyanine dye, merocyanine dye or oxonol dye include those described in F. M. Harmer, "Heterocyclic Compounds-Cyanine Dyes and Related Compounds", John Wiley & Sons, New York-London, 1964.

General formulas for the cyanine dye or the merocyanine dye are those represented by (XI) and (XII) in U.S. Pat. No. 5,340,694, pages 21 and 22 (however n12 or n15 is not restricted and represents an integer equal to or larger than 0 (preferably an integer of 0-4)).

In case the two-photon absorption dye in the invention is a cyanine dye, it is preferably represented by a general formula (3):

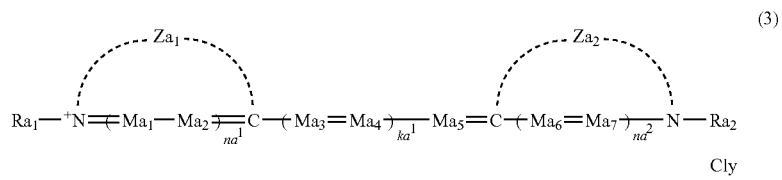

(3)

In the general formula (3), $Za_1$ and $Za_2$ each represents an atomic group constituting a 5- or 6-membered nitrogen-containing heterocycle. The 5- or 6-membered nitrogen-containing heterocycle to be formed is preferably an oxazole nucleus with 3 to 25 carbon atoms (hereinafter represented as C number) (such as 2-3-methyloxazolyl, 2-3-ethyloxazolyl, 2-3,4-diethyloxazolyl, 2-3-methylbenzoxazolyl, 2-3-ethylbenzoxazolyl, 2-3-sulfoethylbenzoxazolyl, 2-3-sulfopropylbenzoxazolyl, 2-3-methylthioethylbenzoxazolyl, 2-3-methoxyethylbenzoxazolyl, 2-3-sulfobutylbenzoxazolyl, 2-3-methyl-β-naphthooxazolyl, 2-3-methyl-α-naphthooxazolyl, 2-3-sulfopropyl-β-naphthooxazolyl, 2-3-(3-naphthoxyethyl)benzoxazolyl, 2-3,5-dimethylbenzoxazolyl, 2-6-chloro-3-methylbenzoxazolyl, 2-5-bromo-3-methylbenzoxazolyl, 2-3-ethyl-5-methoxybenzoxazolyl, 2-5-phenyl-3-sulfopropylbenzoxazolyl, 2-5-(4-bromophenyl)-3-sulfobutylbenzoxazolyl, 2-3-methyl-5,6-dimethylthiobenzoxazolyl, 2-3-sulfopropyloxazolyl, 2-3-sulfopropyl-γ-naphthoxazolyl, 2-3-ethyl-α-naphthoxazolyl, 2-5-chloro-3-ethyl-α-naphthoxazolyl, 2-5-chloro-3-ethylbenzoxazolyl, 2-5-chloro-3-sulfopropylbenzoxazolyl, 2-5,6-dichloro-3-sulfopropylbenzoxazolyl, 2-5-bromo-3-sulfopropylbenzoxazolyl, 2-3-ethyl-5-phenylbenzoxazolyl, 2-5-(1-pyrrolyl)-3-sulfopropylbenzoxazolyl, 2-5,6-dimethyl-3-sulfopropylbenzoxazolyl, or 2-3-ethyl-5-sulfopropylbenzoxazolyl); a thiazole nucleus with 3-25 carbon atoms (such as 2-3-methylthiazolyl, 2-3-ethylthiazolyl, 2-3-sulfopropylthiazolyl, 2-3-sulfobutylthiazolyl, 2-3,4-dimethylthiazolyl, 2-3,4,4-trimethylthiazolyl, 2-3-carboxyethylthiazolyl, 2-3-methylbenzothiazolyl, 2-3-ethylbenzothiazolyl, 2-3-butylbenzothiazolyl, 2-3-sulfopropylbenzothiazolyl, 2-3-sulfobutylbenzothiazolyl, 2-3-methyl-β-naphthothiazolyl, 2-3-sulfopropyl-γ-naphthothiazolyl, 2-3-(1-naphthoxyethyl)benzothiazolyl, 2-3,5-dimethylbenzothiazolyl, 2-6-chloro-3-methylbenzothiazolyl, 2-6-iodo-3-ethylbenzothiazolyl, 2-5-bromo-3-methylbenzothiazolyl, 2-3-ethyl-5-methoxylbenzothiazolyl, 2-5-phenyl-3-sulfopropylbenzothiazolyl, 2-5-(4-promophenyl)-3-sulfobutylbenzothiazolyl, 2-3-methyl-5,6-dimethylthiobenzothiazolyl, 2-5-chloro-3-ethylbenzothiazolyl, 2-5-chloro-3-sulfopropylbenzothiazolyl, or 2-3-ethyl-5-iodobenzothiazolyl); an imidazole nucleus with 3-25 carbon atoms (such as 2-1,3-diethylimidazolyl, 2-1,3-dimethylimidazolyl, 2-1-methylbenzoimidazolyl, 2-1,3,4-triethylimidazolyl, 2-1,3-diethylbenzoimidazolyl, 2-1,3,5-trimethylbenzoimidazolyl, 2-5,6-dichloro-1,3-diethylbenzoimidazolyl, 2-1,3-disulfopropyl-5-cyano-6-chlorobenzoimidazolyl, 2-5,6-dichloro-3-ethyl-1-sulfopropylbenzoimidazolyl, 2-5-chloro-1,3-diethylbenzoimidazolyl, or 2-5-chloro-1,3-diethyl-6-trifluoromethylbenzoimidazolyl); an indolenine nucleus with 10-30 carbon atoms (such as 3,3-dimethyl-1-pentylindolenine, 3,3-dimethyl-1-sulfopropylindolenine, 5-carboxy-1,3,3-trimethylindolenine, 5-carbamoyl-1,3,3-trimethylindolenine, or 1,3,3-trimethyl-4,5-benzoindolenine);

a quinoline nucleus with 9-25 carbon atoms (such as 2-1-methylquinolyl, 2-1-ethylquinolyl, 2-1-methyl-6-chloroquinolyl, 2-1,3-diethylquinolyl, 2-1-methyl-6-methylthioquinolyl, 2-1-sulfopropylquinolyl, 4-1-methylquinolyl, 4-1-pentylquinolyl, 4-1-sulfoethylquinolyl, 4-1-methyl-7-chloroquinolyl, 4-1,8-diethylquinolyl, 4-1-methyl-6-methylthioquinolyl, or 4-1-sulfopropylquinolyl); a selenazole nucleus with 3-25 carbon atoms (such as 2-3-methylbenzoselenazolyl); or a pyridine nucleus with 5-25 carbon atoms (such as 2-pyridyl), or can also be a thiazoline nucleus, an oxazoline nucleus, a selanazoline nucleus, a tellurazoline nucleus, a tellurazole nucleus, a benzotellurazole nucleus, an imidazoline nucleus, an imidazo[4,5-quinoxaline] nucleus, an oxadiazole nucleus, a thiadiazole nucleus, a tetrazole nucleus, or a pyrimidine nucleus.

These may be substituted, and preferred examples of the substituent include an alkyl group (preferably with C number of 1-20, such as methyl, ethyl, n-propyl, isopropyl, n-butyl, n-pentyl, benzyl, 3-sulfopropyl, 4-sulfobutyl, carboxymethyl, or 5-carboxypentyl), an alkenyl group (preferably with C number of 2-20, such as vinyl, allyl, 2-butenyl or 1,3-butadienyl), a cycloalkyl group (preferably with C number of 3-20, such as cyclopentyl or cyclohexyl), an aryl group (preferably with C number of 6-20, such as phenyl, 2-chlorophenyl, 4-methoxyphenyl, 3-methylphenyl or 1-naphthyl), a heterocyclic group (preferably with C number of 1-20, such as pyridyl, thienyl, furyl, thiazolyl, imidazolyl, pyrazolyl, pyrrolidino, piperidino or morpholino), an alkinyl group (preferably with C number of 2-20, such as ethinyl, 2-propinyl, 1,3-butadienyl or 2-phenylethinyl), a halogen atom (such as F, Cl, Br or I), an amino group (preferably with C number of 0-20 such as amino, dimethylamino, diethylamino, dibutylamino or anilino), a cyano group, a nitro group, a hydroxyl group, a mercapto group, a carboxyl group, a sulfo group, a phosphonic acid group, an acyl group (preferably with C number of 1-20, such as acetyl, benzoyl, salicyloyl or pivaloyl), an alkoxy group (preferably with C number of 1-20, such as methoxy, butoxy or cyclohexyloxy), an aryloxy group (preferably with C number of 6-26, such as phenoxy or 1-naphthoxy), an alkylthio group (preferably with C number of 1-20, such as methylthio, or ethylthio), an arylthio group (preferably with C number of 6-20, such as phenylthio or 4-chlorophenylthio), an alkylsulfonyl group (preferably with C number of 1-20, such as methanesulfonyl or butanesulfonyl), an arylsulfonyl group (preferably with C number of 6-20, such as benzenesulfonyl or paratoluenesulfonyl), a sulfamoyl group (preferably with C number of 0-20, such as sulfamoyl, N-methylsulfamoyl or N-phenylsulfamoyl), a carbamoyl group (preferably with C number of 1-20, such as carbamoyl, N-methylcarbamoyl, N,N-dimethylcarbamoyl or N-phenylcarbamoyl), an acylamino group (preferably with C number of 1-20, such as acetylamino or benzoylamino), an imino group (preferably with C number of 2-20, such as phthalimino), an acyloxy group (preferably with C number of 1-20, such as acetyloxy, or benzoyloxy), an alkoxycarbonyl group (preferably with C number of 2-20, such as methoxycarbonyl or phenoxycarbonyl), and a carbamoylamino group (preferably with C number of 1-20, such as carbamoylamino, N-methylcarbamoylamino or N-phenylcarbamoylamino), more preferably an alkyl group, an aryl group, a heterocyclic group, a halogen atom, a cyano group, a carboxyl group, a sulfo group, an alkoxy group, a sulfamoyl group, a carbamoyl group and an alkoxycarbonyl group.

Such heterocycle may be further condensed with another ring, and such ring to be condensed is preferably a benzene ring, a benzofuran ring, a pyridine ring, a pyrrole ring, an indole ring or a thiphene ring.

A 5- or 6-membered nitrogen-containig heterocycle to be formed by $Za_1$ or $Za_2$ is preferably an oxazole nucleus, an imidazole nucleus, a thiazole nucleus, or indolenine nucleus, more preferably an oxazole nucleus, an imidazole nucleus, or an indolenine nucleus, and most preferably an oxazole nucleus.

In the cyanine dye of the general formula (3), at least one of the rings formed by $Za_1$ and $Za_2$ is preferably an benzoxazole ring or a benzoimidazole ring, more preferably at least one is a benzoxazole ring, and further preferably both are benzoxazole rings.

In such case, a substituent on the benzoxazole ring is preferably a methyl group, chlorine, bromine, a phenyl group, a 1-pyrrolyl group or a sulfo group.

$Ra_1$ and $Ra_2$ each independently represents a hydrogen atom, an alkyl group (preferably with C number of 1-20, such as methyl, ethyl, n-propyl, isopropyl, n-butyl, n-pentyl, benzyl, 3-sulfopropyl, 4-sulfobutyl, 3-methyl-3-sulfopropyl, 2'-sulfobenzyl, carboxymethyl, or 5-carboxypentyl), an alkenyl group (preferably with C number of 2-20, such as vinyl or allyl), an aryl group (preferably with C number of 6-20, such as phenyl, 2-chlorophenyl, 4-methoxyphenyl, 3-methylphenyl or 1-naphthyl), or a heterocyclic group (preferably with C number of 1-20, such as pyridyl, thienyl, furyl, thiazolyl, imidazolyl, pyrazolyl, pyrrolidino, piperidino or morpholino), more preferably an alkyl (preferably with C number of 1-6), or a sulfoalkyl group (preferably 3-sulfopropyl, 4-sulfobutyl, 3-methyl-3-sulfopropyl or 2'-sulfobenzyl).

$Ma_1$-$Ma_7$ each represents a methine group, which may have a substituent (examples thereof being same as those on $Za_1$ and $Za_2$), preferably an alkyl group, a halogen atom, a nitro group, an alkoxy group, an aryl group, a nitro group, a heterocyclic group, an aryloxy group, an acylamino group, a carbamoyl group, a sulfo group, a hydroxyl group, a carboxyl group, an alkylthio group, or a cyano group, more preferably an alkyl group.

$Ma_1$-$Ma_7$ each is preferably a non-substituted methine group, or a methine group substituted with an alkyl group (preferably with C number of 1-6), and more preferably a non-substituted methine group or a methine group substituted with an ethyl group or a methyl group.

$Ma_1$-$Ma_7$ may be mutually bonded to form a ring, and a ring to be formed is preferably a cyclohexene ring, a cyclopentene ring, a benzene ring or a thiophene ring.

$na^1$ and $na^2$ each represents 0 or 1, preferably both being 0.
$ka^1$ represents an integer of 0-3, preferably 1-3 and more preferably 1 or 2.

In case $ka^1$ is 2 or larger, plural $Ma_3$s or $Ma_4$s may be mutually same or different.

CI represents a charge-neutralizing ion; and y represents a number required for neutralizing the charge.

In case the two-photon absorption dye in the invention is a merocyanine dye, it is preferably represented by a general formula (4):

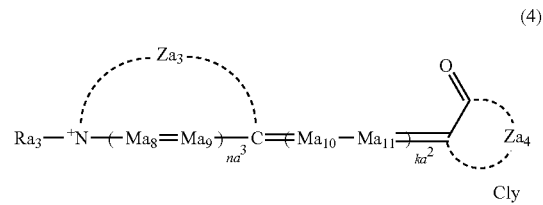

(4)

In the general formula (4), $Za_3$ represents an atomic group constituting a 5- or 6-membered nitrogen-containing heterocycle (preferred examples being same as those of $Za_1$ and $Za_2$), which may be substituted (preferred examples of substituent being same as those for the substituent on $Za_1$ and $Za_2$), or which may be further condensed with another ring.

A 5- or 6-membered nitrogen-containing heterocycle formed by $Za_3$ is preferably an oxazole nucleus, an imidazole nucleus, a thiazole nucleus, or an indolenine nucleus, and more preferably an oxazole nucleus, or an indolenine nucleus.

$Za_4$ represents an atomic group constituting a 5- or 6-membered ring. A ring formed from $Za_4$ is generally called an acidic nucleus, as defined by James, The Theory of the Photographic Process, 4th Edit., Macmillan, 1977, p. 198.

A ring formed from $Za_4$ is preferably a nucleus of 2-pyrazolon-5-one, pyrazolidine-3,5-dione, imidazolin-5-one, hidantoine, 2- or 4-thiohidantoine, 2-iminooxazolidin-4-one, 2-oxazolin-5-one, 2-thiooxazoline-2,4-dione, isorhodanine, rhodanine, indane-1,3-dione, thiophen-3-one, thiophen-3-one-1,1-dioxide, indolin-2-one, indolin-3-one, 2-oxoindazolium, 5,7-dioxo-6,7-dihydrothiazolo[3,2-a]pyrimidine, 3,4-dihydroisoquinolin-4-one, 1,3-dioxane-4,6-dione, barbituric acid, 2-thiobarbituric acid, coumarin-2,4-dione, indazolin-2-one, pyrido[1,2-a]pyrimidine-1,3-dione, pyrazolo[1,5-b]quinazolone, or pyrazolopyridone.

A ring formed from $Za_4$ is more preferably a nucleus of 2-pyrazolon-5-one, pyrazolidine-3,5-dione, rholdanine, indane-1,3-dione, thiophen-3-one, thiophen-3-one-1,1-dioxide, indolin-2-one, 1,3-dioxane-4,6-dione, barbituric acid, 2-thiobarbituric acid, or coumarin-2,4-dione, and most preferably pyrazolidine-3,5-dione, barbituric acid, or 2-thiobarbituric acid.

The ring formed from $Za_4$ may be substituted (examples of the preferred substituent being same as those for the substituent on $Za_3$), and the substituent is more preferably an alkyl group, an aryl group, a heterocyclic group, a halogen atom, a cyano group, a carboxyl group, a sulfo group, an alkoxy group, a sulfamoyl group, a carbamoyl group or an alkoxycarbonyl group.

Such heterocycle may be further condensed with another ring, and a ring to be condensed is preferably a benzene ring, a benzofuran ring, a pyridine ring, a pyrrole ring, an indole ring, or a thiophene ring.

$Ra_3$ independently represents an hydrogen atom, an alkyl group, an alkenyl group, an aryl group or a heterocyclic group (preferred examples being same as those for $Ra_1$ and $Ra_2$), more preferably an alkyl group (preferably of C number of 1-6), or a sulfoalkyl group (preferably 3-sulfopropyl, 4-sulfobutyl, 3-methyl-3-sulfopropyl or 2'-sulfobenzyl).

$Ma_8$-$Ma_{11}$ each represents a methine group, which may have a substituent (preferred examples thereof being same as those of the substituent on $Za_1$ and $Za_2$), preferably an alkyl group, a halogen atom, a nitro group, an alkoxy group, an aryl group, a nitro group, a heterocyclic group, an aryloxy group, an acylamino group, a carbamoyl group, a sulfo group, a hydroxyl group, a carboxyl group, an alkylthio group, or a cyano group, more preferably an alkyl group.

$Ma_8$-$Ma_{11}$ each is preferably a non-substituted methine group, or a methine group substituted with an alkyl group (preferably with C number of 1-6), and more preferably a non-substituted methine group or a methine group substituted with an ethyl group or a methyl group.

$Ma_8$-$Ma_{11}$ may be mutually bonded to form a ring, and a ring to be formed is preferably a cyclohexene ring, a cyclopentene ring, a benzene ring or a thiophene ring.

$na^3$ represents 0 or 1, preferably 0.

$ka^2$ represents an integer of 0-8, preferably 0-4 and more preferably 1-3.

In case $ka^2$ is 2 or larger, plural $Ma_{10}$s or $Ma_{11}$s may be mutually same or different.

CI represents a charge-neutralizing ion; and y represents a number required for neutralizing the charge.

In case the two-photon absorption dye in the invention is a oxonol dye, it is preferably represented by a general formula (5):

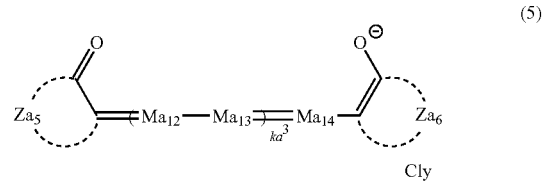

In the general formula (5), $Za_5$ and $Za_6$ each represents an atomic group constituting a 5- or 6-membered ring (preferred examples being same as those for $Za_4$), which may be further substituted (preferred examples of the substituent being same as those of the substituent on $Za_4$), or which may be further condensed with another ring.

A ring formed from $Za_5$ or $Za_6$ is preferably 2-pyrazolon-5-one, pyrazolidine-3,5-dione, rhodanine, indane-1,3-dione, thiophen-3-one, thiophen-3-one-1,1-dioxide, 1,3-dioxane-4,6-dione, barbituric acid, 2-thiobarbituric acid, or coumarin-2,4-dione, more preferably barbituric acid, or 2-thiobarbituric acid, and most preferably barbituric acid.

$Ma_{12}$-$Ma_{14}$ each represents a methine group, which may have a substituent (preferred examples thereof being same as those of the substituent on $Za_5$ and $Za_6$), preferably an alkyl group, a halogen atom, a nitro group, an alkoxy group, an aryl group, a nitro group, a heterocyclic group, an aryloxy group, an acylamino group, a carbamoyl group, a sulfo group, a hydroxyl group, a carboxyl group, an alkylthio group, or a cyano group, more preferably an alkyl group, a halogen atom, an alkoxy group, an aryl group, a heterocyclic group, a carbamoyl group, or a carboxyl group, and further preferably an alkyl group, an aryl group or a heterocyclic group.

$Ma_{12}$-$Ma_{14}$ each is preferably a non-substituted methine group.

$Ma_{12}$-$Ma_{14}$ may be mutually bonded to form a ring, and a ring to be formed is preferably a cyclohexene ring, a cyclopentene ring, a benzene ring or a thiophene ring.

$ka^3$ represents an integer of 0-3, preferably 0-2, and further preferably 1 or 2.

In case $ka^3$ is 2 or larger, plural $Ma_{12}$s or $Ma_{13}$s may be mutually same or different.

CI represents a charge-neutralizing ion; and y represents a number required for neutralizing the charge.

The compound of the present invention is also preferably represented by a general formula (1):

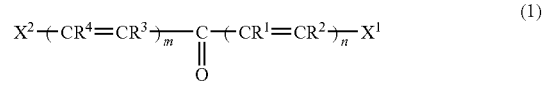

wherein $R^1$, $R^2$, $R^3$ and $R^4$ each independently represents a hydrogen atom, or a substituent, which is preferably an alkyl group (preferably with C number of 1-20, such as methyl, ethyl, n-propyl, isopropyl, n-butyl, n-pentyl, benzyl, 3-sulfopropyl, 4-sulfobutyl, 3-methyl-3-sulfopropyl, 2'-sulfobenzyl, carboxymethyl, or 5-carboxypentyl), an alkenyl group (preferably with C number of 2-20, such as vinyl or allyl), a cycloalkyl group (preferably with C number of 3-20, such as cyclopentyl, or cyclohexyl), an aryl group (preferably with C number of 6-20, such as phenyl, 2-chlorophenyl, 4-methoxyphenyl, 3-methylphenyl or 1-naphthyl), or a heterocyclic group (preferably with C number of 1-20, such as pyridyl, thienyl, furyl, thiazolyl, imidazolyl, pyrazolyl, pyrrolidino, piperidino or morpholino).

$R^1$, $R^2$, $R^3$ and $R^4$ each is preferably a hydrogen atom or an alkyl group. Some (preferably two) of $R^1$, $R^2$, $R^3$ and $R^4$ may be mutually bonded to form a ring. In particular it is preferable that $R^1$ and $R^3$ are bonded to form a ring, and, in such case, a ring formed including the carbon atom of carbonyl group is preferably a 6-, 5- or 4-membered ring, more preferably a 5- or 4-membered ring, and most preferably a 5-membered ring.

In the general formula (1), n and m each independently represents an integer of 0-4, preferably 1-4, but n and m do not become 0 at the same time.

In case n or m is equal to or larger than 2, $R^1$, $R^2$, $R^3$ or $R^4$ present in plural units may be mutually same or different.

$X^1$ and $X^2$ independently represents an aryl group [preferably of C number of 6-20, and preferably a substituted aryl group (such as a substituted phenyl group, or a substituted naphthyl group, wherein preferred examples of the substituent being same as those for $Ma_1$-$Ma_7$), more preferably an aryl group substituted with an alkyl group, an aryl group, a heterocyclic group, a halogen atom, an amino group, a hydroxyl group, an alkoxy group, an aryloxy group, or an acylamino group, more preferably an aryl group substituted with an alkyl group, an amino group, a hydroxyl group, an alkoxy group, or an acylamino group, and most preferably an phenyl group substituted with an alkylamino group or a diarylamino group in a 4-position, in which plural substituents may be mutually bonded to form a ring, of which a most preferred example is a julolidine ring], a heterocyclic group (preferably C number of 1-20, preferably 3- to 8-membered ring, more preferably 5- or 6-membered ring, such as pyridyl, thienyl, furyl, thiazolyl, imidazolyl, pyrazolyl, pyrrolyl, indolyl, carbazolyl, phenothiazino, pyrolidino, piperidino, or morpholino, more preferably indolyl, carbazolyl, pyrrolyl or phenothiazino, in which the heterocycle may be substituted, and preferred examples of the substituent being same as those for the aforementioned aryl group), or a group represented by a general formula (2):

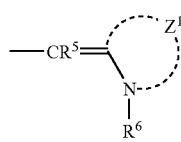

(2)

wherein $R^5$ represents a hydrogen atom or a substituent (preferred examples being same as those for $R^1$-$R^4$), preferably a hydrogen atom or an alkyl group, more preferably a hydrogen atom.

$R^6$ represents a hydrogen atom, an alkyl group, an alkenyl group, an aryl group or a heterocyclic group (of which preferred examples being same as those for $R^1$-$R^4$), preferably an alkyl group (preferably an alkyl group of C numberf of 1-6).

$Z^1$ represents an atomic group constituting a 5- or 6-membered ring.

A heterocycle to be formed is preferably an indolenine ring, an azaindolenine ring, a pyrazoline ring, a benzothiazole ring, a thiazole ring, a thiazoline ring, a benzoxazole ring, an oxazole ring, an oxazoline ring, a benzimidazole ring, an imidazole ring, a thiadiazole ring, a quinoline ring, or a pyridine ring, more preferably an indolenine ring, an azaindolenine ring, a pyrazoline ring, a benzothiazole ring, a thiazole ring, a thiazoline ring, a benzoxazole ring, an oxazole ring, an oxazoline ring, a benzimidazole ring, a thiadiazole ring, or a quinoline ring, and most preferably an indolenine ring, an azaindolenine ring, a benzothiazole ring, a benzoxazole ring, or a benzimidazole ring.

A heterocycle formed by $Z^1$ may have a substituent (preferred examples being same as those for the substituent on $Za_1$ and $Za_2$), which is more preferably an alkyl group, an aryl group, a heterocyclic group, a halogen atom, a carboxyl group, a sulfo group, an alkoxy group, a carbamoyl group or an alkoxycarbonyl group.

$X^1$ and $X^2$ each preferably represents an aryl group or a group represented by the general formula (2), and more preferably an aryl group substituted with a dialkylamino group or a diarylamino group in 4-position or a group represented by the general formula (2).

The two-photon absorption dye of the invention may also advantageously contain a hydrogen bonding group within the molecule. The hydrogen bonding group means a group donating a hydrogen in a hydrogen bond or a group accepting a hydrogen, and there is more preferred a group having both properties.

Also the compound having the hydrogen bonding group of the invention preferably exerts an associating interaction by a mutual interaction of the hydrogen bonding groups in a solution or solid state, and such interaction may be an intramolecular interaction or an intermolecular interaction, but is more preferably an intermolecular interaction.

The hydrogen bonding group in the invention is preferably represented by —COOH, —CONHR$^{11}$, —SO$_3$H, —SO$_2$NHR$^{12}$, —P(O)(OH)OR$^{13}$, —OH, —SH, —NHR$^{14}$, —NHCOR$^{15}$, or —NR$^{16}$C(O)NHR$^{17}$. $R^{11}$ and $R^{12}$ each independently represents a hydrogen atom, or an alkyl group (preferably with 1-20 carbon atoms (hereinafter called C number), such as methyl, ethyl, n-propyl, isopropyl, n-butyl, n-pentyl, benzyl, 3-sulfopropyl, 4-sulfobutyl, carboxymethyl, or 5-carboxypentyl), an alkenyl group (preferably with C number of 2-20, such as vinyl or allyl), an aryl group (preferably with C number of 6-20, such as phenyl, 2-chlorophenyl, 4-methoxyphenyl, 3-methylphenyl or 1-naphthyl), a heterocyclic group (preferably with C number of 1-20, such as pyridyl, thienyl, furyl, thiazolyl, imidazolyl, pyrazolyl, pyrrolidino, piperidino or morpholino), —COR$^{18}$ or —SO$_2$R$^{19}$, and $R^{13}$-$R^{19}$ each independently represents a hydrogen atom, an alkyl group, an alkenyl group, an aryl group or a heterocyclic group (preferred examples being same as those for $R^{11}$ and $R^{12}$).

$R^{11}$ preferably represents a hydrogen atom, an alkyl group, an aryl group, —COR$^{18}$ or —SO$_2$R$^{19}$, in which $R^{18}$ and $R^{19}$ each independently represents preferably an alkyl group or an aryl group.

$R^{11}$ preferably represents a hydrogen atom, an alkyl group, or —SO$_2$R$^{19}$, and most preferably a hydrogen atom.

$R^{12}$ preferably represents a hydrogen atom, an alkyl group, an aryl group, —COR$^{18}$ or —SO$_2$R$^{19}$, in which $R^{18}$ and $R^{19}$ each independently represents preferably an alkyl group or an aryl group.

$R^{12}$ preferably represents a hydrogen atom, an alkyl group, or —COR$^{18}$, and most preferably a hydrogen atom.

$R^{13}$ preferably represents a hydrogen atom, an alkyl group, or an aryl group, and more preferably a hydrogen atom.

$R^{14}$ preferably represents a hydrogen atom, an alkyl group, or an aryl group.

$R^{15}$ preferably represents an alkyl group, or an aryl group.

$R^{16}$ preferably represents a hydrogen atom, and $R^{17}$ preferably represents a hydrogen atom, an alkyl group, or an aryl group.

The hydrogen bonding group is more preferably —COOH, —CONHR$^{11}$, —SO$_2$NHR$^{12}$, —NHCOR$^{15}$, or —NR$^{16}$C(O)NHR$^{17}$, further preferably —COOH, —CONHR$^{11}$, or —SO$_2$NHR$^{12}$, and most preferably —COOH or —CONH$_2$.

The two-photon absorption dye of the invention may be employed in a monomer state, or in an associated state.

An associated (aggregated) state generally means a state in which chromophores of the dye are fixed in a specified spatial arrangement by a bonding force such as a covalent bonding, a coordination bonding, or an intermolecular force (such as a hydrogen bond, a van der Waals force, or a Coulomb force).

The two-photon absorption dye of the invention may be employed in an intermolecular aggregated state, or in a state having two or more chromophores, capable of two-photon absorption, within a molecule, which execute a two-photon absorption in an intramolecular aggregated state.

For reference, an aggregate will be explained in the following. The aggregate is explained in detail, for example in James, "The Theory of the Photographic Process", 4th edit., Macmillan, 1977, Chap. 8, p. 218-222, and Takayoshi Kobayashi, "J-aggregates", World Scientific Publishing Co. Pte. Ltd., 1996.

A monomer means a substance constituted of a single unit. With respect to an absorption wavelength of an aggregate, an aggregate showing an absorption shift to a shorter wavelength from a monomer absorption is called an H-aggregate (a substance constituted of two units is called a dimer), and an aggregate showing an absorption shift to a longer wavelength is called a J-aggregate.

In the structure of the aggregate, a brick-structured aggregate is called a J-aggregate in case of a small aberration angle in the aggregate, but is called an H-aggregate in case of a large aberration angle. The brick-structured aggregate is explained in detail in Chemical Physics Letter, vol. 6, p. 183(1970). Also an aggregate having a structure similar to that of the brick-structured aggregate include a ladder-structure or step-structured aggregate. The ladder-structure or step-structured aggregate is described in detail in Zeitschrift fur Physikalische Chemie, vol. 49, p. 324(1941).

Other than the brick-structured aggregate, there is known an aggregate assuming a herringbone structure (called herringbone aggregate).

The herringbone aggregate is described in Charges Reich, Photographic Science and Engineering, vol. 18, No. 3, p. 335 (1974). The herringbone aggregate has two absorption maxima derived from the aggregate.

Whether an aggregate state is present can be confirmed by a change in the absorption state ($\lambda$max, $\epsilon$ and absorption shape) from the monomer state as explained above.

The compound of the invention may show, by an aggregation, a shift to a shorter wavelength (H-aggregation) or a shift to a longer wavelength (J-aggregate), but preferably forms a J-aggregate.

An intermolecular aggregate of the compound can be prepared in various methods.

For example, in a solution system, there can be employed a method of dissolving the compound in an aqueous solution in which a matrix such as gelatin is added (for example an aqueous solution of gelatin at 0.5 wt. % and the compound at $10^{-4}$ M), or an aqueous solution in which a salt such as KCl is added (for example an aqueous solution of KCl at 15% and the compound at $2\times10^{-3}$ M), or a method of dissolving the compound in a good solvent and adding a poor solvent later (such as a DMF-toluene system or a chloroform-toluene system).

Also in a membrane system, there can be employed a polymer dispersion system, an amorphous system, a crystal system or an LB film system.

Also an intermolecular aggregate can be formed by an adsorption, a chemical bonding or an auto-organization on a semiconductor (such as silver halide or titanium oxide) of a bulk state or a fine particle state (μm to nm order) or a metal (such as gold, silver or platinum) a bulk state or a fine particle state. A spectral sensitization in the silver halide color photography, by a J-aggregate adsorption of a cyanine dye on a silver halide crystal is based on this technology.

A number of compounds involved in the intermolecular aggregation may be two or a very large number.

In the following, preferred specific examples of the two-photon absorption dye to be employed in the present invention are shown, but the invention is not limited to such examples.

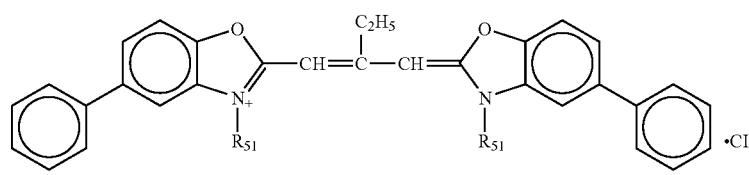

| | $R_{51}$ | Cl |
|---|---|---|
| D-1 | —(CH$_2$)$_{\overline{3}}$—SO$_3^-$ | Na$^+$ |
| D-2 | —C$_2$H$_5$ | I$^-$ |
| D-3 | —(CH$_2$)$_{\overline{3}}$—N(CH$_3$)$_3^+$ | (Br$^-$)$_3$ |

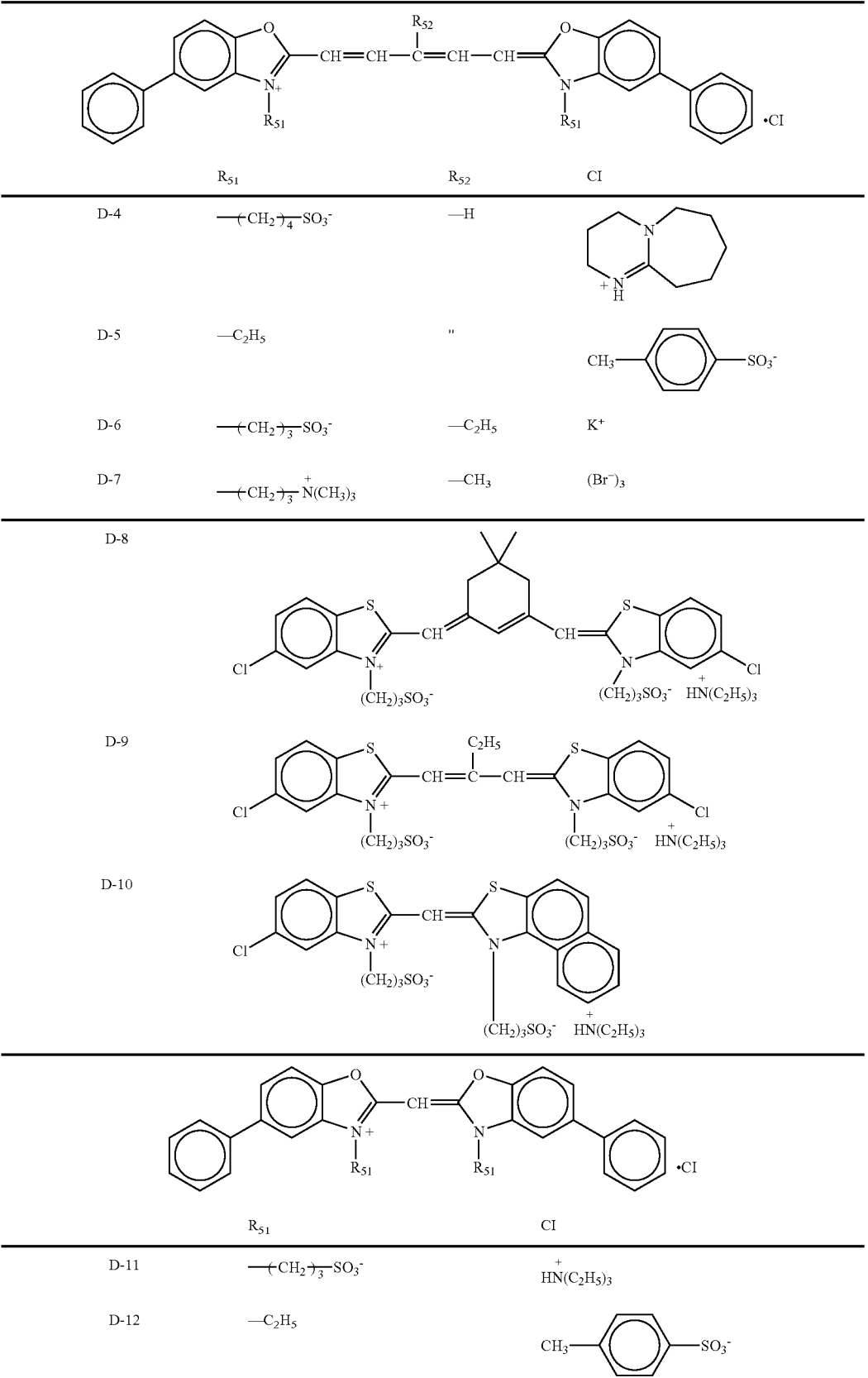

-continued

| | | | | |
|---|---|---|---|---|
| D-13 | —(CH$_2$)$_4$—NH—C(=$\overset{+}{N}H_2$)NH$_2$ | | | (Br$^-$)$_3$ |

| | R$_{51}$ | R$_{53}$ | n$_{51}$ | CI |
|---|---|---|---|---|
| D-14 | —(CH$_2$)$_3$—SO$_3^-$ | —Cl | 1 | Na$^+$ |
| D-15 | —C$_2$H$_5$ | " | 1 | I$^-$ |
| D-16 | —(CH$_2$)$_4$—SO$_3^-$ | —CF$_3$ | " | K$^+$ |
| D-17 | " | —CN | " | $\overset{+}{H}N(C_2H_5)_3$ |
| D-18 | " | —Cl | 2 |  |
| D-19 | —(CH$_2$)$_3$—SO$_3^-$ | —CN | " | " |
| D-20 | —C$_2$H$_5$ | " | " | CH$_3$—C$_6$H$_4$—SO$_3^-$ |

| | R$_{51}$ | R$_{54}$ | n$_{51}$ | CI |
|---|---|---|---|---|
| D-21 | —(CH$_2$)$_3$—SO$_3^-$ | —H | 1 |  |
| D-22 | —C$_4$H$_9$ | —COOH | " | CH$_3$—C$_6$H$_4$—SO$_3^-$ |
| D-23 | —CH$_3$ | —H | 2 | I$^-$ |
| D-24 | —(CH$_2$)$_3$—SO$_3^-$ | —COOH | " | Na$^+$ |
| D-25 | —(CH$_2$)$_4$—SO$_3^-$ | —H | 3 | K$^+$ |
| D-26 | —(CH$_2$)$_3$—SO$_3^-$ | —COOH | " | " |
| D-27 | —CH$_3$ | —CONH$_2$ | " | CH$_3$—C$_6$H$_4$—SO$_3^-$ |

-continued
D-28
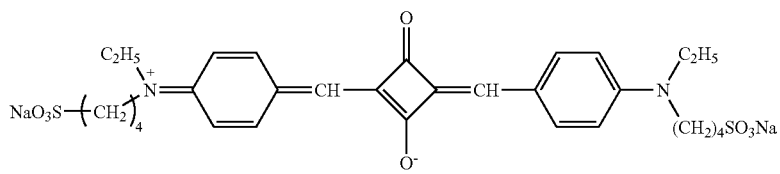
D-29
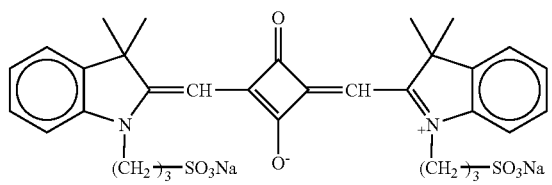
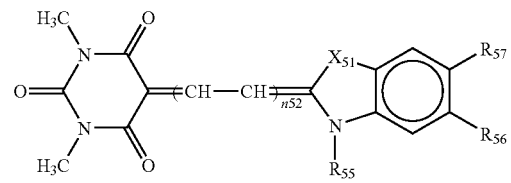
|      | $R_{55}$ | $R_{56}$ | $R_{57}$ | $X_{51}$ | $n_{52}$ |
|------|----------|----------|----------|----------|----------|
| D-30 | $-(CH_2)_3-SO_3^-\ ^+HN(C_2H_5)_3$ | —Cl | —H | —O— | 1 |
| D-31 | —$C_2H_5$ | —H | —COOH | " | 2 |
| D-32 | $-(CH_2)_3-\overset{+}{N}(CH_3)_3\ Br^-$ | 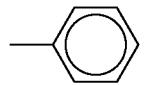 | —H | " | " |
| D-32 | $-(CH_2)_4-SO_3^-\ ^+HN(C_2H_5)_3$ | —$CH_3$ | —$CH_3$ | —S— | " |
| D-34 | $-(CH_2)_3-SO_3^-\ ^+HN(C_2H_5)_3$ | —H | —H | —$C(CH_3)_2$— | " |
| D-35 | —$CH_3$ | " | " | " | " |
| D-36 | $-(CH_2)_3-SO_3Na$ | " | —COOH | " | " |
| D-37 | —$CH_3$ | " | —$CONH_2$ | " | " |
| D-38 | $-(CH_2)_3-SO_3^-\ ^+HN(C_2H_5)_3$ | " | —H | " | 3 |
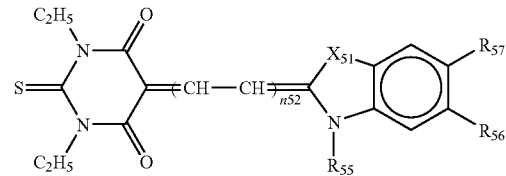
|      | $R_{55}$ | $R_{56}$ | $R_{57}$ | $X_{51}$ | $n_{52}$ |
|------|----------|----------|----------|----------|----------|
| D-39 | $-(CH_2)_3-SO_3^-\ ^+HN(C_2H_5)_3$ | —Cl | —H | —S— | 1 |
| D-40 | —$C_2H_5$ | —H | —$CONH_2$ | —O— | 2 |
| D-41 | $-(CH_2)_4-SO_3^-\ ^+HN(C_2H_5)_3$ | —$CH_3$ | —$CH_3$ | —S— | " |

-continued

| | | | | | |
|---|---|---|---|---|---|
| D-42 | —(CH$_2$)$_3$—SO$_3^-$  $^+$HN(C$_2$H$_5$)$_3$ | —H | —H | —C(CH$_3$)$_2$— | " |
| D-43 | —(CH$_2$)$_3$—SO$_3$Na | " | —COOH | " | " |
| D-44 | —CH$_3$ | " | —CONH$_2$ | " | " |
| D-45 | " | " | " | " | 3 |

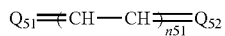

| | Q$_{51}$ | Q$_{52}$ | n$_{51}$ |
|---|---|---|---|
| D-46 | 2-cyano-2-(ethoxycarbonyl)methylene group | 1-(3-(triethylammonio)propylsulfonate)-naphtho[1,2-d]thiazol-2(1H)-ylidene | 2 |
| D-47 | 2-phenyl-1,1-dicyano-3-cyanomethylene | 3-(3-(trimethylammonio)propyl)-5-phenyl-benzoxazol-2(3H)-ylidene bromide | 1 |
| D-48 | 3-(dicyanomethylene)-2-methylene-benzo[b]thiophene 1,1-dioxide | 3-(3-(triethylammonio)propylsulfonate)-3,3-dimethyl-indolin-2-ylidene | 1 |
| D-49 | 3-methylene-1,5-dioxaspiro[5.5]undecane-2,4-dione | 1-(3-(triethylammonio)propylsulfonate)-naphtho[1,2-d]thiazol-2(1H)-ylidene | 2 |
| D-50 | 2-methylene-1,3-indandione | 3-(3-(triethylammonio)propylsulfonate)-3,3-dimethyl-indolin-2-ylidene | 2 |
| D-51 | 2-methylene-benzo[b]thiophen-3(2H)-one 1,1-dioxide | " | 2 |

-continued
| | | | |
|---|---|---|---|
| D-52 | 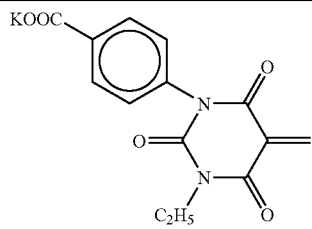 | 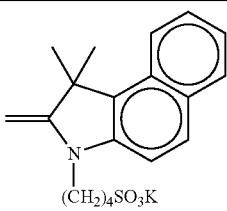 | 3 |
| D-53 | 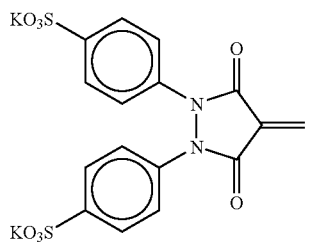 | 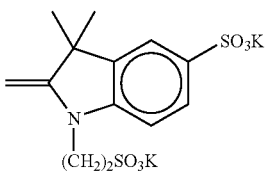 | 3 |
| D-54 | 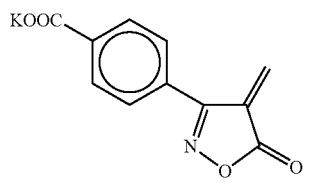 | 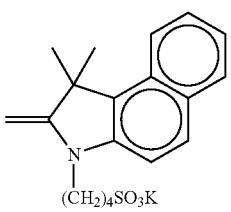 | 3 |
| D-55 | 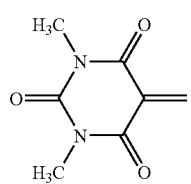 | 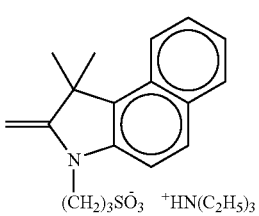 | 2 |
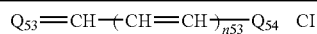
$$Q_{53}=CH-(CH=CH)_{\overline{n53}}Q_{54} \quad CI$$
| | $Q_{53}$ | $Q_{54}$ | $n_{53}$ | CI |
|---|---|---|---|---|
| D-56 | 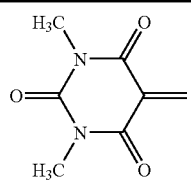 | 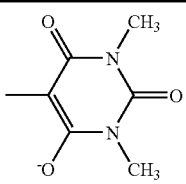 | 2 | H⁺ |
| D-57 | 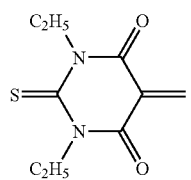 | 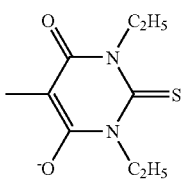 | 1 | 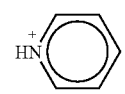 |
| D-58 | " | " | 2 | $^+HN(C_2H_5)_3$ |
| D-59 | 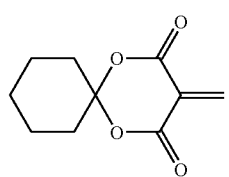 | 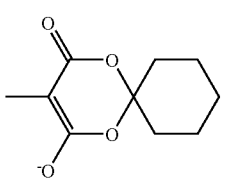 | 2 | H⁺ |

-continued
| | | | | |
|---|---|---|---|---|
| D-60 | 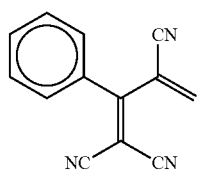 | 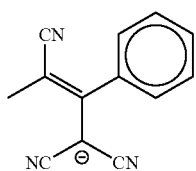 | 1 | $\overset{+}{H}N(C_2H_5)_3$ |
| D-61 | 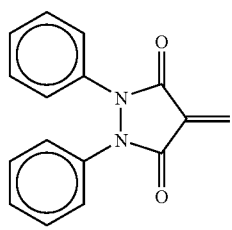 | 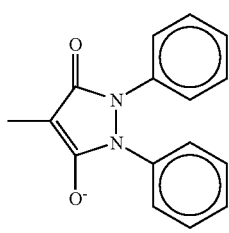 | 2 | $H^+$ |
| D-62 | 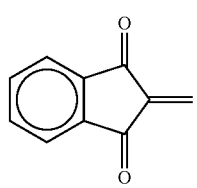 | 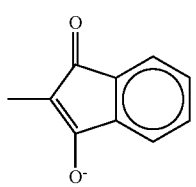 | 2 | $\overset{+}{H}N(C_2H_5)_3$ |
| D-63 | 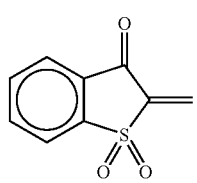 | 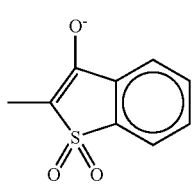 | 2 | " |
| D-64 | 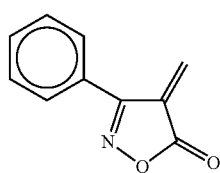 | 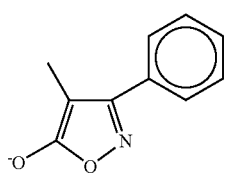 | 2 | $H^+$ |
D-65
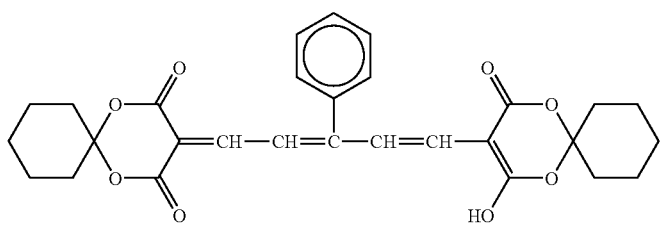
D-66
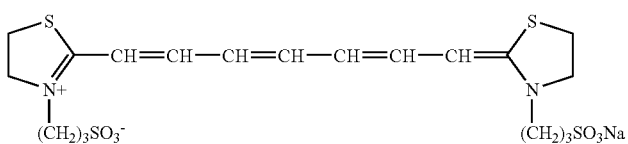
D-67
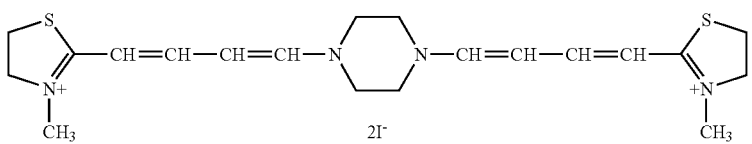

-continued
D-68 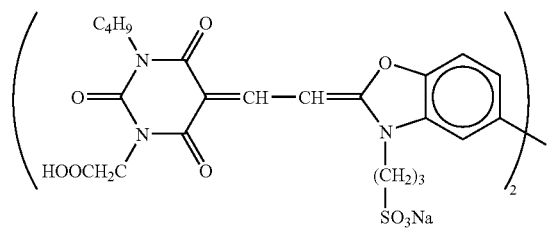
D-69 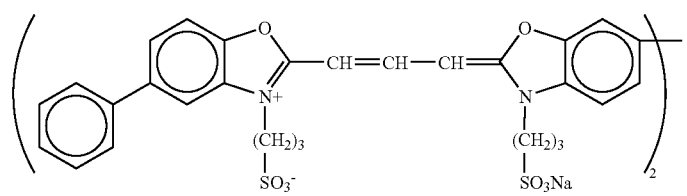
D-70 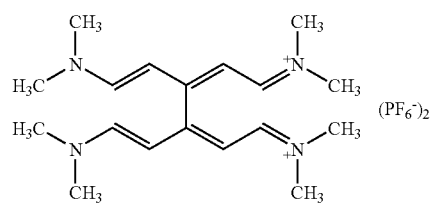
D-71 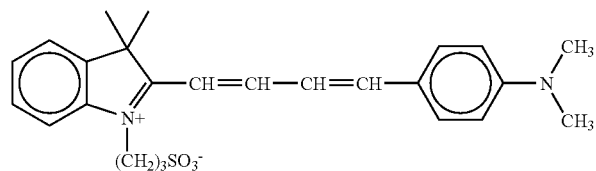
D-72 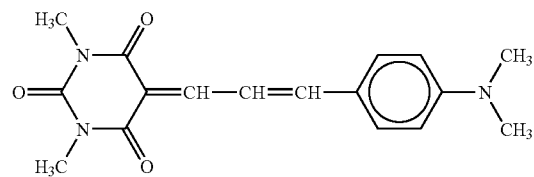
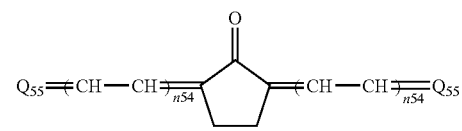
| | $Q_{55}$ | $n_{54}$ |
|---|---|---|
| D-73 | 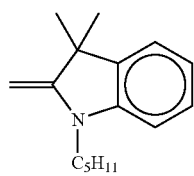 | 2 |
| D-74 | 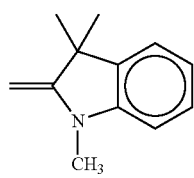 | 1 |

-continued
| | | |
|---|---|---|
| D-75 | 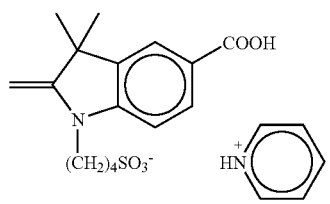 | 1 |
| D-76 | 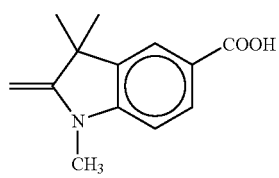 | 2 |
| D-77 | 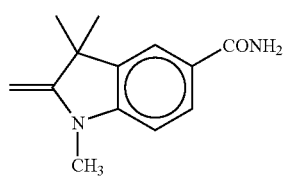 | 2 |
| D-78 | 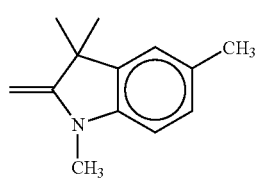 | 2 |
| D-79 | 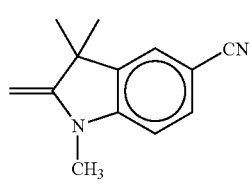 | 2 |
| D-80 | 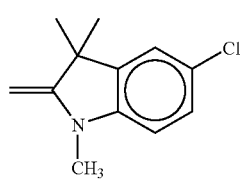 | 2 |
| D-81 | 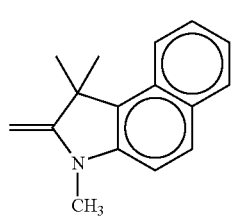 | 2 |
| D-82 | 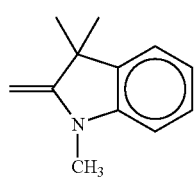 | 2 |

-continued
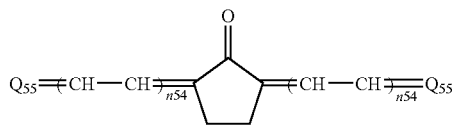
| | $Q_{55}$ | $n_{54}$ |
|---|---|---|
| D-83 | 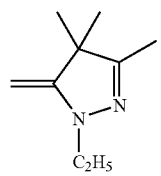 | 2 |
| D-84 | 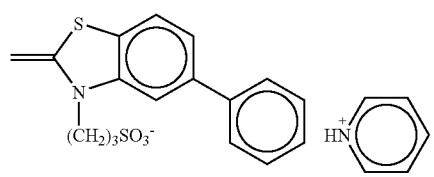 | 1 |
| D-85 | 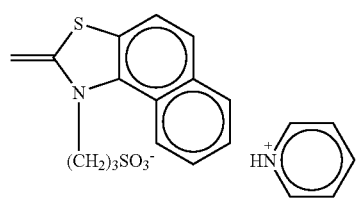 | 1 |
| D-86 | 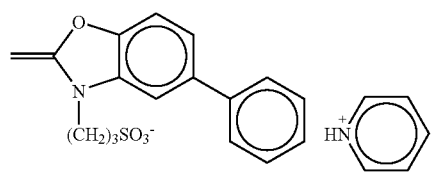 | 1 |
| D-87 | 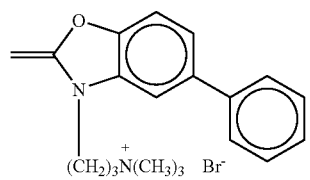 | 1 |
| D-88 | 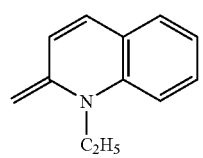 | 1 |
| D-89 | 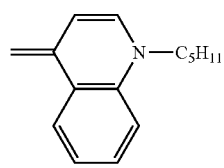 | 1 |

-continued
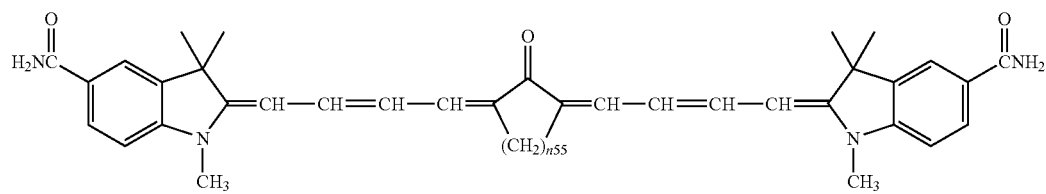
| | n$_{55}$ |
|---|---|
| D-90 | 0 |
| D-91 | 1 |
| D-92 | 3 |
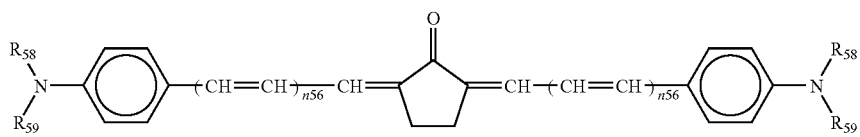
| | R$_{58}$ | R$_{59}$ | n$_{56}$ |
|---|---|---|---|
| D-93 | —C$_2$H$_5$ | —C$_2$H$_5$ | 0 |
| D-94 | —CH$_3$ | —CH$_3$ | 1 |
| D-95 | " | —(CH$_2$)$_3$—SO$_3$Na | 4 |
| D-96 | " | —CH$_3$ | 2 |
| D-97 | " | —COOH | " |
| D-98 | " | —CH$_3$ | 3 |
| D-93 | 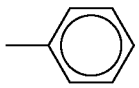 | 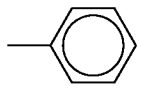 | 2 |
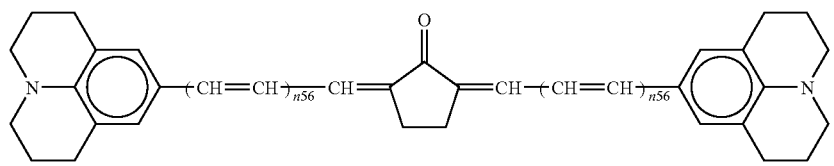
| | n$_{56}$ |
|---|---|
| D-100 | 1 |
| D-101 | 2 |
| D-102 | 3 |
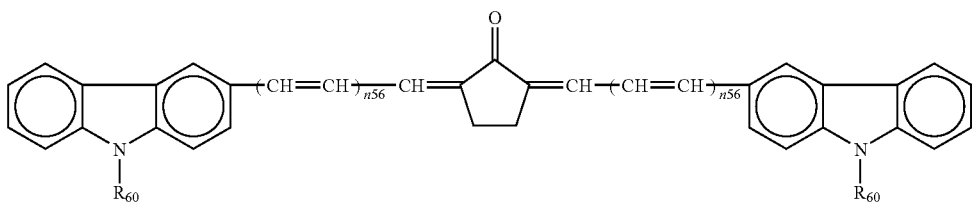
| | R$_{60}$ | n$_{56}$ |
|---|---|---|
| D-103 | —C$_2$H$_5$ | 0 |
| D-104 | " | 1 |
| D-105 | " | 2 |
| D-106 | —CH$_2$COOH | " |
| D-107 | —(CH$_2$)$_3$—SO$_3$Na | " |

-continued
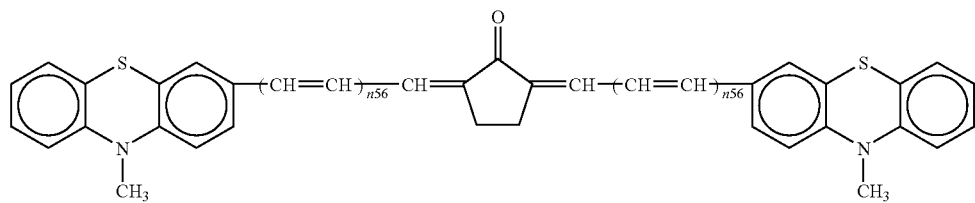
| | $n_{56}$ |
|---|---|
| D-108 | 1 |
| D-109 | 2 |
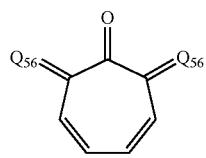
$Q_{56}$
| D-110 | 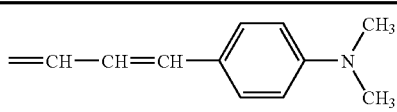 |
|---|---|
| D-111 | 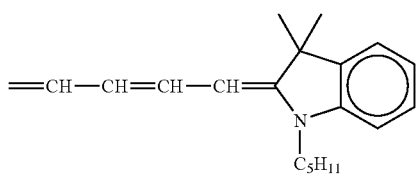 |
| D-112 | 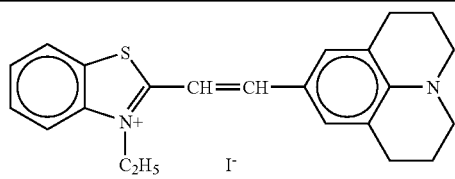 |
|---|---|
| D-113 | 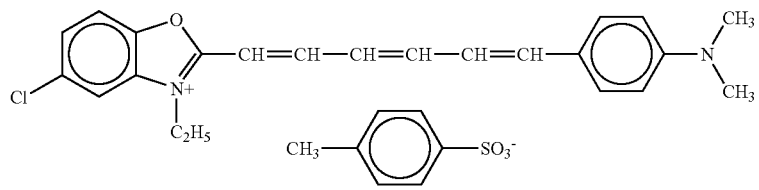 |
| D-114 | 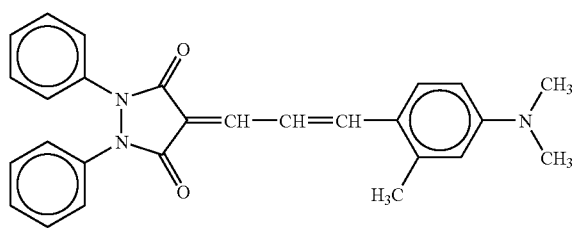 |
| D-115 | 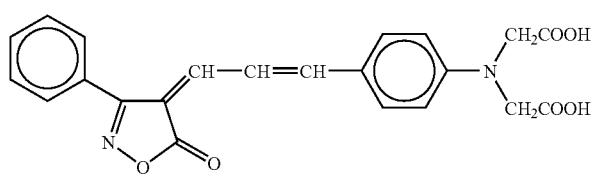 |

-continued
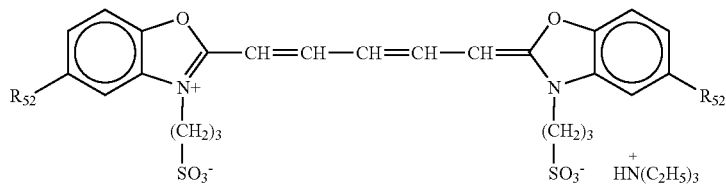
| | $R_{52}$ |
|---|---|
| D-116 | —F |
| D-117 | —Cl |
| D-118 | —Br |
| D-119 | —I |
| D-120 | H |
| D-121 | 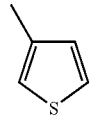 |
| D-122 | 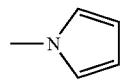 |
D-123 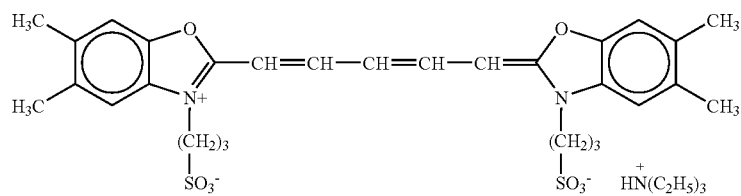
D-124 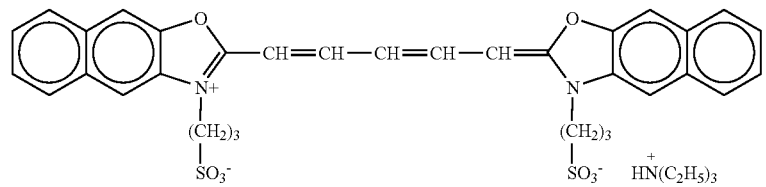
D-125 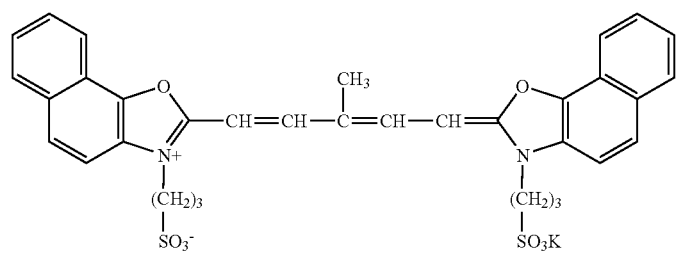
D-126 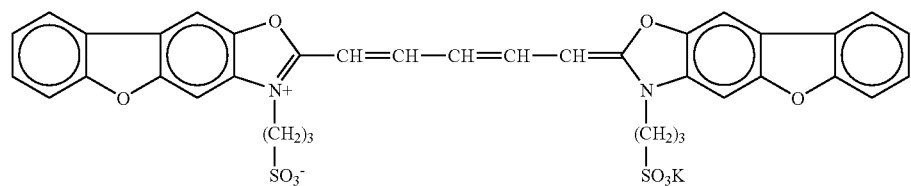
D-127 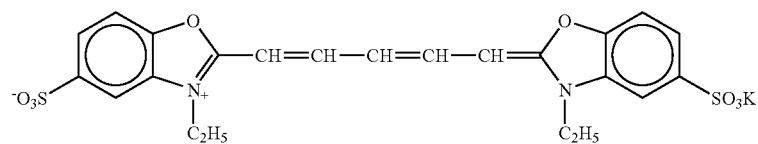

-continued
D-128
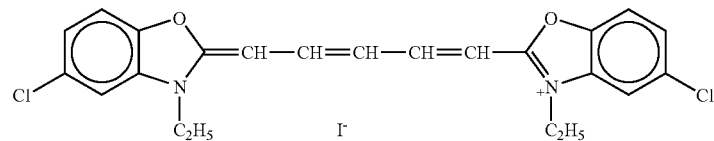
D-129
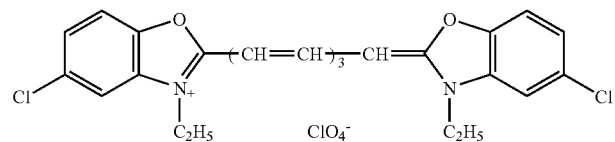
D-130
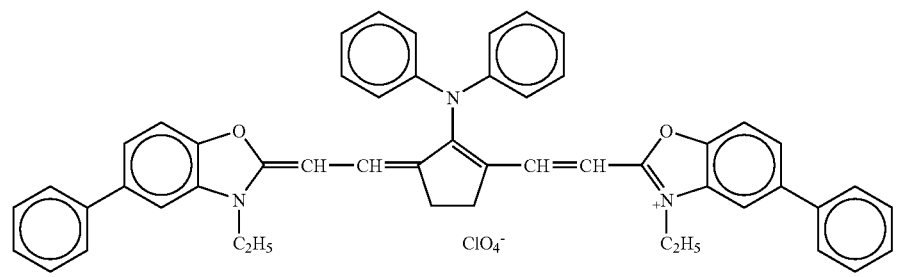
D-131
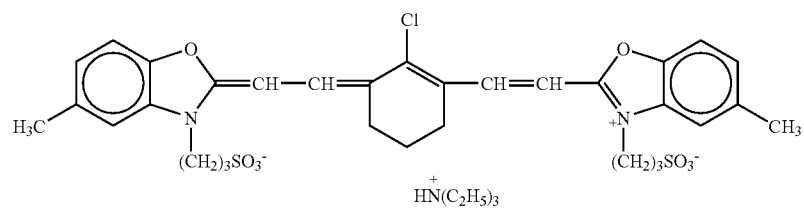
D-132
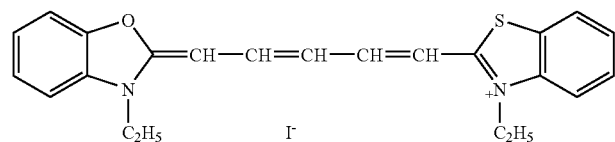
D-133
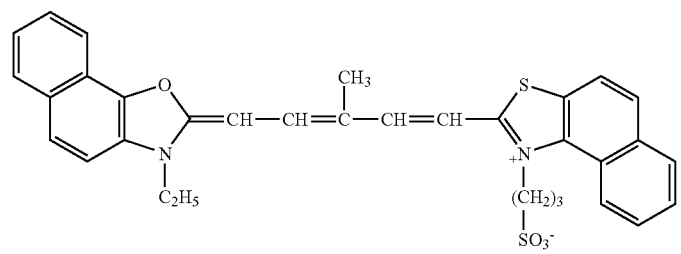
D-134
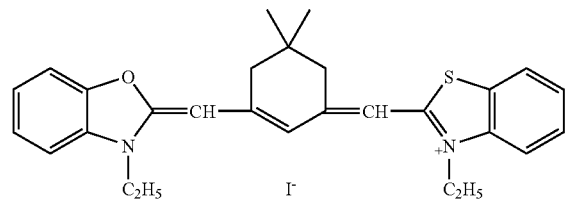

-continued
D-135 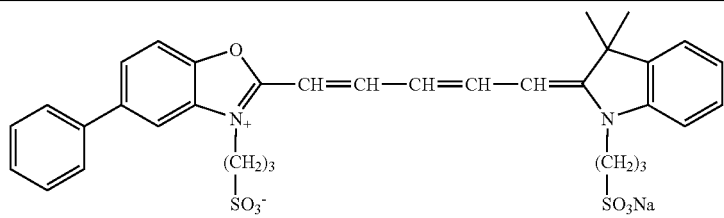
D-136 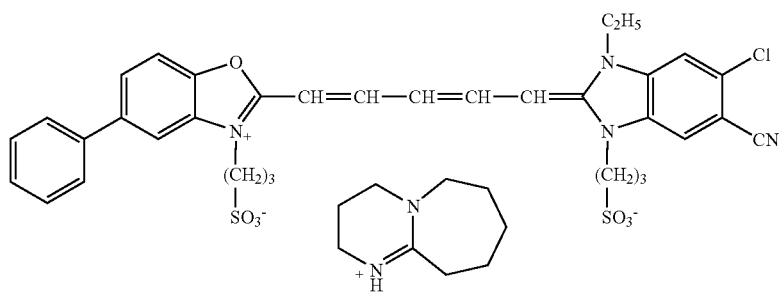
D-137 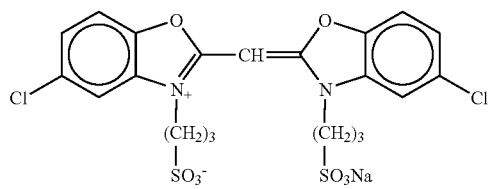
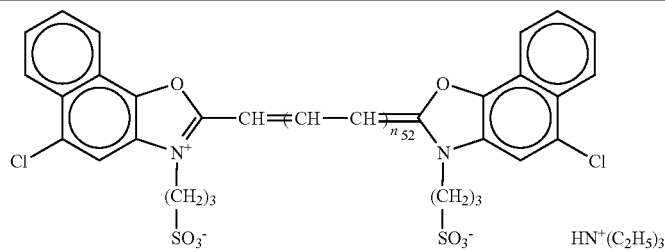
| | n52 |
|---|---|
| D-138 | 1 |
| D-139 | 2 |
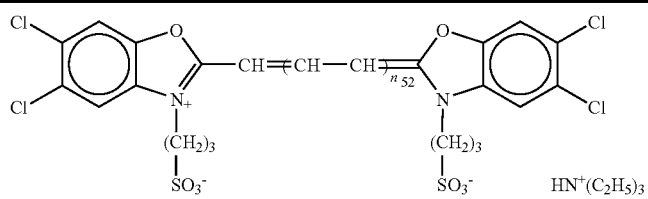
| | n52 |
|---|---|
| D-140 | 1 |
| D-141 | 2 |
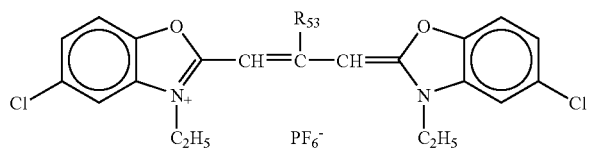
| | $R_{53}$ |
|---|---|
| D-142 | —H |
| D-143 | —CH$_3$ |

-continued
D-144
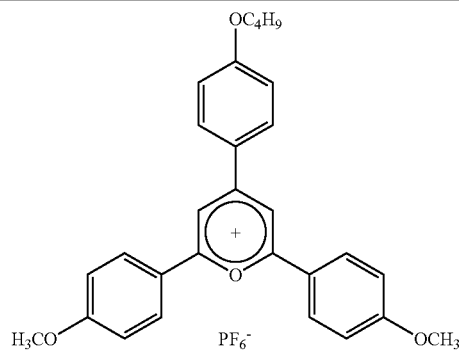
D-145
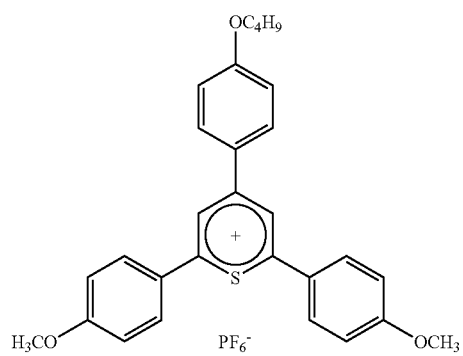
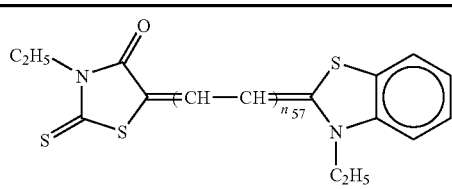
| | n57 |
|---|---|
| D-146 | 0 |
| D-147 | 1 |
| D-148 | 2 |
D-149 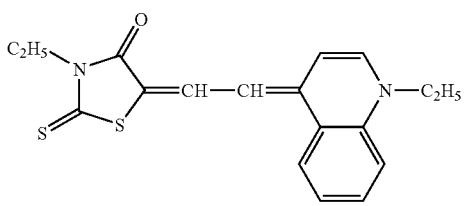
D-150 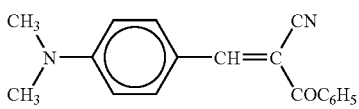
D-151 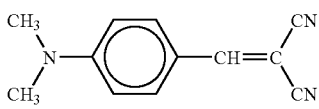
D-152 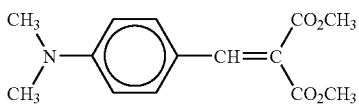

-continued
D-153 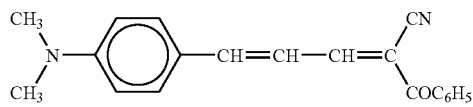
D-154 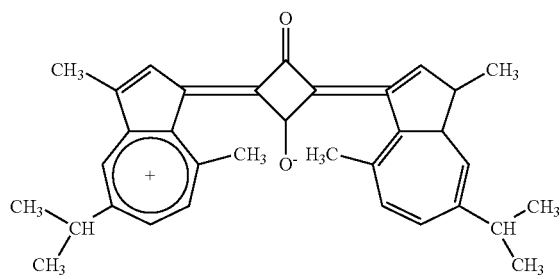
D-155 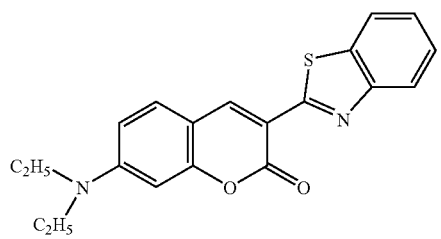
D-156 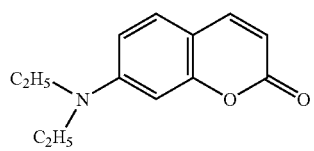
D-157 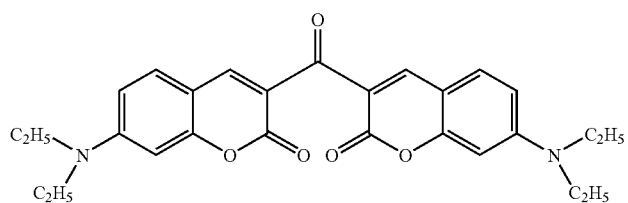
D-158 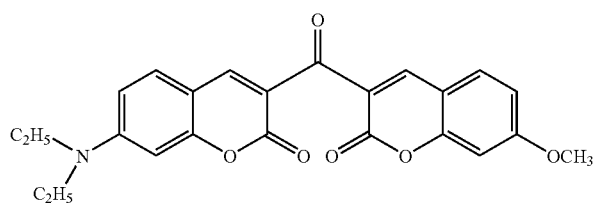
D-159 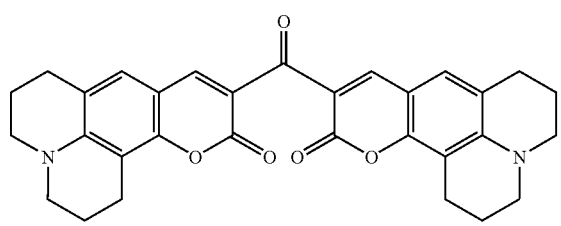

-continued
D-160
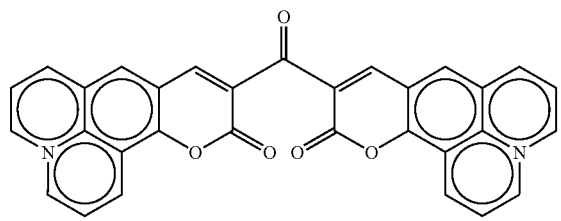
D-161
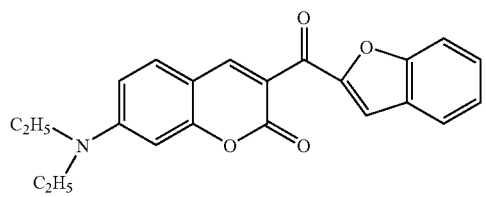
D-162
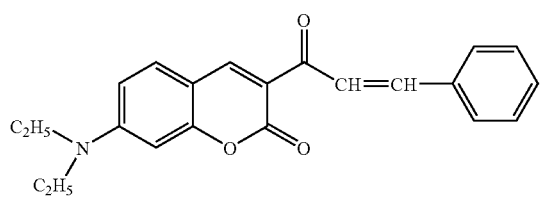
D-163
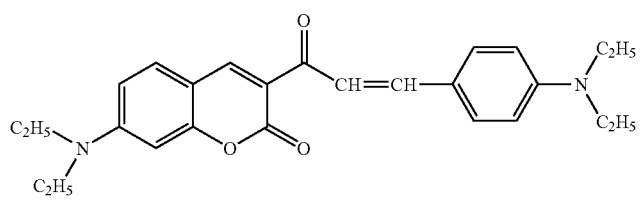
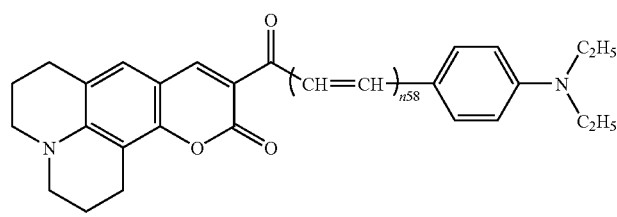
| | n58 |
|---|---|
| D-164 | 2 |
| D-165 | 3 |
| D-166 | 4 |
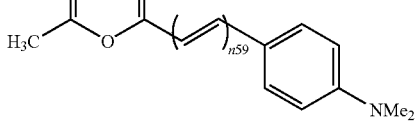
| | n59 |
|---|---|
| D-167 | 1 |
| D-168 | 2 |
| D-169 | 3 |
| D-170 | 4 |

-continued
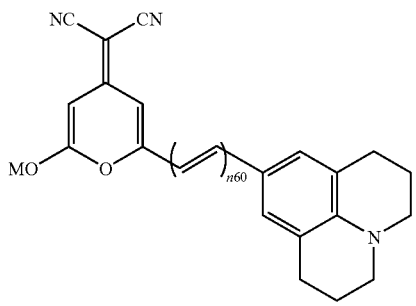
n60
| | n60 |
|---|---|
| D-171 | 1 |
| D-172 | 2 |
| D-173 | 3 |
D-174
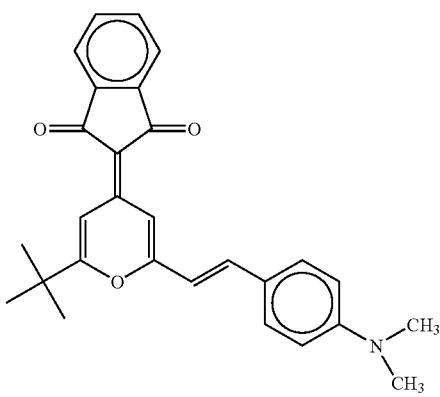
D-175
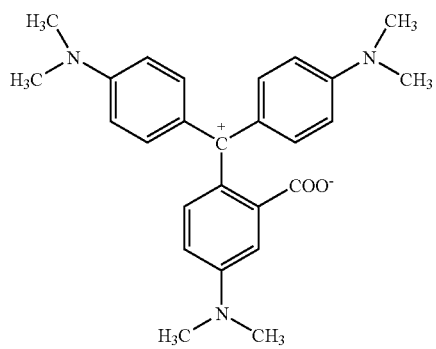
D-176
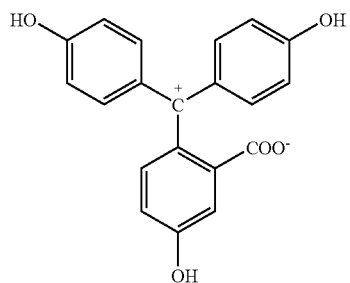

D-177 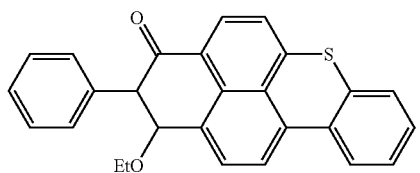
D-178 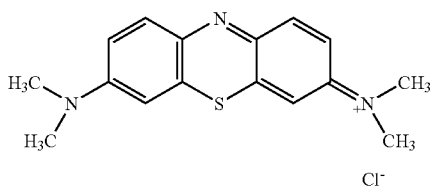
D-179 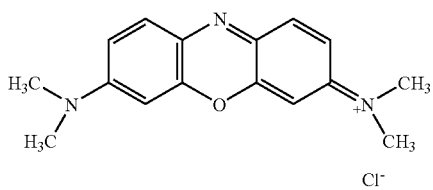
D-180 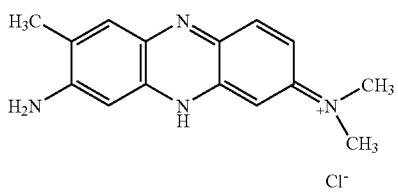
D-181 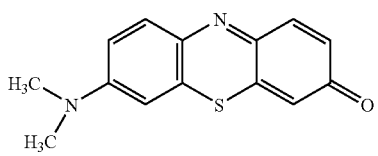
D-182 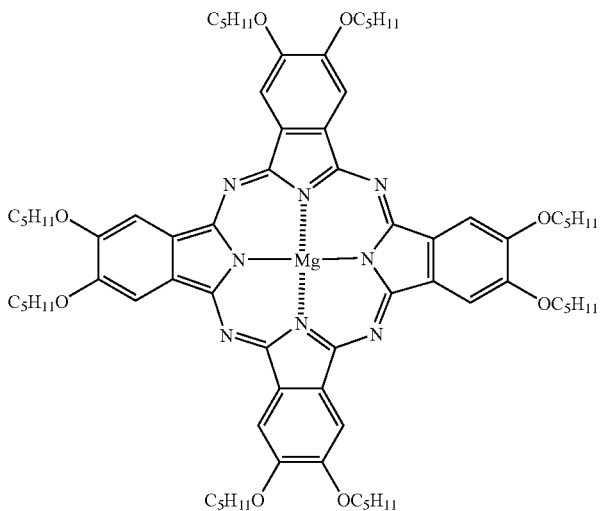

-continued
D-183
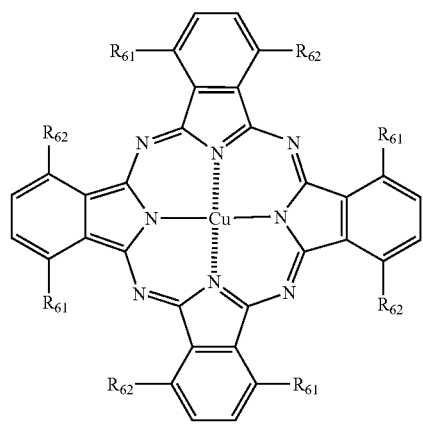
One of $R_{61}$ and $R_{62}$ is H, and the other one of $R_{61}$ and $R_{62}$ is
—$SO_2C_4H_9^{-i}$(mixture).
D-184
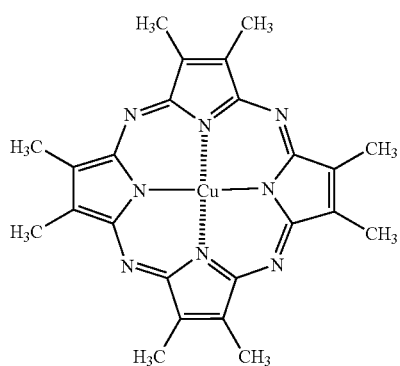
D-185
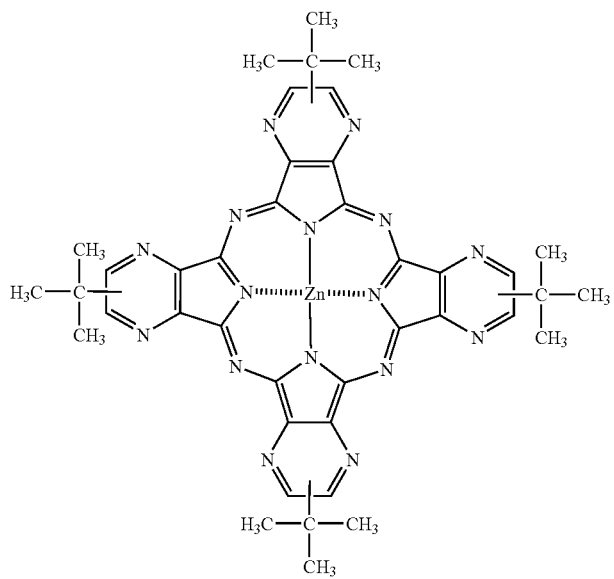

D-186
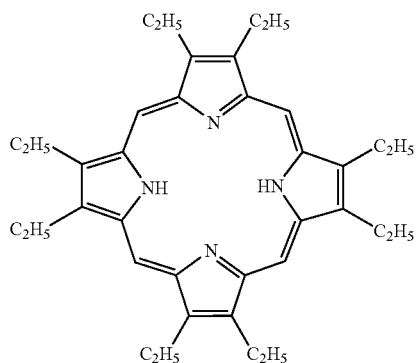
D-187
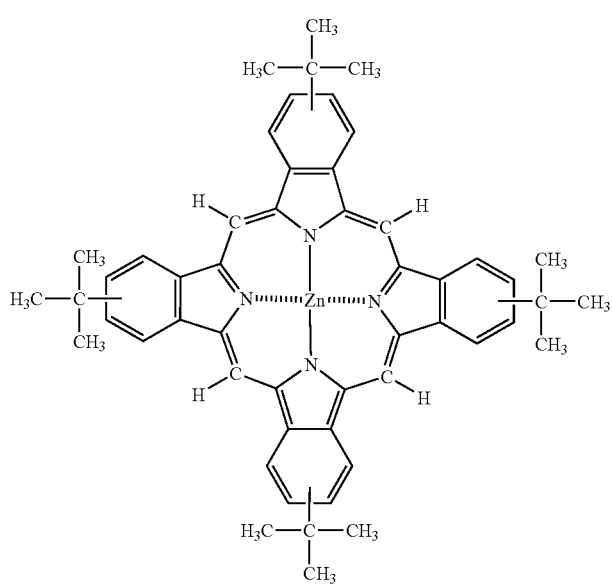
D-188
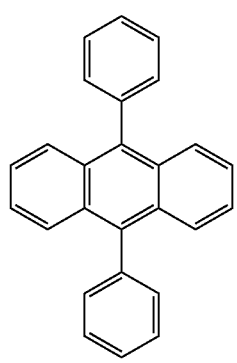

-continued
D-189
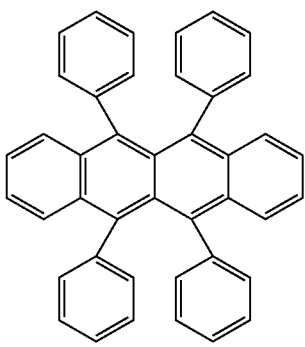
D-190
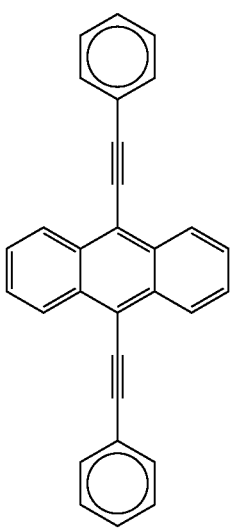
D-191
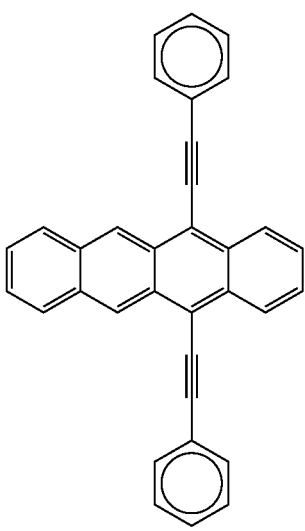
D-192
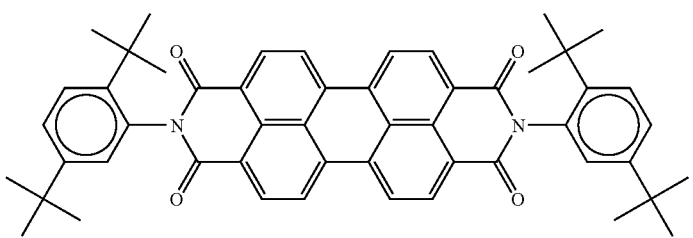

-continued
D-193 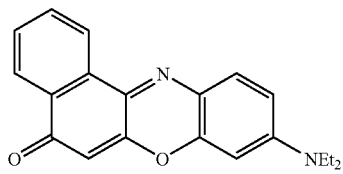
D-194 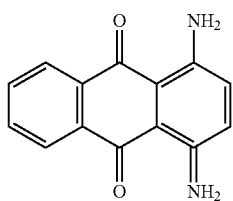
D-195 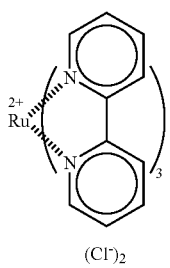
D-196 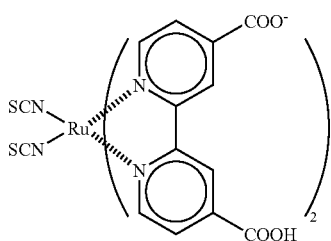
D-197 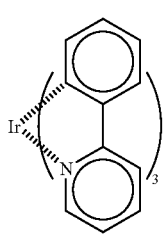
D-198 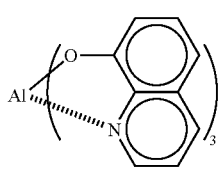

D-199 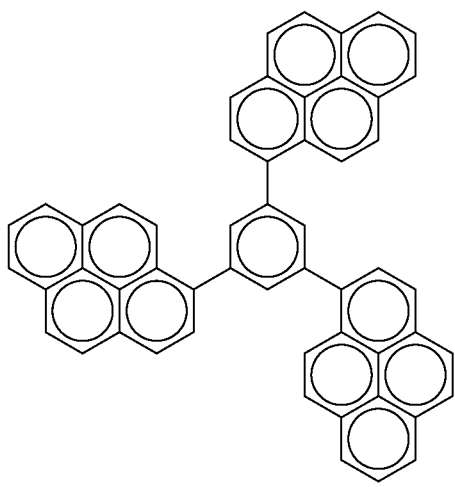
D-200 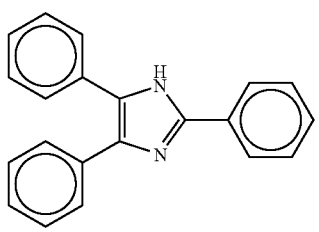
D-201 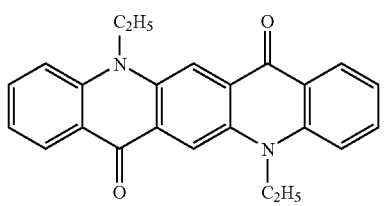
D-202 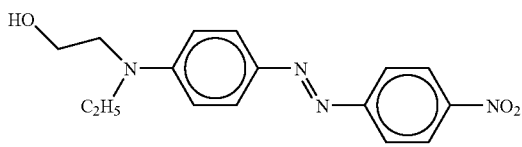
D-203 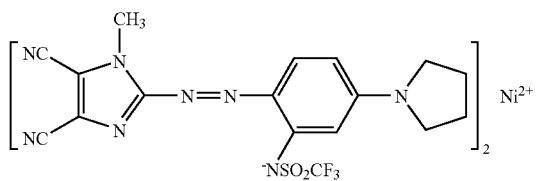
D-204 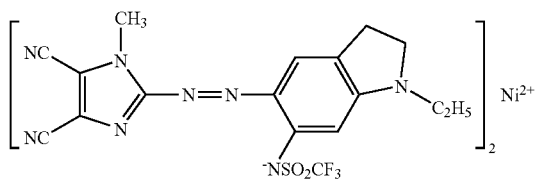

-continued
D-205 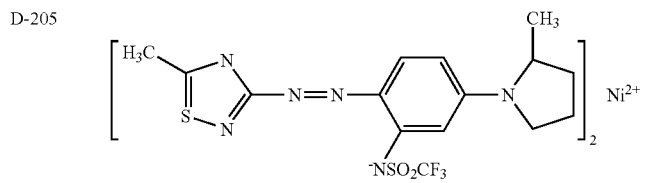
D-206 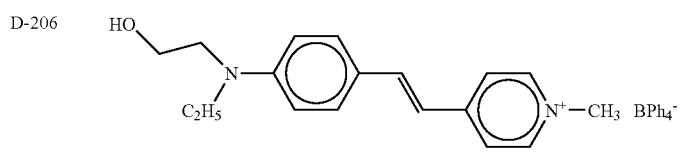
D-207 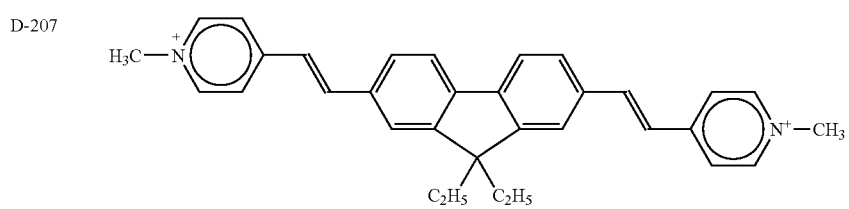
D-208 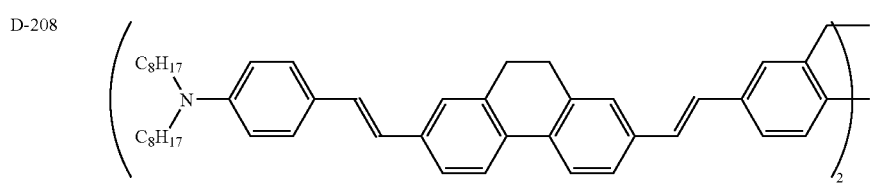
D-209 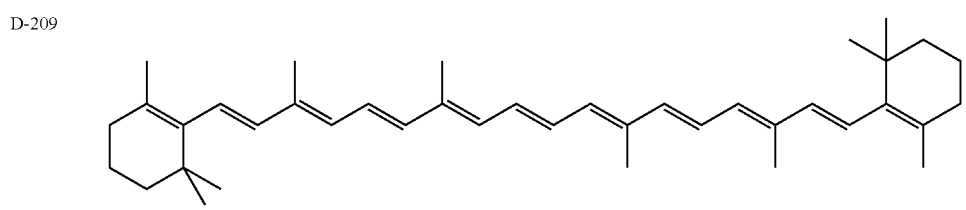
D-210 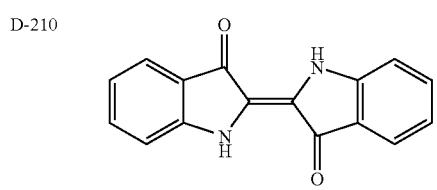
D-211 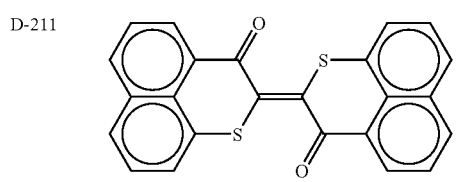
D-212 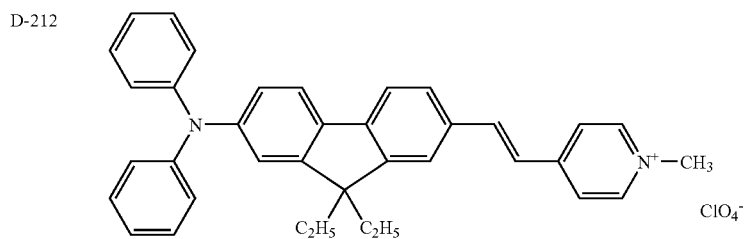

-continued
D-213
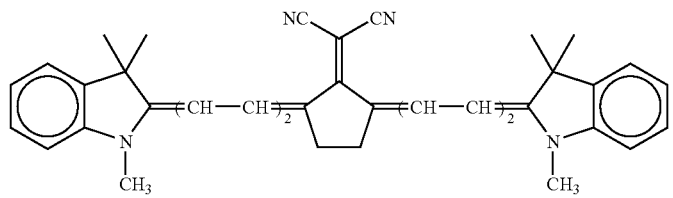
D-214
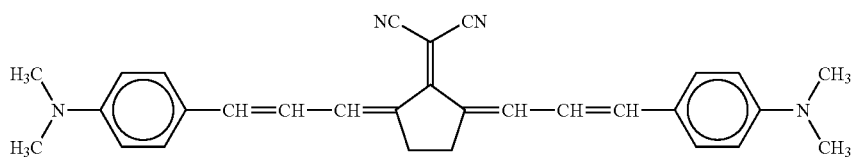
D-215
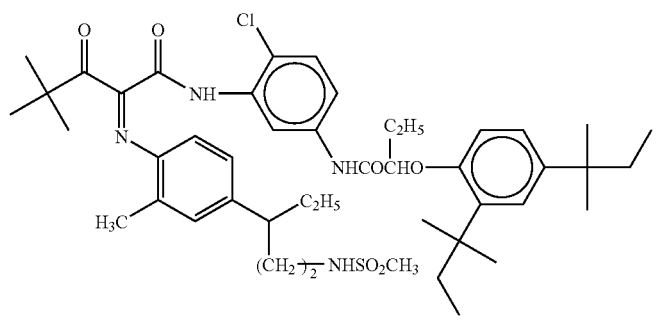
D-216
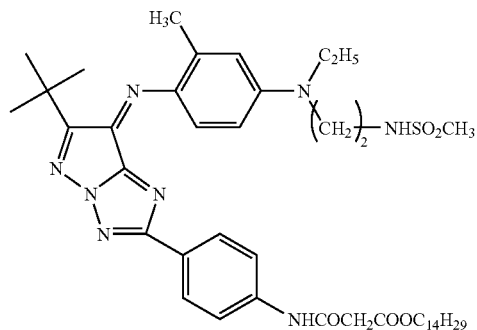
D-217
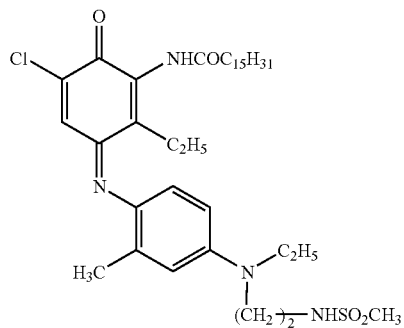

D-218

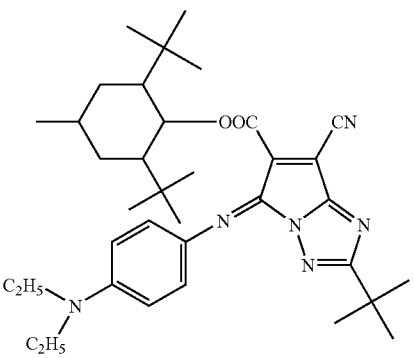

D-219

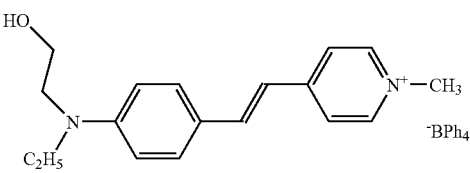

D-220

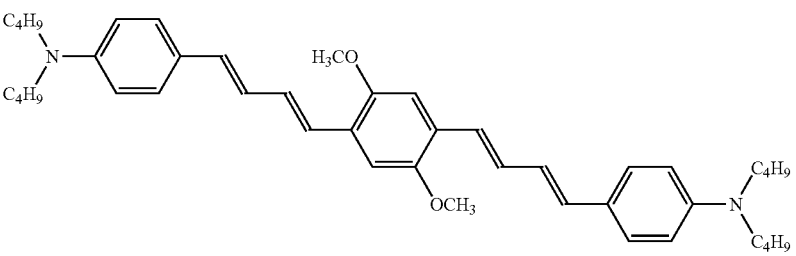

D-221

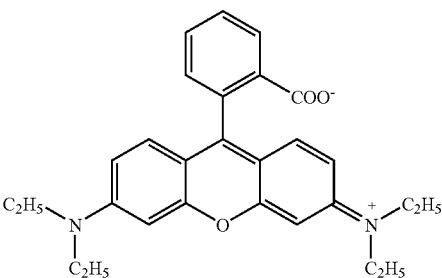

In the following, a detailed description will be given on a decolorizable dye in the two-photon absorption decolorizable material of the invention.

The decolorizable dye has a molar absorption coefficient of 100 or less at a wavelength of a light irradiated at the two-photon absorption, more preferably 10 or less, further preferably 5 or less, and most preferably does not have an absorption at the wavelength of the light irradiated at the two-photon absorption.

The decolorizable dye preferably has a linear absorption of a longer wavelength than the linear absorption of the two-photon absorption dye, and $\lambda_{max}$ of the linear absorption of the decolorizable dye is preferably of a longer wavelength than $\lambda_{max}$ of the linear absorption of the two-photon absorption dye within a range of 0-300 nm.

The decolorizable dye of the invention can preferably be a dye shown the examples of the two-photon absorption dye, but more preferably a cyanine dye, a squarilium cyanine dye, a styryl dye, a pyrilium dye, a merocyanine dye, an arylidene dye, an oxonol dye, a coumarin dye, a pyran dye, a xanthene dye, a thioxanthene dye, a phenothiazine dye, a phenoxazine dye, a phenazine dye, a phthalocyanine dye, an azaporphiline dye, a porphiline dye, a condensed-ring aromatic dye, a perylene dye, an azomethine dye, an azo dye, an anthraquinone dye, or a metal complex dye, and more preferably a cyanine dye, a styryl dye, a merocyanine dye, an arylidene dye, an oxonol dye, a coumarin dye, a xanthene dye, an azomethine dye, an azo dye, or a metal complex dye.

Particularly in case the decolorizer is an acid, the decolorizable dye is preferably a dissociated substance of a dissociable arylidene dye, a dissociable oxonol dye, a dissociable xanthene dye or a dissociable azo dye, and more preferably a dissociated substance of a dissociable arylidene dye, a dissociable oxonol dye, or a dissociable azo dye. A dissociable dye generally means a dye having an active hydrogen with pKa in a range of about 2 to 14, such as —OH, —SH, —COOH, —NHSO$_2$R or —CONHSO$_2$R, and showing an absorption shift to a longer wavelength or a higher E by a proton dissociation. Therefore, by treating a dissociable dye with a base in advance to form a dissociated state, there can be obtained a dye with an absorption of a longer wavelength or a higher ε value, which can be changed by a photoacid generation to a non-dissociable type and can be decolorized (absorption changed to a shorter wavelength or a lower ε value).

Also in case the decolorizer is a base, a color developed substance of an acid-color developing dye such as a triphenyl methane dye, a xanthene dye or a fluoran dye, prepared by an acid treatment in advance, may be employed as the color erasable dye, which can be changed by a photobase generation to a substance without a proton addition and can be decolorized (absorption changed to a shorter wavelength or a lower ε value).

In the following, specific examples of the decolorizable dye of the invention are shown, but the present invention is not limited to such examples.

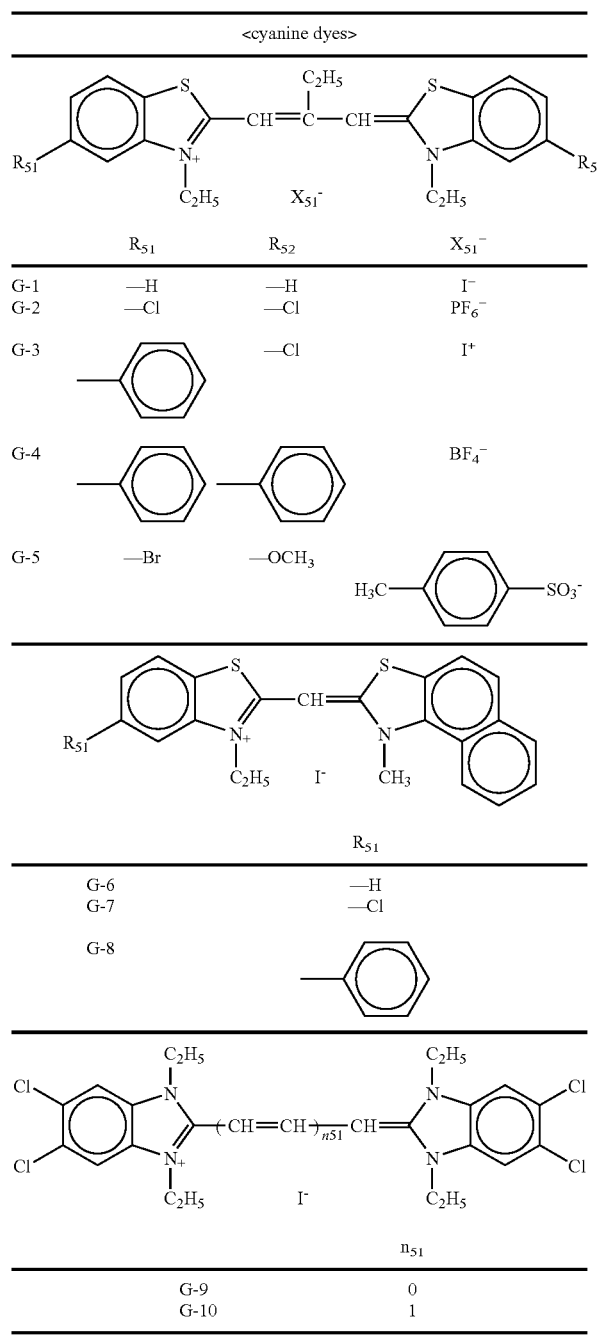

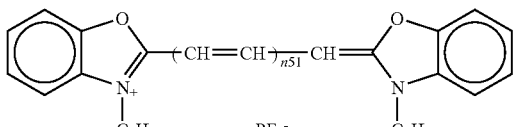

| | $n_{51}$ |
|---|---|
| G-11 | 0 |
| G-12 | 1 |
| G-13 | 2 |

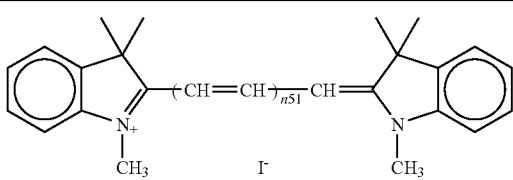

| | $n_{51}$ |
|---|---|
| G-14 | 0 |
| G-15 | 1 |
| G-16 | 2 |

<merocyanine dyes>

$$Q_{51}=\!\!\!\!(CH-CH)_{\overline{n52}}Q_{52}$$

| $Q_{51}$ | $Q_{52}$ | $n_{52}$ | |
|---|---|---|---|

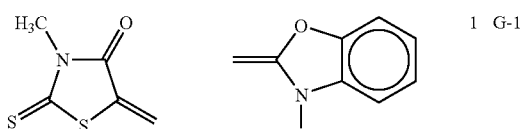
1  G-17

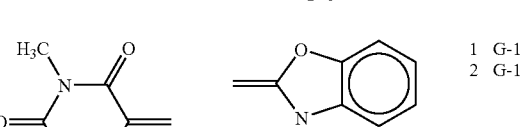
1  G-18
2  G-19

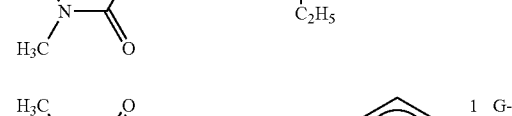
1  G-20

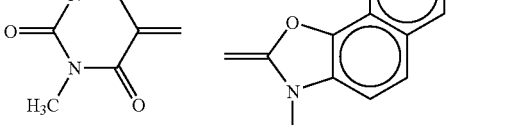
1  G-21
2  G-22

-continued
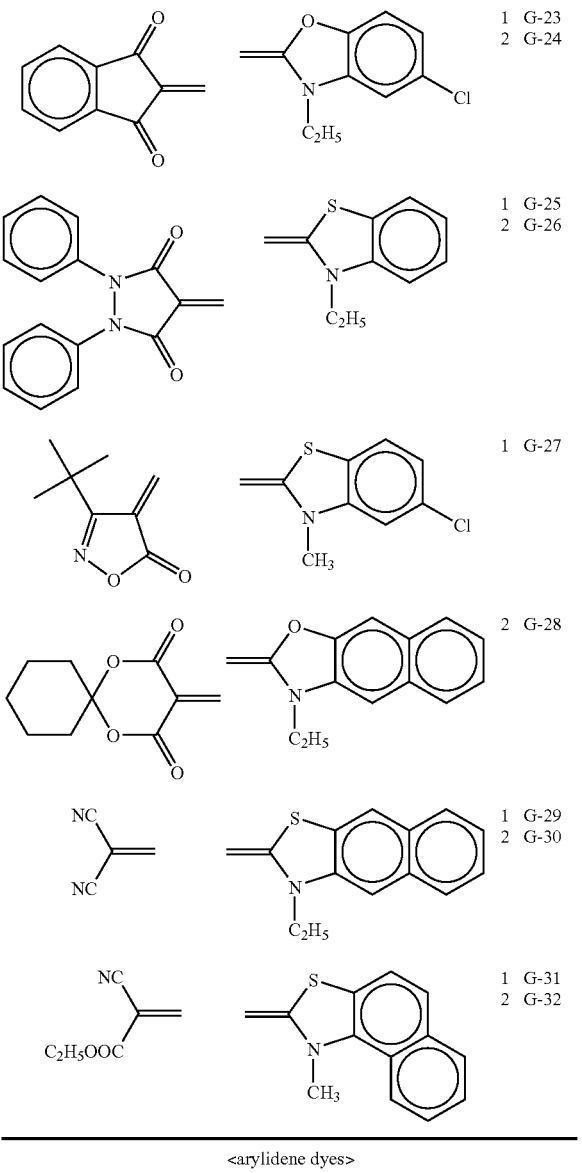
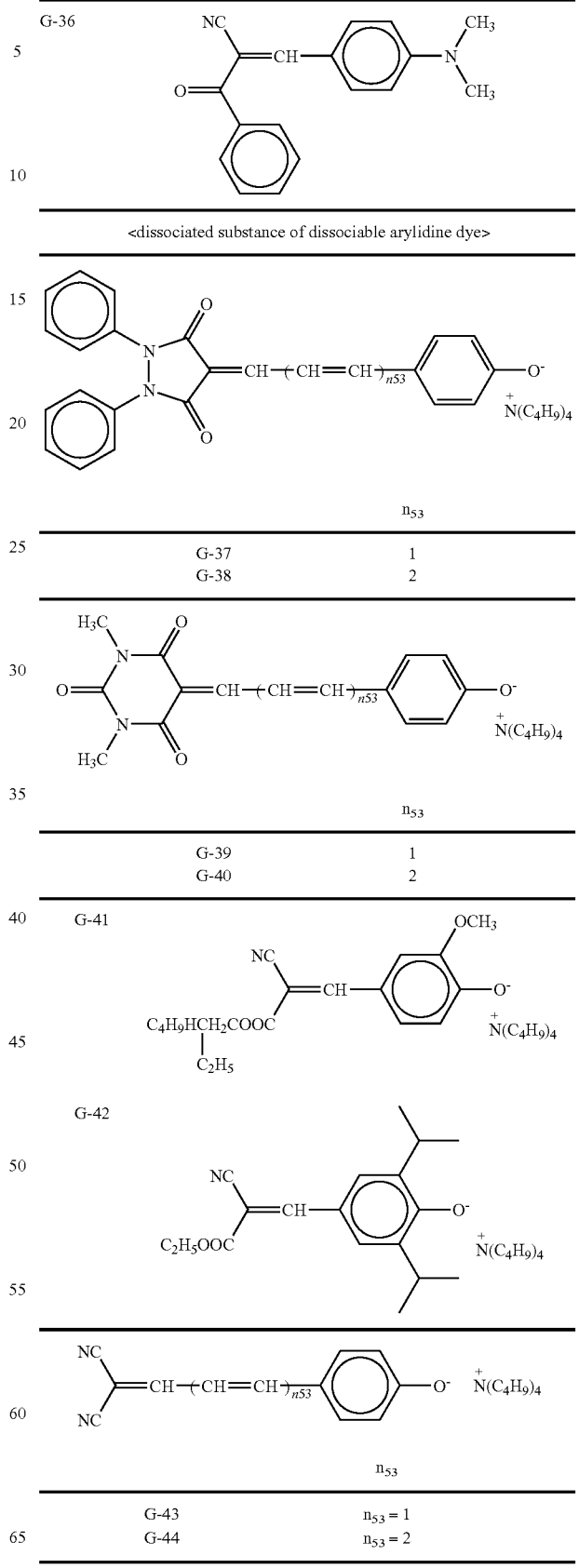

-continued
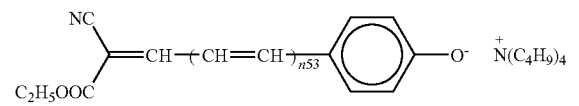
| | $n_{53}$ |
|---|---|
| G-45 | $n_{53} = 1$ |
| G-46 | $n_{53} = 2$ |
G-47 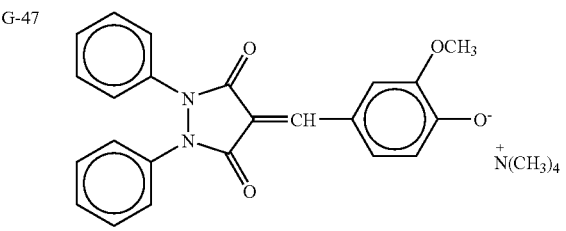
G-48 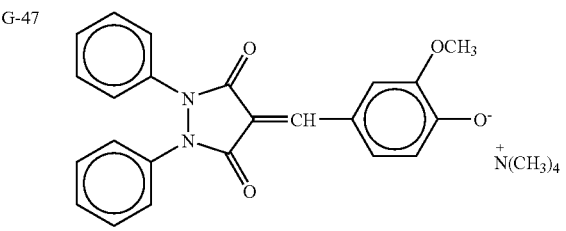
<dissociated substance of dissociable oxonol dye>
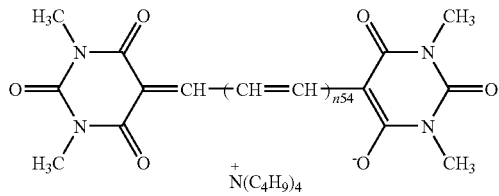
| | $n_{54}$ |
|---|---|
| G-49 | 0 |
| G-50 | 1 |
| G-51 | 2 |
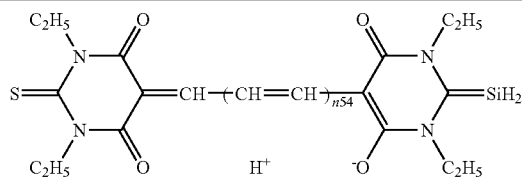
| | $n_{54}$ |
|---|---|
| G-52 | 0 |
| G-53 | 1 |
| G-54 | 2 |
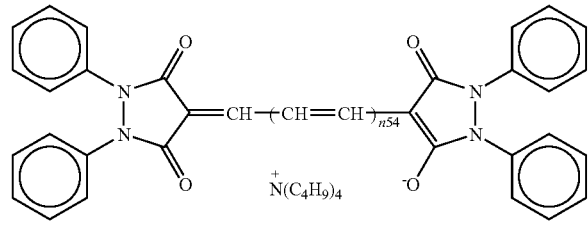
$n_{54}$
-continued
| G-55 | 0 |
| G-56 | 1 |
| G-57 | 2 |
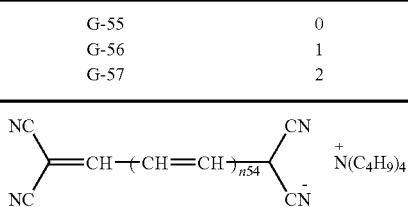
| | $n_{54}$ |
|---|---|
| G-58 | 0 |
| G-59 | 1 |
| G-60 | 2 |
<dissociated substance of dissociable xanthene dye>
G-61 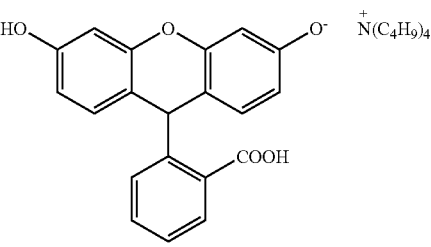
<dissociated substance of dissociable azo dye>
G-62 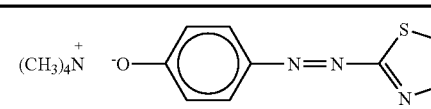
G-63 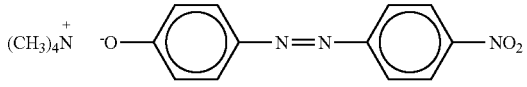
G-64 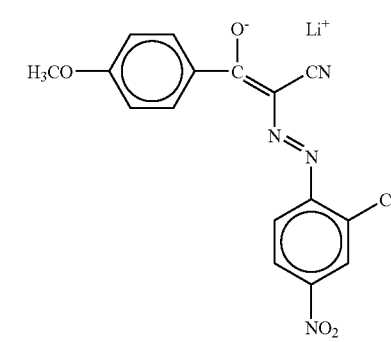
G-65 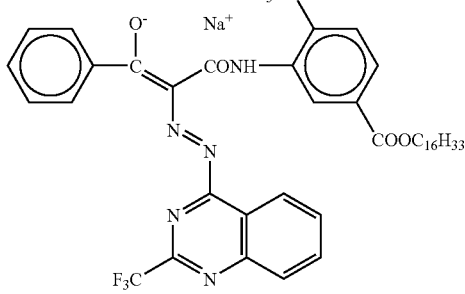

-continued
G-66
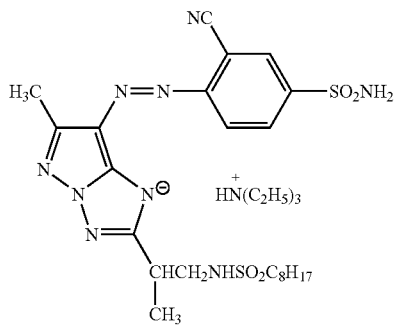
G-67
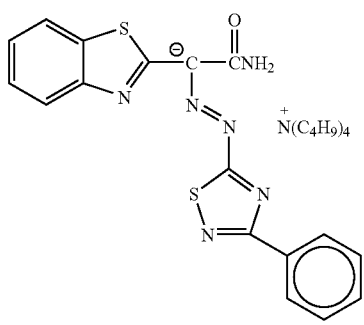
G-68
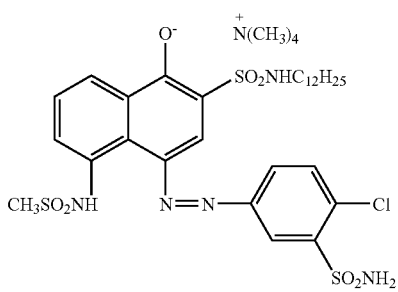
G-69
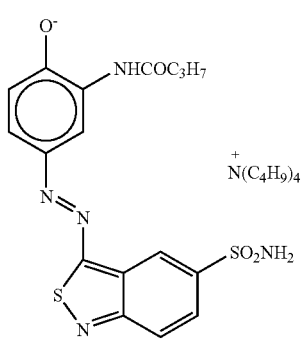
G-70
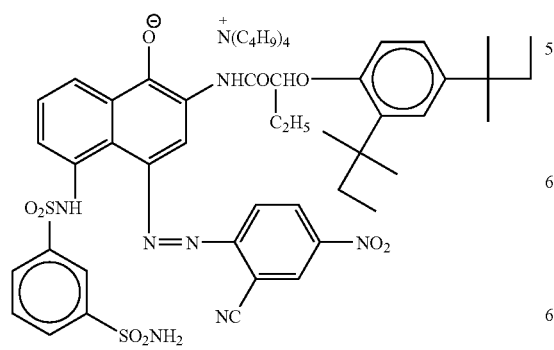
-continued
G-71
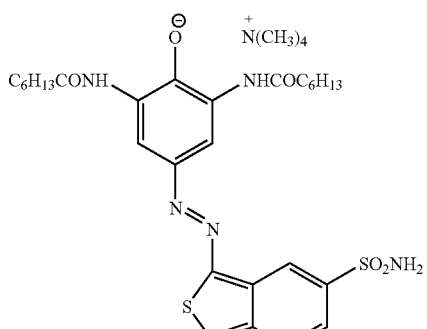
G-72
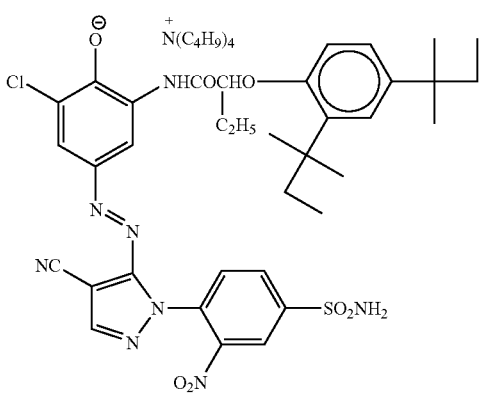
G-73
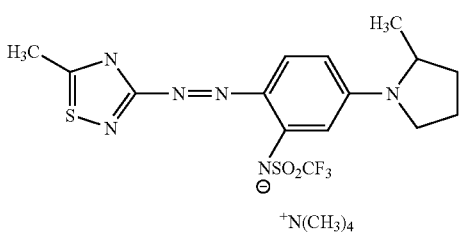
G-74
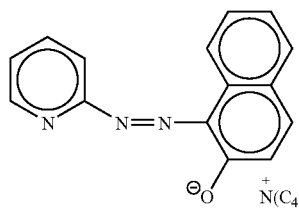
G-75
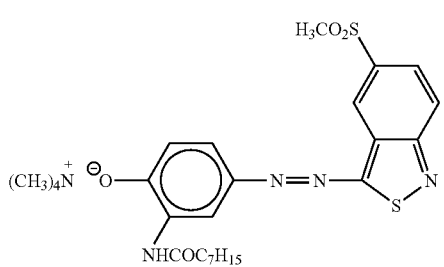

| | |
|---|---|
| G-76 | 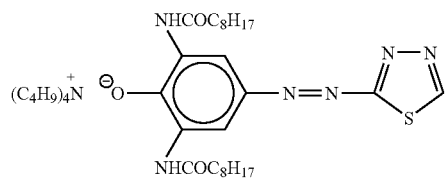 |
| G-77 | 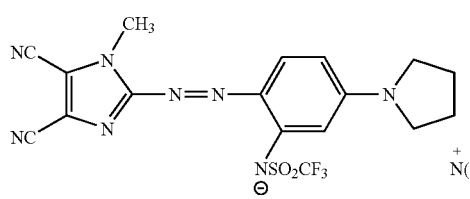 |
<dissociated substance of azomethine dye>
| | |
|---|---|
| G-78 | 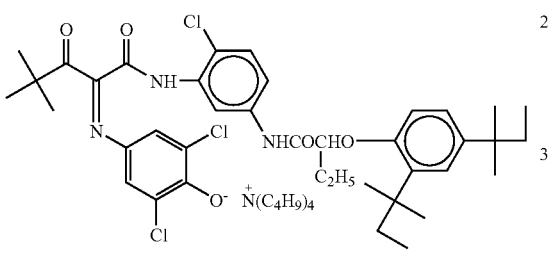 |
| G-79 | 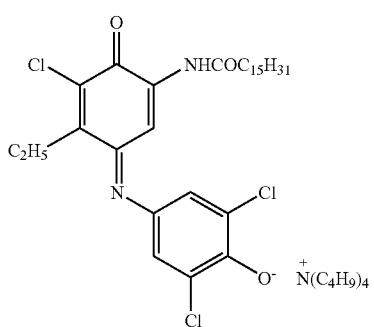 |
| G-80 | 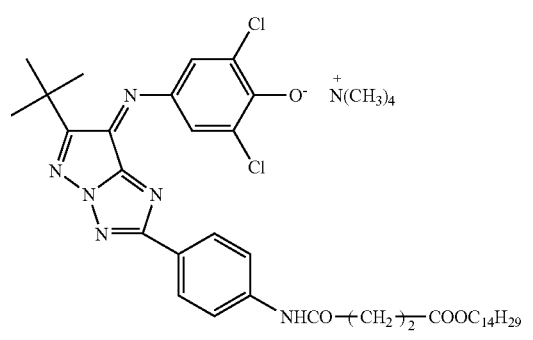 |
| | |
|---|---|
| G-81 | 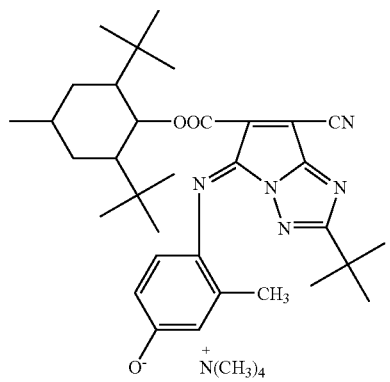 |
| G-82 | 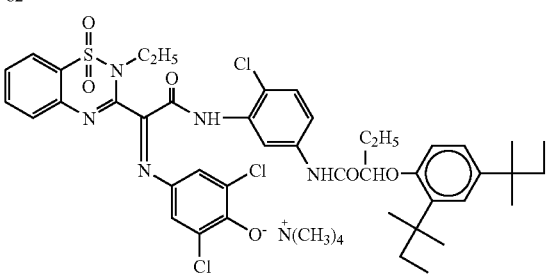 |
<color developed substance of xenthene dye>
$x51^-$ indicating an anion
| | |
|---|---|
| G-83 | 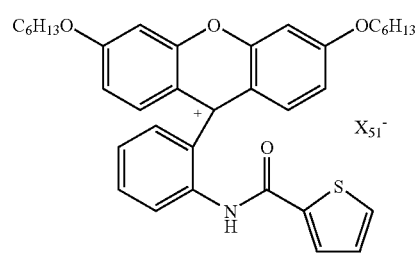 |
| G-84 | |
| G-85 | 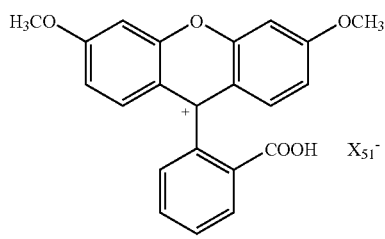 |

-continued

<color developed substance of triphenylmethane dye>

G-86
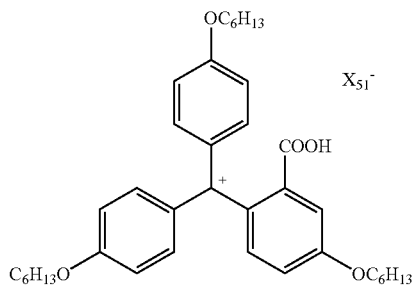

G-87
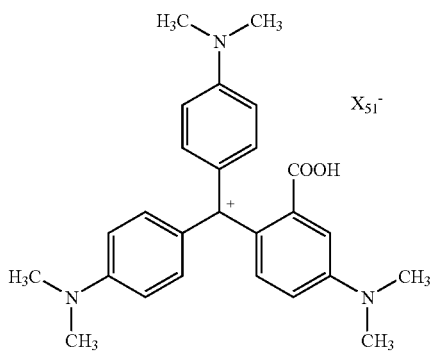

G-88
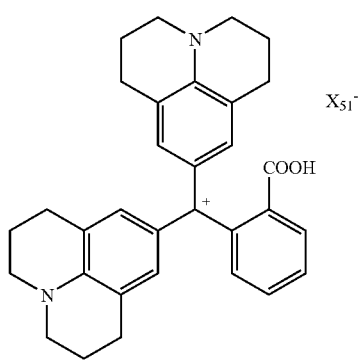

G-89
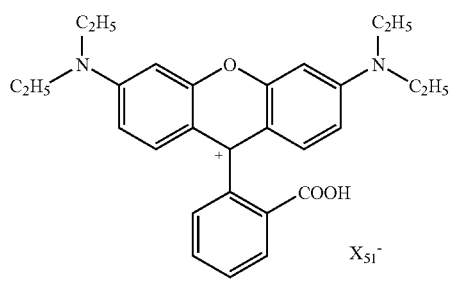

G-90
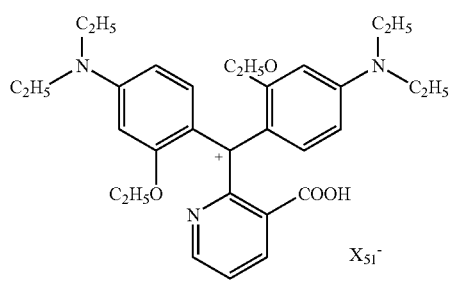

-continued

<acid-color developed substance of cyanine base>

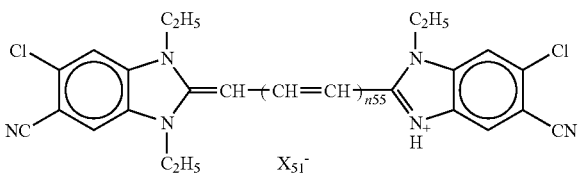

| | $n_{55}$ |
|---|---|
| G-91 | 0 |
| G-92 | 1 |
| G-93 | 2 |

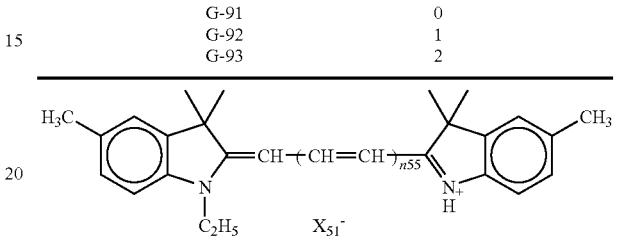

| | $n_{55}$ |
|---|---|
| G-94 | 0 |
| G-95 | 1 |
| G-96 | 2 |

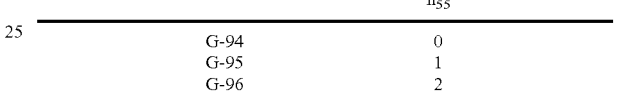

| | $n_{55}$ |
|---|---|
| G-97 | 0 |
| G-98 | 1 |
| G-99 | 2 |

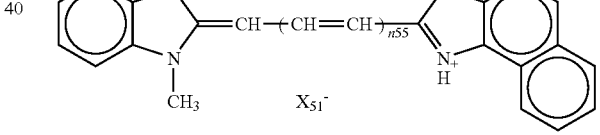

| | $n_{55}$ |
|---|---|
| G-100 | 0 |
| G-101 | 1 |
| G-102 | 2 |

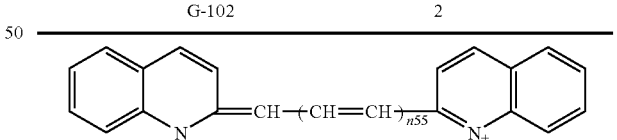

| | $n_{55}$ |
|---|---|
| G-103 | 0 |
| G-104 | 1 |
| G-105 | 2 |

Also as the decolorizable dye of the invention, there can also be employed following decolorizable dyes in which a bond is cleaved by an electron transfer from an excited state of the two-photon absorption dye generated by a two-photon absorption, thereby causing a decolorization.

Such decolorizable dye is originally a cyanine dye, which changes to a cyanine base (leucocyanine dye) by a bond cleavage by an electron transfer, thereby causing an erasure of an absorption or a shift to a shorter wavelength thereof.

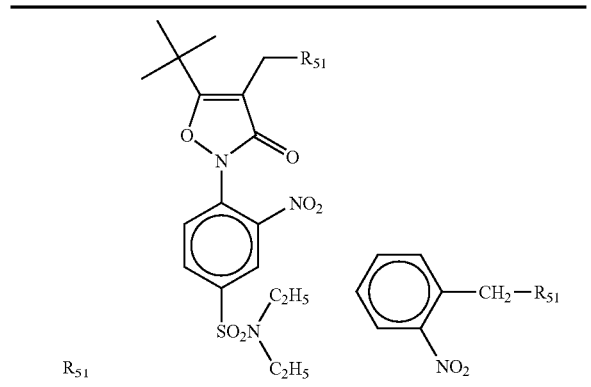

| | $R_{51}$ | |
|---|---|---|
| GD-1 | G-106 | G-118 |
| GD-2 | G-107 | G-119 |
| GD-3 | G-108 | G-120 |
| GD-4 | G-109 | G-121 |
| GD-5 | G-110 | G-122 |
| GD-6 | G-111 | G-123 |
| GD-7 | G-112 | G-124 |
| GD-8 | G-113 | G-125 |
| GD-9 | G-114 | G-126 |
| GD-10 | G-115 | G-127 |
| GD-11 | G-116 | G-128 |
| GD-12 | G-117 | G-129 |

$R_{51}$: substituted at a position marked with *

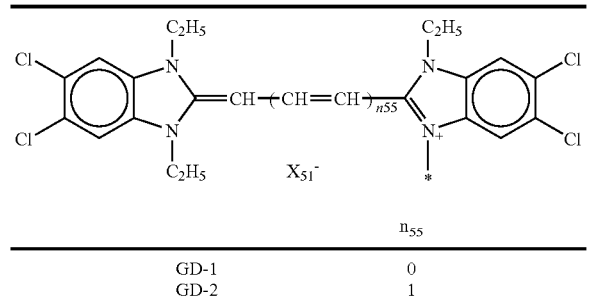

| | $n_{55}$ |
|---|---|
| GD-1 | 0 |
| GD-2 | 1 |
| GD-3 | 2 |

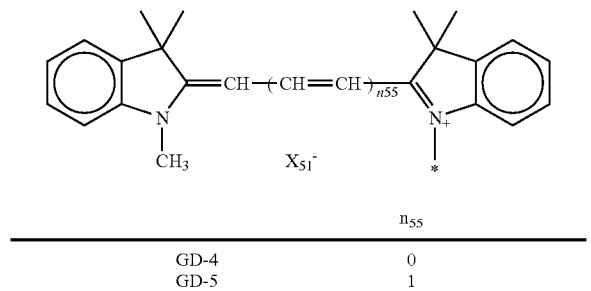

| | $n_{55}$ |
|---|---|
| GD-4 | 0 |
| GD-5 | 1 |
| GD-6 | 2 |

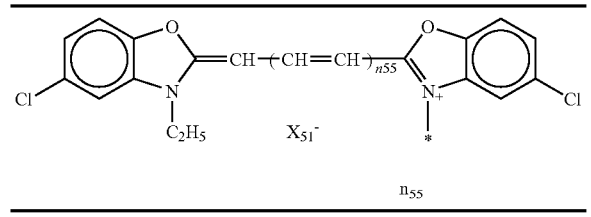

| | $n_{55}$ |
|---|---|
| GD-7 | 0 |
| GD-8 | 1 |
| GD-9 | 2 |

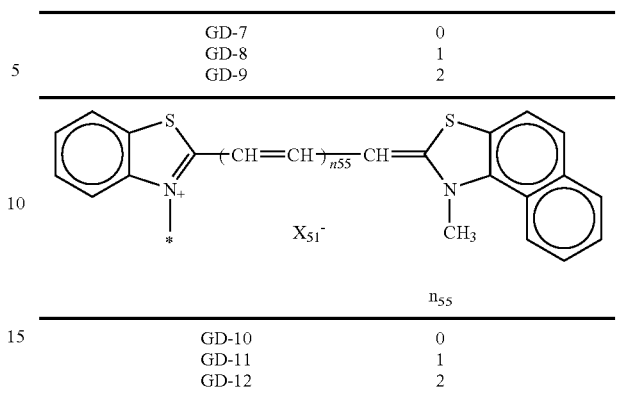

| | $n_{55}$ |
|---|---|
| GD-10 | 0 |
| GD-11 | 1 |
| GD-12 | 2 |

The decolorizable dye of the invention can be commercially available or can be synthesized by a known method.

In the following, a decolorizer precursor preferably employed in the present invention will be explained in detail.

In the invention, a decolorizer precursor more preferably executes an energy transfer or an electron transfer with an excited state of the two-photon absorption dye generated by a two-photon absorption to generate a decolorizer, which decolorizes the decolorizable dye.

The decolorizer is preferably a radical, an acid, a base, a nucleophilic agent, an electrophilic agent or singlet oxygen, and more preferably a radical, an acid, or a base. Also the decolorizer precursor is preferably a radical generator, an acid generator, a base generator, a nucleophilic agent generator, an electrophilic agent generator or a triplet oxygen, and more preferably a radical generator, an acid generator, or a base generator.

At first, as the decolorizer precursor, an acid generator and a radical generator will be explained. In the invention, the radical generator and the acid generator include a radical generator generating a radical only, an acid generator generating an acid without generating a radical, and a radical/acid generator generating both a radical and an acid.

As the acid generator, the radical generator and the radical/acid generator of the invention, there can be employed following 14 systems. Such acid generator, radical generator and radical/acid generator may be employed, if necessary, as a mixture of two or more kinds with an arbitrary ratio.

1) a ketone radical generator;
2) an organic peroxide radical generator;
3) a bisimidazole radical generator;
4) a trihalomethyl-substituted triazine radical/acid generator;
5) a diazonium salt radical/acid generator;
6) a diaryliodonium salt radical/acid generator;
7) a sulfonium salt radical/acid generator;
8) a borate salt radical generator;
9) a diaryliodonium-organic boron complex radical generator;
10) a sulfonium-organic boron complex radical generator;
11) a cationic two-photon absorption dye-organic boron complex radical generator;
12) an anionic two-photon absorption dye-onium salt complex radical generator;
13) a metal allene complex radical/acid generator; and
14) a sulfonate ester acid generator.

In the following, the aforementioned systems will be explained in more detail.

1) Ketone Radical Generator

The ketone radical generator can preferably be an aromatic ketone or an aromatic diketone.

Preferred examples include a benzophenone derivative (such as benzophenone, or Michler's ketone), a benzoin derivative (such as benzoin methyl ether, benzoin ethyl ether, α-methylbenzoin, α-allylbenzoin, or α-phenylbenzoin), an acetoin derivative (such as acetoin, pivaloin, 2-hydroxy-2-methylpropiophenone or 1-hydroxycyclohexyl phenyl ketone), an acyloin ether derivative (such as diethoxyacetophenone), an α-diketone derivative (diacetyl, benzyl, 4,4'-dimethoxybenzyl, benzyl dimethyl ketal, 2,3-bornanedione (camphor quinone), or 2,2,5,5-tetramethyltetrahydro-3,4-furanoic acid (imidazoletrione)), a xanthone derivative (such as xanthone), a thioxanthone derivative (such as thioxanthone or 2-chlorothioxanthone), and a ketocoumarin derivative.

Examples of commercial product include Irgacure 184, 651 and 907, manufactured by Ciba-Geigy Ltd. and represented by following formulas.

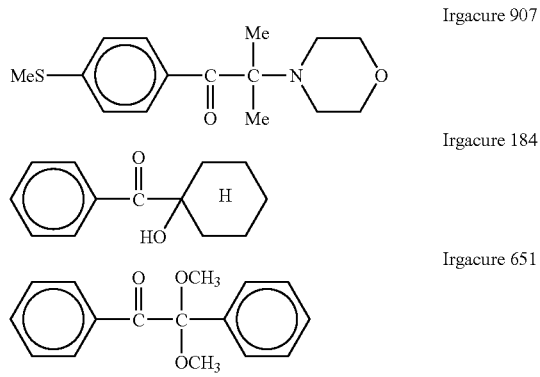

Preferred examples also include a quinone radical generator (such as 9,10-anthraquinone, 1-chloroanthraquinone, 2-chloroanthraquinone, 2-methylanthraquinone, 2-ethylanthraquinone, 2-t-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-dimethylanthraquinone, anthraquinone-α-sulfonic acid sodium salt, 3-chloro-2-methylanthraquinone, retene quinone, 7,8,9,10-tetrahydronaphthacenequinone, or 1,2,3,4-tetrahydrobenz(a)anthracene-7,12-dione).

2) Organic Peroxide Radical Generator

Preferred examples include benzoyl peroxide, di-t-butyl peroxide, and 3,3',4,4'-tetra(t-butylperoxycarbonyl) benzophenone described in JP-A Nos. 59-189340 and 60-76503.

3) Bisimidazole Radical Generator

A preferred bisimidazole radical generator is a bis(2,4,5-triphenyl)imidazole derivative, such as bis(2,4,5-triphenyl)imidazole, 2-(o-chlorophenyl)-4,5-bis(m-methoxyphenyl)-imidazole dimer (CDM-HABI), 1,1'-biimidazole, 2,2'-bis(o-chlorophenyl)-4,4',5,5'-tetraphenyl(o-CI-HABI), 1H-imidazole, or 2,5-bis(o-chlorophenyl)-4-[3,4-dimethoxyphenyl] dimer (TCTM-HABI).

The bisimidazole polymerization initiator is preferably employed together with a hydrogen donating substance. The hydrogen donating substance can preferably be 2-mercaptobenzoxazole, 2-mercaptobenzothiazole, or 4-methyl-4H-1,2,4-triazole-3-thiol.

4) Trihalomethyl-Substituted Triazine Radical/Acid Generator

The trihalomethyl-substituted triazine radical/acid generator is preferably represented by a general formula (11).

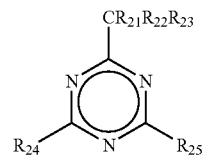

(11)

In the general formula (11), $R_{21}$, $R_{22}$ and $R_{23}$ each independently represents a halogen atom, preferably a chlorine atom; and $R_{24}$ and $R_{25}$ each independently represents a hydrogen atom, —$CR_{21}R_{22}R_{23}$, or a substituent.

Preferred examples of the substituent include an alkyl group (preferably with C number of 1-20, such as methyl, ethyl, n-propyl, isopropyl, n-butyl, n-pentyl, benzyl, 3-sulfopropyl, 4-sulfobutyl, carboxymethyl, or 5-carboxypentyl), an alkenyl group (preferably with C number of 2-20, such as vinyl, allyl, 2-butenyl or 3-butadienyl), a cycloalkyl group (preferably with C number of 3-20, such as cyclopentyl or cyclohexyl), an aryl group (preferably with C number of 6-20, such as phenyl, 2-chlorophenyl, 4-methoxyphenyl, 3-methylphenyl or 1-naphthyl), a heterocyclic group (preferably with C number of 1-20, such as pyridyl, thienyl, furyl, thiazolyl, imidazolyl, pyrazolyl, pyrrolidino, piperidino or morpholino), an alkinyl group (preferably with C number of 2-20, such as ethinyl, 2-propinyl, 1,3-butadienyl or 2-phenylethinyl), a halogen atom (such as F, Cl, Br or I), an amino group (preferably with C number of 0-20, such as amino, dimethylamino, diethylamino, dibutylamino or anilino), a cyano group, a nitro group, a hydroxyl group, a mercapto group, a carboxyl group, a sulfo group, a phosphonic acid group, an acyl group (preferably with C number of 1-20, such as acetyl, benzoyl, salicyloyl or pivaloyl), an alkoxy group (preferably with C number of 1-20, such as methoxy, butoxy or cyclohexyloxy), an aryloxy group (preferably with C number of 6-26, such as phenoxy or 1-naphthoxy), an alkylthio group (preferably with C number of 1-20, such as methylthio, or ethylthio), an arylthio group (preferably with C number of 6-20, such as phenylthio or 4-chlorophenylthio), an alkylsulfonyl group (preferably with C number of 1-20, such as methanesulfonyl or butanesulfonyl), an arylsulfonyl group (preferably with C number of 6-20, such as benzenesulfonyl or paratoluenesulfonyl), a sulfamoyl group (preferably with C number of 0-20, such as sulfamoyl, N-methylsulfamoyl or N-phenylsulfamoyl), a carbamoyl group (preferably with C number of 1-20, such as carbamoyl, N-methylcarbamoyl, N,N-dimethylcarbamoyl or N-phenylcarbamoyl), an acylamino group (preferably with C number of 1-20, such as acetyl amino or benzoylamino), an imino group (preferably with C number of 2-20, such as phthalimino), an acyloxy group (preferably with C number of 1-20, such as acetyloxy, or benzoyloxy), an alkoxycarbonyl group (preferably with C number of 2-20, such as methoxycarbonyl or phenoxycarbonyl), and a carbamoylamino group (preferably with C number of 1-20, such as carbamoylamino, N-methylcarbamoylamino or N-phenylcarbamoylamino), and more preferably an alkyl group, an aryl group, a heterocyclic group, a halogen atom, a cyano group, a carboxyl group, a sulfo group, an alkoxy group, a sulfamoyl group, a carbamoyl group and an alkoxycarbonyl group.

$R_{24}$ preferably represents —$CR_{21}R_{22}R_{23}$, more preferably a —$OCl_3$ group; $R_{25}$ preferably represents —$CR_{21}R_{22}R_{23}$, an alkyl group, an alkenyl group or an aryl group.

Specific examples of the trihalomethyl-substituted triazine acid generator include 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4'-methoxyphenyl)-4,6-bis(trichloromethyl)-1,3,5-triazine, 2-(4'-trifluoromethylphenyl)-4,6-bis(trichloromethyl)-1,3,5-triazine, 2,4-bis(trichloromethyl)-6-(p-methoxyphenylvinyl)-1,3,5-triazine, and 2-(4'-methoxy-1'-naphthyl)-4,6-bis(trichloromethyl)-1,3,5-triazine. Preferred examples also include compounds described in BP No. 1388492 and JP-A No. 53-133428.

5) Diazonium Salt Radical/Acid Generator

The diazonium salt radical/acid generator is preferably represented by a general formula (12).

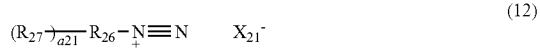

(12)

$R_{26}$ represents an aryl group or a heterocyclic group, preferably an aryl group and more preferably a phenyl group.

$R_{27}$ represents a substituent (of which preferred examples are same as those cited for $R_{24}$); a21 represents an integer from 0-5, preferably 0-2; and in case a21 represents an integer of 2 or larger, plural $R_{27}$s may be mutually same or different or may be mutually bonded to form a ring.

$X_{21}^-$ is an anion capable of forming an acid $HX_{21}$ with a pKa value (at 25° C. in water) of 4 or less, preferably 3 or less and more preferably 2 or less, and preferred examples include chloride, bromide, iodide, tetrafluoroborate, hexafluorophosphate, hexafluoroarsenate, hexafluoroantimonate, perchlorate, trifluoromethanesulfonate, 9,10-dimethoxyanthracene-2-sulfonate, methanesulfonate, benzenesulfonate, 4-trifluoromethylbenzenesulfonate, tosylate and tetra(pentafluorophenyl)borate.

Specific examples of the diazonium salt radical/acid generator include $X_{21}^-$ salts of benzene diazonium, 4-methoxydiazonium and 4-methyldiazonium.

6) Diaryl Iodonium Salt Radical/Acid Generator

The diaryl iodonium salt radical/acid generator is preferably represented by a general formula (13).

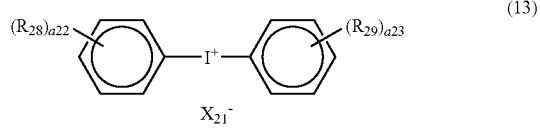

(13)

In the general formula (13), $X_{21}^-$ has the same meaning as in the general formula (12). $R_{28}$ and $R_{29}$ each independently represents a substituent (of which preferred examples are same as those for $R_{24}$), preferably an alkyl group, an alkoxy group, a halogen atom, a cyano group or a nitro group.

a22 and a23 each independently represents an integer of 0-5, preferably 0-1; in case a21 represents 2 or larger, plural $R_{28}$s or $R_{29}$s may be mutually same or different or may be mutually bonded to form a ring.

Specific examples of the diaryl iodonium salt radical/acid generator include include chloride, bromide, iodide, tetrafluoroborate, hexafluorophosphate, hexafluoroarsenate, hexafluoroantimonate, perchlorate, trifluoromethanesulfonate, 9,10-dimethoxyanthracene-2-sulfonate, methanesulfonate, benzenesulfonate, 4-trifluoromethylbenzenesulfonate, tosylate, tetra(pentafluorophenyl)borate, perfluorobutanesulfonate and pentafluorobenzenesulfonate of diphenyl iodonium, 4,4'-dichlorodiphenyl iodonium, 4,4'-dimethoxydiphenyl iodonium, 4,4'-dimethyldiphenyl iodonium, 4,4'-di-t-butyldiphenyl iodonium, 3,3'-dinitrodiphenyl iodonium, phenyl(p-methoxyphenyl) iodonium, phenyl(p-octyloxyphenyl) iodonium and bis(p-cyanophenyl) iodonium.

There can also be employed compounds described in Macromolecules, 10, p. 1307(1977), and diaryl iodonium salts described in JP-A Nos. 58-29803 and 1-287105 and in Japanese Patent Application No. 3-5569.

7) Sulfonium Salt Radical/Acid Generator

The sulfonium salt radical/acid generator is preferably represented by a general formula (14).

(14)

In the general formula (14), $X_{21}^-$ has the same meaning as in the general formula (12). $R_{30}$, $R_{31}$ and $R_{32}$ each independently represents an alkyl group, an aryl group or a heterocyclic group (of which preferred examples are same as those for $R_{24}$), preferably an alkyl group, a phenacyl group or an aryl group.

Specific examples of the sulfonium salt radical/acid generator include chloride, bromide, tetrafluoroborate, hexafluorophosphate, hexafluoroarsenate, hexafluoroantimonate, perchlorate, trifluoromethanesulfonate, 9,10-dimethoxyanthracene-2-sulfonate, methanesulfonate, benzenesulfonate, 4-trifluoromethylbenzenesulfonate, tosylate, tetra(pentafluorophenyl)borate, perfluorobutanesulfonate and pentafluorobenzenesulfonate of a sulfonium salt such as triphenyl sulfonium, diphenylphenacyl sulfonium, dimethylphenacyl sulfonium, benzyl-4-hydroxyphenylmethyl sulfonium, 4-t-butyltriphenyl sulfonium, tris(4-methylphenyl) sulfonium, tris(4-methoxyphenyl) sulfonium, 4-phenylthiotriphenyl sulfonium, and bis-1-(4-(diphenylsulfonium)phenyl)sulfide.

8) Borate Salt Radical Generator

The borate salt radical generator is preferably represented by a general formula (15).

(15)

In the general formula (15), $R_{33}$, $R_{34}$, $R_{35}$ and $R_{36}$ each independently represents an alkyl group, an alkenyl group, an alkinyl group, a cycloalkyl group or an aryl group (of which preferable examples are same as those for $R_{24}$), preferably an alkyl group or an aryl group, however all of $R_{33}$, $R_{34}$, $R_{35}$ and $R_{36}$ do not become aryl groups at the same time; and $X_{22}^+$ represents a cation.

More preferably $R_{33}$, $R_{34}$ and $R_{35}$ are aryl groups and $R_{36}$ is an alkyl group, and most preferably $R_{33}$, $R_{34}$ and $R_{35}$ are phenyl groups and $R_{36}$ is an n-butyl group.

Specific examples of the borate salt radical generator include tetrabutyl ammonium n-butyltriphenyl borate, and tetramethyl ammonium sec-butyltriphenyl borate.

9) Diaryl Iodonium-Organic Boron Complex Radial Generator

The diaryl iodonium-organic boron complex radical generator is preferably represented by a general formula (16).

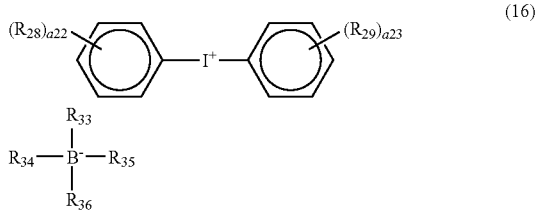

In the general formula (16), $R_{28}$, $R_{29}$, a22 and a23 have the same meanings as in the general formula (13), and $R_{33}$, $R_{34}$, $R_{35}$ and $R_{36}$ have the same meanings as in the general formula (15).

Specific examples of the diaryl iodonium-organic boron complex radical generator include I-1 to I-3 shown in the following.

I-1

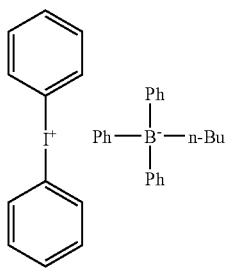

I-2

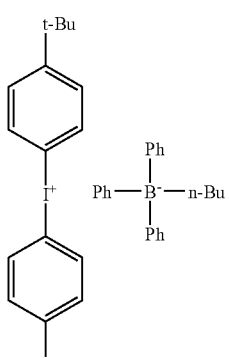

I-3

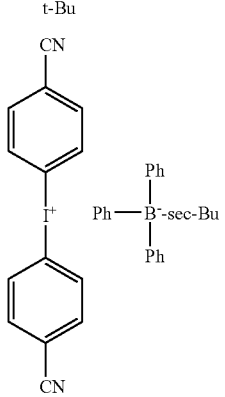

Preferred examples also include an iodonium-organic boron complex such as diphenyl iodonium (n-butyl)triphenyl borate described in JP-A No. 3-704.

10) Sulfonium-Organic Boron Complex Radical Generator

The sulfonium-organic boron complex radical generator is preferably represented by a general formula (17).

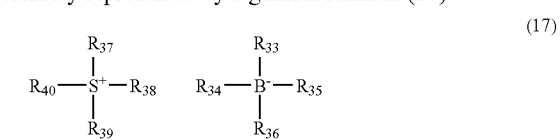

In the general formula (17), $R_{33}$, $R_{34}$, $R_{35}$ and $R_{36}$ have the same meanings as in the general formula (15).

$R_{37}$, $R_{38}$ and $R_{39}$ each independently represents an alkyl group, an aryl group, an alkenyl group, an alkinyl group, a cycloalkyl group, an alkoxy group, an aryloxy group, an alkylthio group, an arylthio group or an amino group (preferred example of the foregoing being same as those for $R_{24}$), more preferably an alkyl group, a phenacyl group, an aryl group or an alkenyl group. $R_{37}$, $R_{38}$ and $R_{39}$ may be mutually bonded to form a ring. $R_{40}$ represents an oxygen atom or an isolated electron pair.

Specific examples of the sulfonium-organic boron complex radical generator include I-4 to I-10 shown in the following.

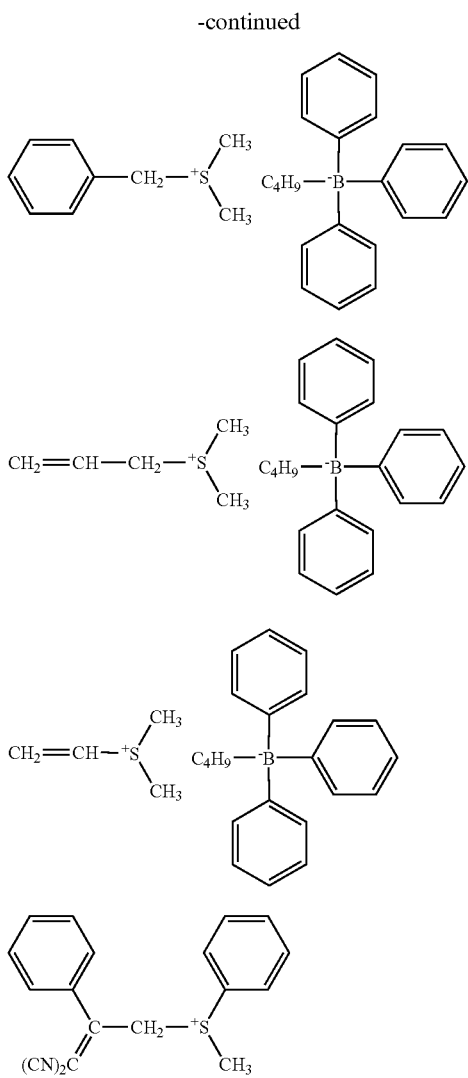

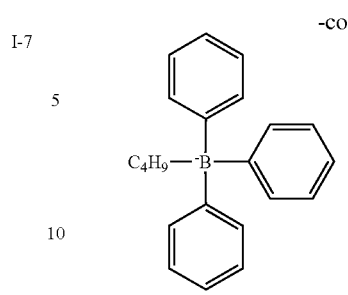

Preferred examples also include a sulfonium-organic boron complex described in JP-A Nos. 5-255347 and 5-213861.

11) Cationic Two-Photon Absorption Dye-Organic Boron Complex Radical Generator

In case the radical generator in the invention is a cationic two-photon absorption dye-organic boron complex radical generator, such cationic two-photon absorption dye may serve as the two-photon absorption dye of the invention.

The cationic two-photon absorption dye-organic boron complex radical generator is preferably represented by a general formula (18).

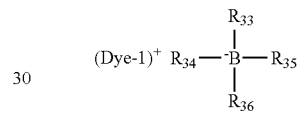

(18)

In the general formula (18), (Dye-1)$^+$ is a cationic two-photon absorption dye, of which preferred examples include cationic ones among the aforementioned two-photon absorption dyes. For example a cyanine dye or a merocyanine dye is preferable, and a cyanine dye is more preferable. $R_{33}$, $R_{34}$, $R_{35}$ and $R_{36}$ have same meanings as in the general formula (15).

Specific examples of the cationic two-photon absorption dye-organic boron complex radical generator include I-11, I-12, I-13 and I-14 shown in the following.

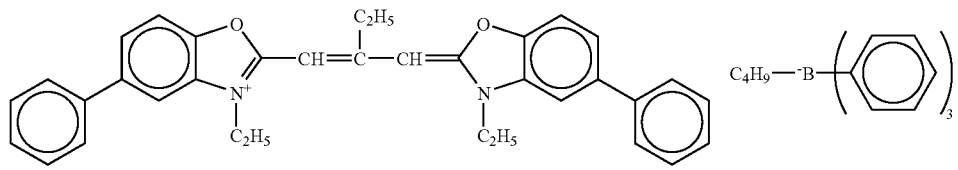

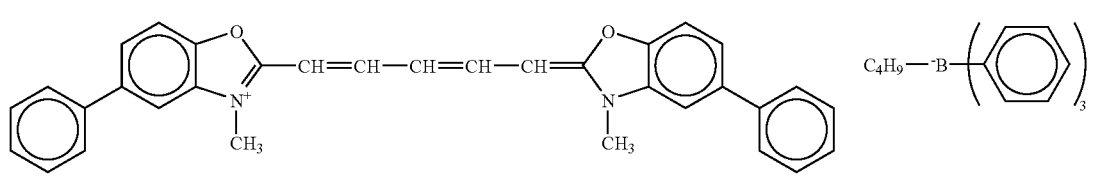

-continued

I-13

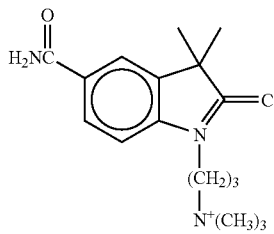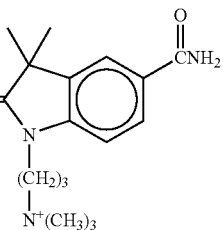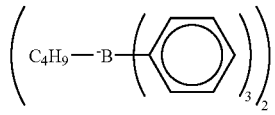

I-14

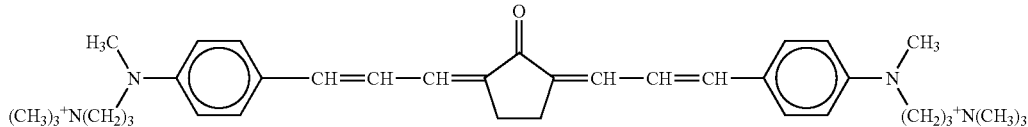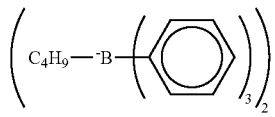

Examples also include cationic dye-borate anion complexes described in JP-A Nos. 62-143044 and 62-150242.

12) Anionic Two-Photon Absorption Dye-Onium Salt Complex Radical Generator

In case the radical generator in the invention is an anionic two-photon absorption dye-onium salt complex radical generator, such anionic two-photon absorption dye may serve as the two-photon absorption dye of the invention.

The anionic two-photon absorption dye-onium salt complex radical generator is preferably represented by a general formula (19).

$$(\text{Dye-2})^- X_{23}^+ \quad (19)$$

In the general formula (19), (Dye-2)⁻ is an anionic two-photon absorption dye, of which preferred examples include anionic ones among the aforementioned two-photon absorption dyes. For example a cyanine dye, a merocyanine dye or an oxonol dye is preferable, and a cyanine dye or an oxono dye is more preferable. $X_{23}^+$ represents a cation portion of the diazonium salt in the general formula (12), a cation portion of the diaryliodonium salt in the general formula (13), or a cation portion of the sulfonium salt in the general formula (14) (preferred examples being same as described before), preferably a cation portion of the diaryliodonium salt in the general formula (13), or a cation portion of the sulfonium salt in the general formula (14).

Specific examples of the anionic two-photon absorption dye-onium salt complex radical generator include I-15 to I-32 shown in the following.

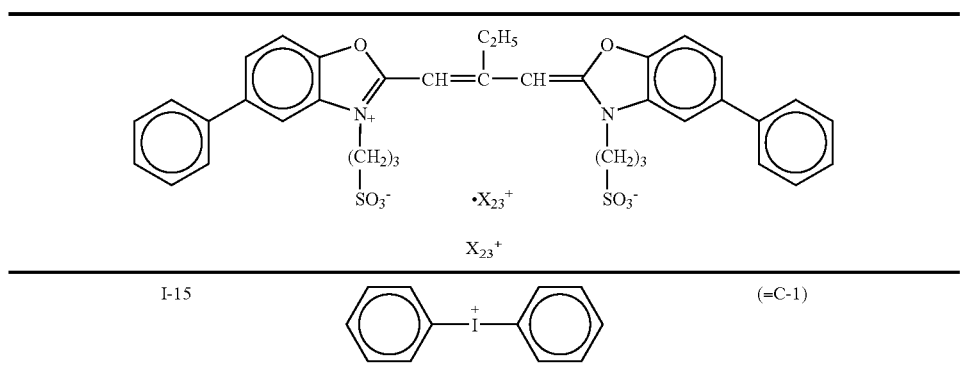

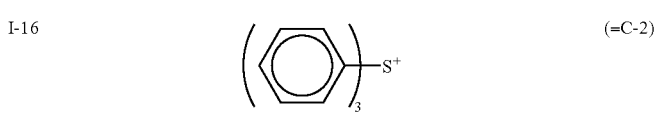

-continued
| I-17 | 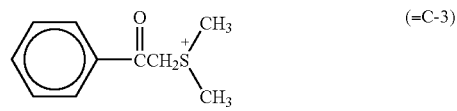 | (=C-3) |
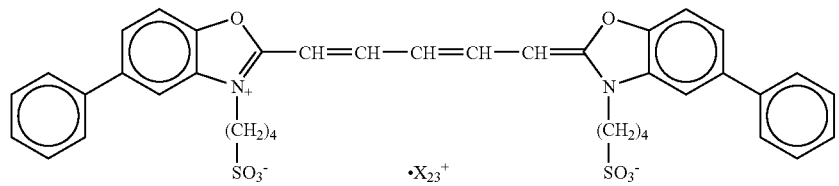
| | |
|---|---|
| I-18 | C-1 |
| I-19 | C-2 |
| I-20 | C-3 |
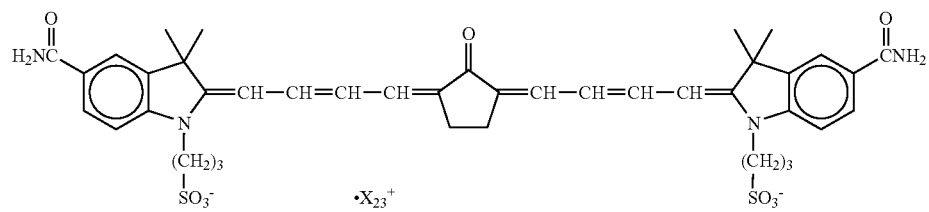
| | |
|---|---|
| I-21 | C-1 |
| I-22 | C-2 |
| I-23 | C-3 |
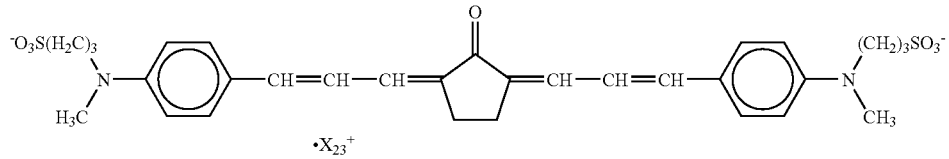
| | |
|---|---|
| I-24 | C-1 |
| I-25 | C-2 |
| I-26 | C-3 |
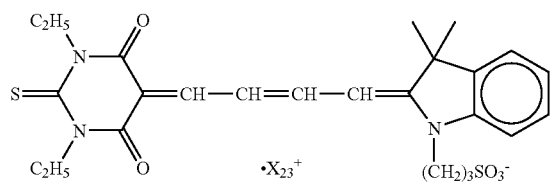
| | |
|---|---|
| I-27 | C-1 |
| I-28 | C-2 |
| I-29 | C-3 |

-continued

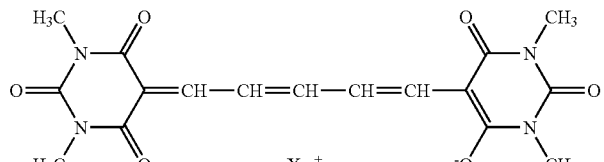

| I-30 | C-1 |
| I-31 | C-2 |
| I-22 | C-3 |

13) Metal Allene Complex Radical/Acid Generator

In the metal allene complex radical/acid generator, the metal is preferably iron or titanium.

Specific preferred examples include an iron allene complex described in JP-A No. 1-54440, EP Nos. 109851 and 126712, and J. Imag. Sci., vol. 30, p. 174(1986), an iron allene-organic boron complex described in Organometallics, vol. 8, 2737(1989), an iron allene complex salt described in Prog. Polym. Sci., vol. 21, p. 7-8 (1996), and a titanocene described in JP-A No. 61-151197.

14) Sulfonate Ester Acid Generator

The sulfonate ester polymerization initiator can preferably be a sulfonate ester, a sulfonate nitrobenzyl ester or an imide sulfonate.

Specific examples of preferred sulfonate ester include benzoin tosylate and pyrogallol trimesylate; those of preferred sulfonate nitrobenzyl ester include o-nitrobenzyl tosylate, 2,6-dinitrobenzyl tosylate, 2',6'-dinitrobenzyl-4-nitrobenzene sulfonate, p-nitrobenzyl-9,10-diethoxyanthracene-2-sulfonate and 2-nitrobenzyltrifluoromethyl sulfonate; and those of imide sulfonate include N-tosylphthalimide, 9-fluorenylidene aminotosylate and α-cyanobenzylidene tosylamine.

The radical or cationic generator in the invention can be classified into:
a) a radical generator which generates a radical only;
b) an acid generator which generates an acid only; and
c) a radical/acid generator which simultaneously generates a radical and an acid.

a) A radical generator generating a radical can be, among the aforementioned systems, those shown in the following:
1) a ketone radical generator;
2) an organic peroxide radical generator;
3) a bisimidazole radical generator;
4) a trihalomethyl-substituted triazine radical generator;
5) a diazonium salt radical generator;
6) a diaryliodonium salt radical generator;
7) a sulfonium salt radical generator;
8) a borate salt radical generator;
9) a diaryliodonium-organic boron complex radical generator;
10) a sulfonium-organic boron complex radical generator;
11) a cationic two-photon absorption dye-organic boron complex radical generator;
12) an anionic two-photon absorption dye-onium salt complex radical generator; and
13) a metal allene complex radical generator.

The radical generator for generating a radical is more preferably:
1) a ketone radical generator;
3) a bisimidazole radical generator;
4) a trihalomethyl-substituted triazine radical generator;
6) a diaryliodonium salt radical generator;
7) a sulfonium salt radical generator;
11) a cationic two-photon absorption dye-organic boron complex radical generator; or
12) an anionic two-photon absorption dye-onium salt complex radical generator, and further preferably:
3) a bisimidazole radical generator;
6) a diaryliodonium salt radical generator;
7) a sulfonium salt radical generator;
11) a cationic two-photon absorption dye-organic boron complex radical generator; or
12) an anionic two-photon absorption dye-onium salt complex radical generator.

An acid generator generating an acid can be, among the aforementioned systems, that shown in the following:
14) a sulfonate ester acid generator.

As the acid generator, there can also be employed those described for example in "UV Curing: Science and Technology", p. 23-76, S. Peter Pappas, A Technology Marketing Publication, and Comments Inorg. Chem., B. Klingert, M. Riediker and A. Roloff, vol. 7, No. 3, p. 109-138(1988).

A radical/acid generator which can simultaneously generate a radical and an acid can be, among the aforementioned systems, those shown in the following:
4) a trihalomethyl-substituted triazine radical/acid generator;
5) a diazonium salt radical/acid generator;
6) a diaryliodonium salt radical/acid generator;
7) a sulfonium salt radical/acid generator;
13) a metal allene complex radical/acid generator.

The radical/acid generator capable of generating a radical and an acid simultaneously is preferably:
6) a diaryliodonium salt radical/acid generator; or
7) a sulfonium salt radical/acid generator.

In case the decolorizer precursor in the two-photon absorption decolorizable material of the invention is an acid generator, the two-photon absorption decolorizable material of the invention may contain an acid amplifier. Preferred examples of the acid amplifier can be those described in Japanese Patent Application No. 2003-182849.

In the following there will be explained a base generator in the invention. The base generator means a compound which generates a base by an energy transfer or an electron transfer from an excited state of the two-photon absorption dye. The base generator is preferably stable in a dark place. The base generator in the present invention is preferably a compound capable of generating a base by an electron transfer from an excited state of the two-photon absorption dye.

The base generator of the invention preferably generates a Bronsted base by a light, more preferably generates an organic base, and particularly preferably generates an amine as an organic base.

The base generating agent in the present invention is preferably represented by general formulas (21-1)-(21-4). Such base generator may be employed, if necessary, as a mixture of two or more kinds of an arbitrary mixing ratio.

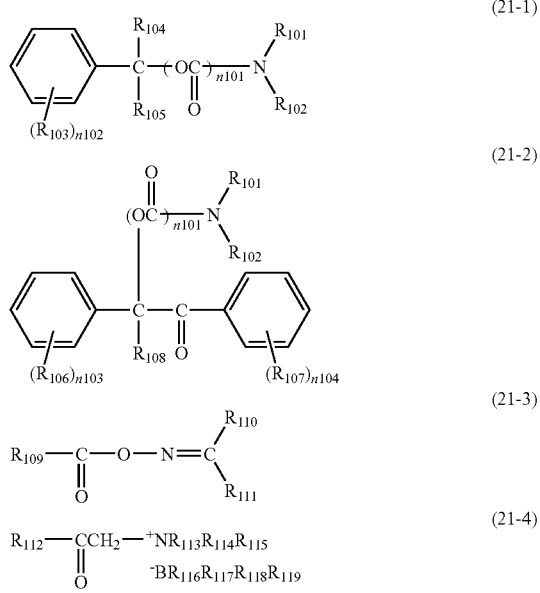

In the general formula (21-1) or (21-4), $R_{101}$ and $R_{102}$ each independently represents a hydrogen atom, an alkyl group (preferably with 1-20 carbon atoms (hereinafter represented as C number), such as methyl, ethyl, n-propyl, isopropyl, n-butyl, n-pentyl, n-octadecyl, benzyl, 3-sulfopropyl, 4-sulfobutyl, carboxymethyl or 5-carboxypentyl), an alkenyl group (preferably with C number of 2-20, such as vinyl, allyl, 2-butenyl or 1,3-butadienyl), a cycloalkyl group (preferably with C number of 3-20, such as cyclopentyl or cyclohexyl), an aryl group (preferably with C number of 6-20, such as phenyl, 2-chlorophenyl, 4-methoxyphenyl, 3-methylphenyl, 1-naphthyl or 2-naphthyl), or a heterocyclic group (preferably with C number of 1-20, such as pyridyl, thienyl, furyl, thiazolyl, imidazolyl, pyrazolyl, pyrrolidino, piperidino or morpholino), more preferably a hydrogen atom, an alkyl group, or a cycloalkyl group, and further preferably a hydrogen atom, a methyl group, an ethyl group, a cyclohexyl group or a cyclopentyl group.

$R_{101}$ and $R_{102}$ may be mutually bonded to form a ring, and a formed heterocycle is preferably a piperidine ring, a pyrrolidine ring, a piperazine ring, a morpholine ring, a pyridine ring, a quinoline ring, or an imidazole ring, more preferably a piperidine ring, a pyrrolidine ring, or an imidazole ring, and most preferably a piperidine ring.

A more preferred combination of $R_{101}$ and $R_{102}$ includes a case where $R_{101}$ is a cyclohexyl group that may be substituted and $R_{102}$ is a hydrogen atom; a case where $R_{101}$ is an alkyl group that may be substituted and $R_{102}$ is a hydrogen atom; and a case where $R_{101}$ and $R_{102}$ are bonded to form a piperidine ring or an imidazole ring.

In the general formula (21-1) or (21-2), n101 represents 0 or 1, preferably 1.

In the general formula (21-1), $R_{103}$ represents a substituent, and preferred examples of the substituent include an alkyl group (preferably with C number of 1-20, such as methyl, ethyl, n-propyl, isopropyl, n-butyl, n-pentyl, benzyl, 3-sulfopropyl, 4-sulfobutyl, carboxymethyl, or 5-carboxypentyl), an alkenyl group (preferably with C number of 2-20, such as vinyl, allyl, 2-butenyl or 3-butadienyl), a cycloalkyl group (preferably with C number of 3-20, such as cyclopentyl or cyclohexyl), an aryl group (preferably with C number of 6-20, such as phenyl, 2-chlorophenyl, 4-methoxyphenyl, 3-methylphenyl or 1-naphthyl), a heterocyclic group (preferably with C number of 1-20, such as pyridyl, thienyl, furyl, thiazolyl, imidazolyl, pyrazolyl, pyrrolidino, piperidino or morpholino), an alkinyl group (preferably with C number of 2-20, such as ethinyl, 2-propinyl, 1,3-butadiinyl or 2-phenylethinyl), a halogen atom (such as F, Cl, Br or I), an amino group (preferably with C number of 0-20, such as amino, dimethylamino, diethylamino, dibutylamino or anilino), a cyano group, a nitro group, a hydroxyl group, a mercapto group, a carboxyl group, a sulfo group, a phosphonic acid group, an acyl group (preferably with C number of 1-20, such as acetyl, benzoyl, salicyloyl or pivaloyl), an alkoxy group (preferably with C number of 1-20, such as methoxy, butoxy or cyclohexyloxy), an aryloxy group (preferably with C number of 6-26, such as phenoxy or 1-naphthoxy), an alkylthio group (preferably with C number of 1-20, such as methylthio, or ethylthio), an arylthio group (preferably with C number of 6-20, such as phenylthio or 4-chlorophenylthio), an alkylsulfonyl group (preferably with C number of 1-20, such as methanesulfonyl or butanesulfonyl), an arylsulfonyl group (preferably with C number of 6-20, such as benzenesulfonyl or paratoluenesulfonyl), a sulfamoyl group (preferably with C number of 0-20, such as sulfamoyl, N-methylsulfamoyl or N-phenylsulfamoyl), a carbamoyl group (preferably with C number of 1-20, such as carbamoyl, N-methylcarbamoyl, N,N-dimethylcarbamoyl or N-phenylcarbamoyl), an acylamino group (preferably with C number of 1-20, such as acetylamino or benzoylamino), an imino group (preferably with C number of 2-20, such as phthalimino), an acyloxy group (preferably with C number of 1-20, such as acetyloxy, or benzoyloxy), an alkoxycarbonyl group (preferably with C number of 2-20, such as methoxycarbonyl or phenoxycarbonyl), and a carbamoylamino group (preferably with C number of 1-20, such as carbamoylamino, N-methylcarbamoylamino or N-phenylcarbamoylamino), and more preferably an alkyl group, an aryl group, a heterocyclic group, a halogen atom, an amino group, a cyano group, a nitro group, a carboxyl group, a sulfo group, an alkoxy group, an alkylthio group, an arylsulfonyl group, a sulfamoyl group, a carbamoyl group and an alkoxycarbonyl group.

In the general formula (21-1), $R_{103}$ is preferably a nitro group or an alkoxy group, more preferably a nitro group or a methoxy group, and most preferably a nitro group.

In the general formula (21-1), n102 represents an integer of 0-5, preferably 0-3, and more preferably 1 or 2. In case n102 is 2 or larger, the plural $R_{103}$s may be mutually same or different, or may be bonded to form a ring, and a ring to be formed is preferably a benzene ring or a naphthalene ring.

In case $R_{103}$ represents a nitro group in the general formula (21-1), it is preferably substituted in 2-position or 2,6-positions, and, in case $R_{103}$ represents an alkoxy group, it is preferably substituted in 3,5-positions.

In the general formula (21-1), $R_{104}$ and $R_{105}$ each independently represents a hydrogen atom or a substituent (preferred examples being same as those for $R_{103}$), preferably represents a hydrogen atom, an alkyl group, or an aryl group, more preferably a hydrogen atom, a methyl group or a 2-nitrophenyl group.

A more preferred combination of $R_{104}$ and $R_{105}$ includes a case where $R_{104}$ and $R_{105}$ are both hydrogen atoms, a case where $R_{104}$ is a methyl group and $R_{105}$ is a hydrogen atom, a case where $R_{104}$ and $R_{105}$ are both methyl groups, and a case where $R_{104}$ is a 2-nitrophenyl group and $R_{105}$ is a hydrogen atom, and more preferably a case where $R_{104}$ and $R_{105}$ are both hydrogen atoms.

In the general formula (21-2), $R_{106}$ and $R_{107}$ each represents a substituent (preferred examples being same as those for $R_{103}$), preferably represents an alkoxy group, an alkylthio group, a nitro group or an alkyl group, and more preferably a methoxy group.

In the general formula (21-2), n103 and n104 each independently represents an integer of 0-5, preferably 0-2. In case n103 or n104 is 2 or larger, the plural $R_{106}$s or $R_{107}$s may be mutually same or different, or may be bonded to form a ring, and a ring to be formed is preferably a benzene ring or a naphthalene ring.

In the general formula (21-2), $R_{106}$ is more preferably alkoxy groups substituted in 3,5-positions and further preferably methoxy groups substituted in 3,5-positions.

In the general formula (21-2), $R_{108}$ represents a hydrogen atom or a substituent (preferred examples being same as those for $R_{103}$), preferably a hydrogen atom or an aryl group, and more preferably a hydrogen atom.

In the general formula (21-3), $R_{109}$ represents a substituent (preferred examples being same as those for $R_{103}$), preferably an alkyl group, an aryl group, a benzyl group, or an amino group, and more preferably an alkyl group that may be substituted, a t-butyl group, a phenyl group, a benzyl group, an anilino group that may be substituted, or a cyclohexylamino group.

A compound represented by the general formula (21-3) may be a compound connected to a polymer chain at $R_{109}$.

In the general formula (21-3), $R_{110}$ and $R_{111}$ each independently represents a hydrogen atom or a substituent (preferred examples being same as those for $R_{103}$), preferably an alkyl group or an aryl group, and more preferably a methyl group, a phenyl group or a 2-naphthyl group.

$R_{110}$ and $R_{111}$ may be mutually bonded to form a ring, and a preferred ring to be formed is for example a fluorene ring.

In the general formula (21-4), $R_{112}$ represents an aryl group or a heterocyclic group, and more preferably an aryl group or a heterocyclic group shown in the following.

$R_{112}$: 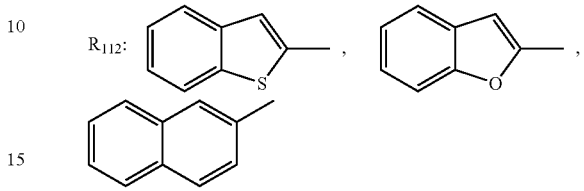

In the general formula (21-4), $R_{113}$, $R_{114}$ and $R_{115}$ each independently represents a hydrogen atom, an alkyl group, an alkenyl group, a cycloalkyl group, an aryl group or a heterocyclic group (preferred examples of the foregoing being same as those for $R_{101}$ and $R_{102}$), preferably represents an alkyl group, and more preferably a butyl group. $R_{113}$, $R_{114}$ and $R_{115}$ may be mutually bonded to form a ring, and a heterocycle to be formed is preferably a piperidine ring, a pyrrolidine ring, a piperazine ring, a morpholine ring, a pyridine ring, a quinoline ring, or an imidazole ring, and more preferably a piperidine ring, a pyrrolidine ring, or an imidazole ring.

In the general formula (21-4), $R_{116}$, $R_{117}$, $R_{118}$ and $R_{119}$ each independently represents an alkyl group or an aryl group, and it is preferable that $R_{116}$, $R_{117}$ and $R_{118}$ are phenyl groups and $R_{119}$ is an n-butyl group or a phenyl group.

The base generator of the invention is preferably represented by the general formula (21-1) or (21-3), more preferably by the general formula (21-1).

In the following, preferred specific examples of the base generator in the invention will be shown, but the present invention is not limited to such examples.

PB-1

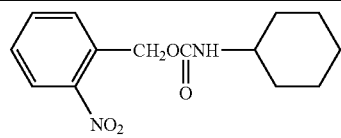

PB-2

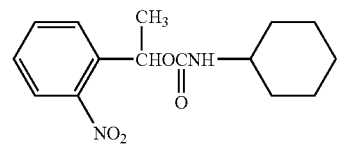

PB-3

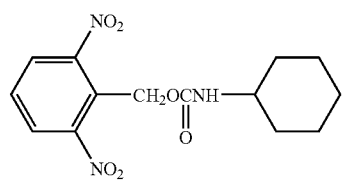

-continued
PB-4 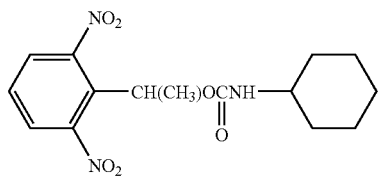
PB-5 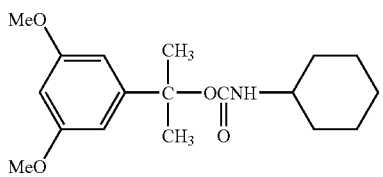
PB-6 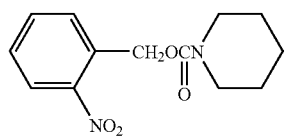
PB-7 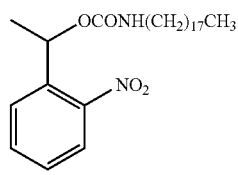
PB-8 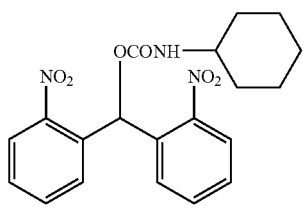
PB-9 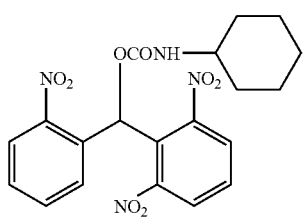
PB-10 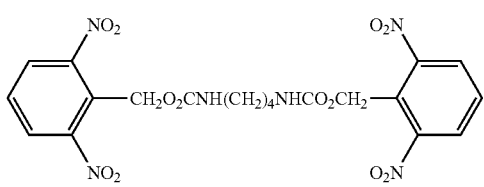
PB-11 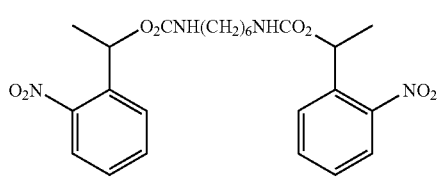

-continued
PB-12 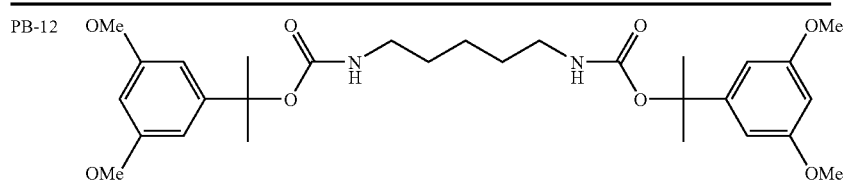
PB-13 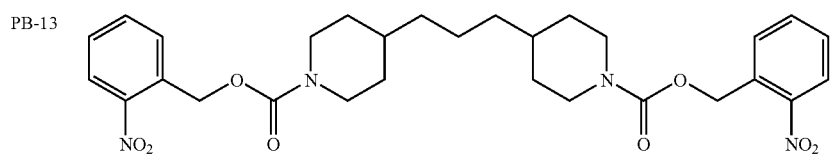
PB-14 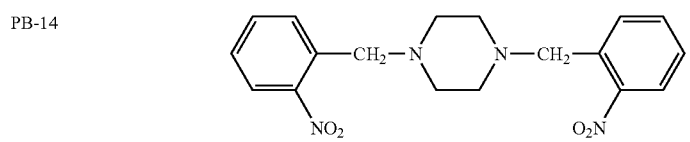
PB-15 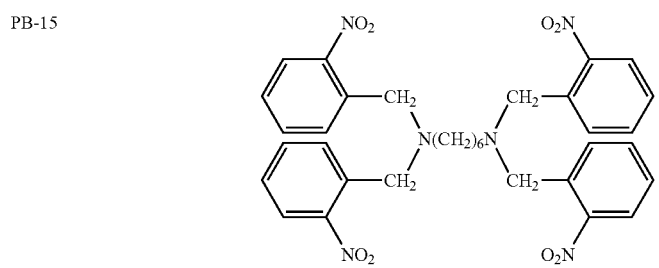
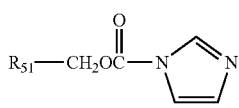
| | R$_{51}$ |
|---|---|
| PB-16 | 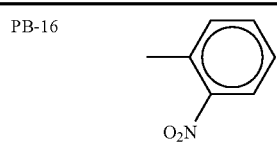 |
| PB-17 | 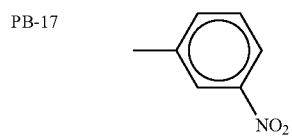 |
| PB-18 |  |
| PB-19 | 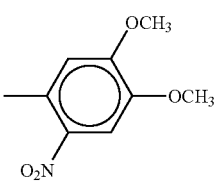 |
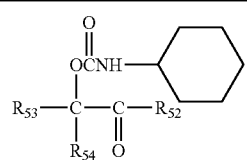
| | R$_{52}$ | R$_{53}$ | R$_{54}$ |
|---|---|---|---|
| PB-20 | 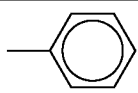 | 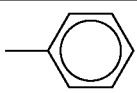 | —H |

-continued
| | | | |
|---|---|---|---|
| PB-21 | 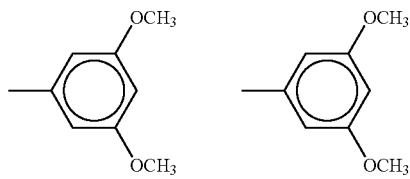 | 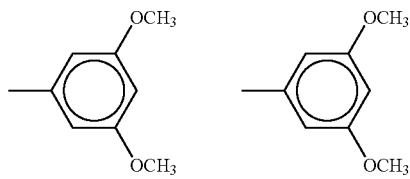 | " |
| PB-22 | 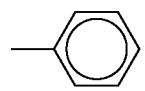 | " | " |
| PB-23 | 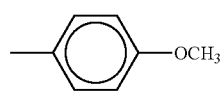 | " | " |
| PB-24 | 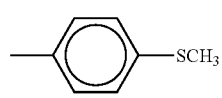 | " | " |
| PB-25 | 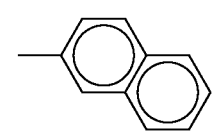 | " | " |
| PB-26 | 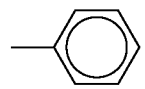 | " | 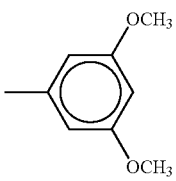 |
PB-27 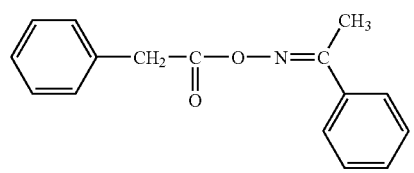
PB-28 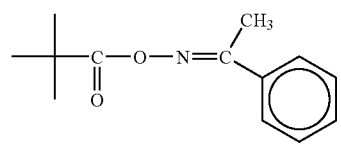
PB-29 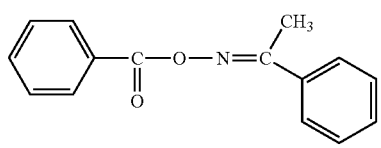
PB-30 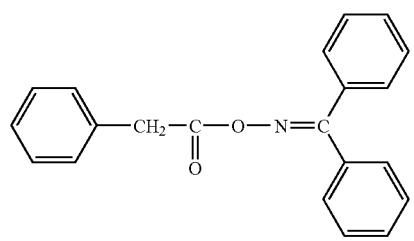

-continued
PB-31 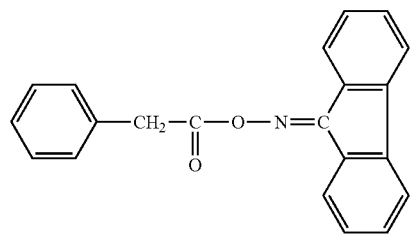
PB-32 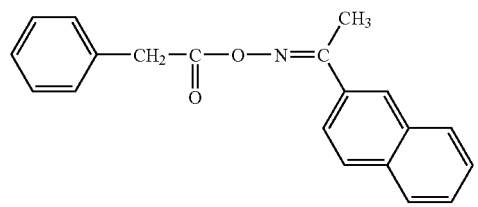
PB-33 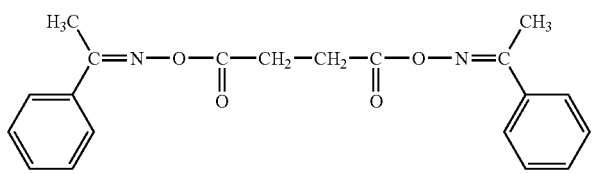
PB-34 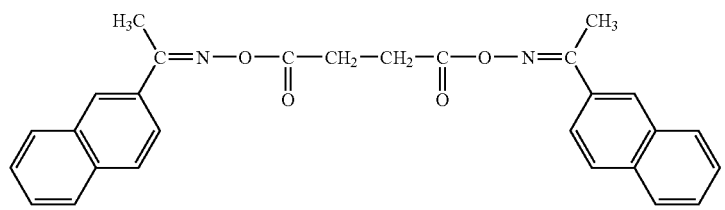
PB-35 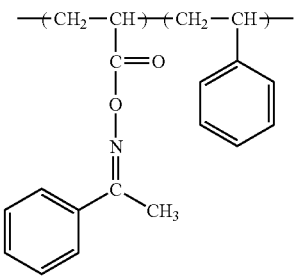
PB-36 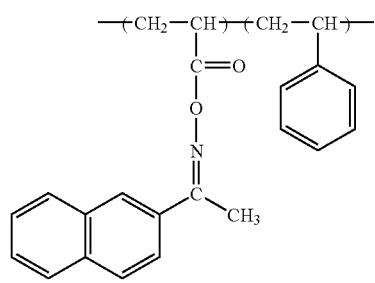

-continued
| | |
|---|---|
| PB-37 | 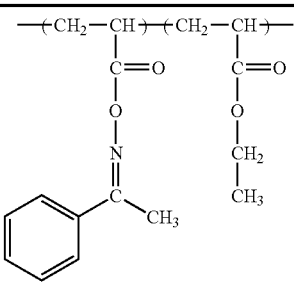 |
| PB-38 | 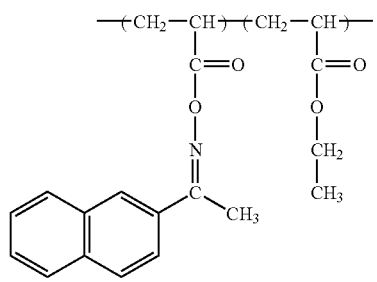 |
| PB-39 | 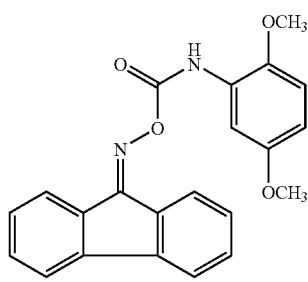 |
| | 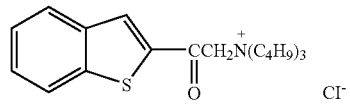 |
| PB-40 | 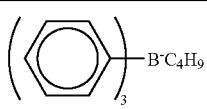 |
| PB-41 | 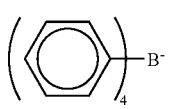 |
| PB-42 | $^-BF_4$ |
| | 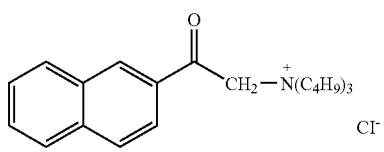 |
| PB-43 | 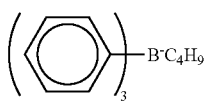 |

-continued
| | |
|---|---|
| PB-44 | 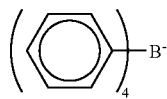 |
| | 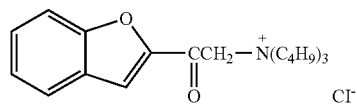 |
| PB-45 | 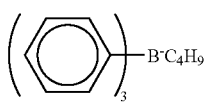 |
| PB-46 | 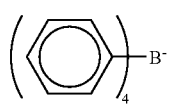 |
| | 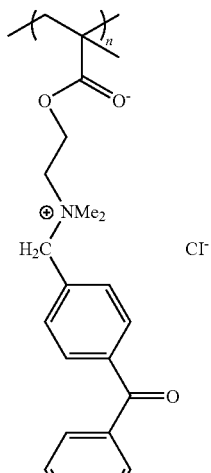 |
| PB-47 | 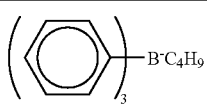 |
| PB-48 | 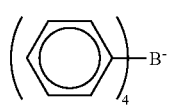 |
| | 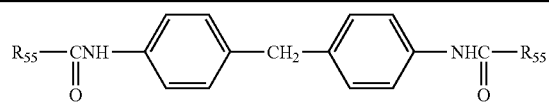 |
| | $R_{55}$ |
| PB-49 | —H |
| PB-50 | —CH$_3$ |
| PB-51 | 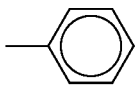 |

| | -continued |
|---|---|
| PB-52 | [Co(III)(NH₃)₅Br](ClO₄)₂ |
| PB-53 | 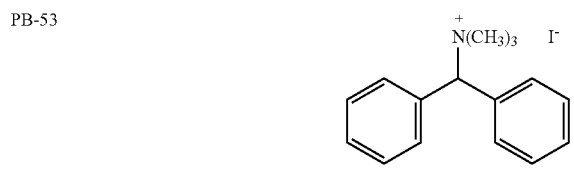 |
| PB-54 | 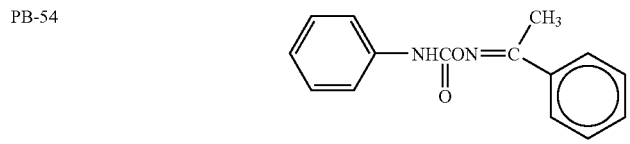 |
| PB-55 | 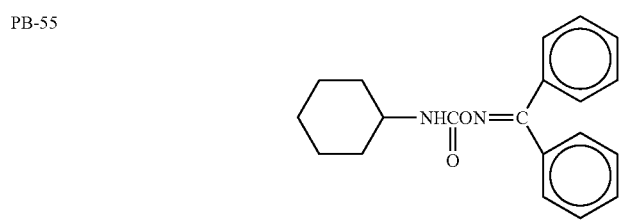 |

Such photobase generator may be employed singly or, if necessary, in a combination of two or more kinds with an arbitrary ratio.

In case the decolorizer precursor in the two-photon absorption decolorizable material of the invention is a base generator, the two-photon absorption decolorizable material of the invention may contain a base amplifier. Preferred examples of the base amplifier can be those described in Japanese Patent Application No. 2003-178083.

In the following there will be explained a nucleophilic agent generator in the invention. The nucleophilic agent generator means a compound which generates a nucleophilic agent by an energy transfer or an electron transfer from the two-photon absorption dye, induced by a two-photon absorption. The nucleophilic agent generator is preferably stable in a dark place. The nucleophilic agent generator in the present invention is preferably a compound capable of generating a nucleophilic agent by an electron transfer from an excited state of the two-photon absorption dye.

A nucleophilic agent to be generated can preferably be a C anion, an O anion, an S anion, a nitrogen, or a halogen atom (chlorine, bromine or iodine).

Specific preferred examples of the nucleophilic agent generator in the invention are shown in the following, but the present invention is not limited to such examples.

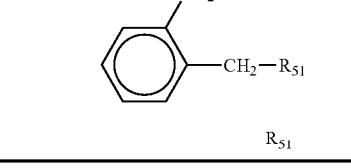

| | R₅₁ |
|---|---|
| N-1 | —SCH₂COOC₂H₅ |
| N-2 | 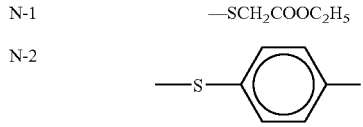 |

| | -continued |
|---|---|
| N-3 |  |
| N-4 | —OC₄H₉ |
| N-5 | —I |
| N-6 |  |
| N-7 |  |
| N-8 |  |
| N-9 |  |

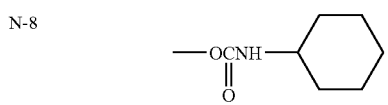

| | R₅₁ |
|---|---|
| N-10 | —SCH₂COOC₄H₉ |

-continued

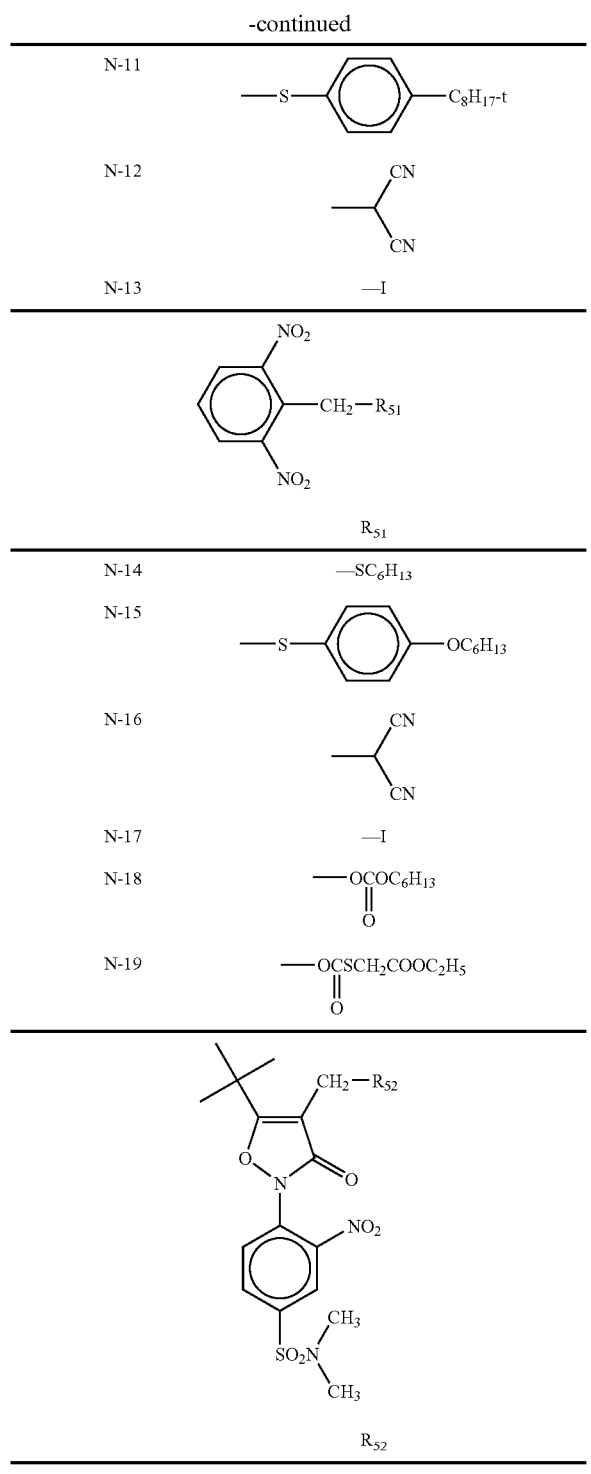

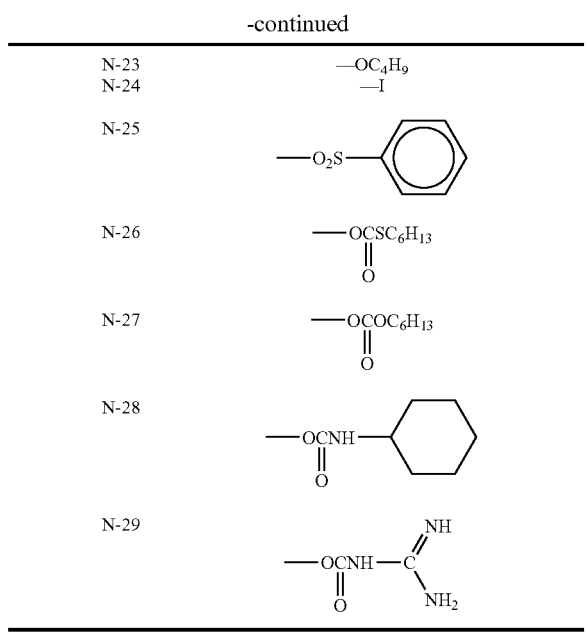

In the following there will be explained an electrophilic agent generator in the invention. The electrophilic agent generator means a compound which generates an electrophilic agent by an energy transfer or an electron transfer from an excited state of the two-photon absorption dye, induced by a two-photon absorption. The electrophilic agent generator is preferably stable in a dark place. The electrophilic agent generator in the present invention is preferably a compound capable of generating an electrophilic agent by an electron transfer from an excited state of the two-photon absorption dye. An electrophilic agent to be generated can preferably be an alkyl cation or an aryl cation.

Preferred examples of the electrophilic agent generator in the invention include a diaryliodonium salt, a sulfonium salt and a diazonium salt, described before as an acid generator, capable of generating a phenyl cation and the like.

In the present invention, there can also be advantageously employed a two-photon absorption polymerization method including a first step in which a two-photon absorption dye executes a two-photon absorption to generate an excited state, and, utilizing an excitation energy thereof, decolorizes a decolorizable dye having a molar absorption coefficient equal to or less than 100 at a wavelength of a light irradiated at the two-photon absorption, thereby forming a latent image by a residual decolorizable dye that is not decolorized, and a second step of irradiating the latent image of the residual decolorizable dye with a light thereby inducing a polymerization based on a linear absorption of the residual decolorizable dye. Such method is preferable in an application to a three-dimensional optical recording material, because of a high-speed recording ability and an excellent storability after the recording.

The decolorizable dye has a molar absorption coefficient of 100 or less at a wavelength of a light irradiated at the two-photon absorption, more preferably 10 or less, further preferably 5 or less, and most preferably does not have an absorption at the wavelength of the light irradiated at the two-photon absorption.

A "latent image" indicates an image formed by "a difference in refractive index preferably ½ or less of a difference in the refractive index formed after the second step" (namely an amplification of 2 times of more being preferably executed in the second step), more preferably ⅕ or less, further preferably ⅒ or less and most preferably ¹⁄₃₀ or less (namely an amplification more preferably of 5 times or more, further preferably 10 times or more and most preferably 30 times or more being executed in the second step).

In the invention, there is also preferred a two-photon absorption polymerization method including a first step in which the two-photon absorption dye executes a two-photon absorption to generate an excited state, and executes an energy transfer or an electron transfer with the decolorizer precursor to generate therefrom a decolorizer, which decolorizes the decolorizable dye, thereby forming a latent image by a residual decolorizable dye that is not decolorized, and a second step of irradiating the latent image of the residual decolorizable dye with a light to generate an excited state based on a linear absorption of the residual decolorizable dye, and activating a polymerization initiator by an energy transfer or an electron transfer thereby inducing a polymerization.

In such method, a light irradiated for causing a two-photon absorption in the first step is preferably of a longer wavelength than a linear absorption of the two-photon absorption dye and a linear absorption of the decolorizable dye.

The second step is preferably executed by a light irradiation and/or a heat application, more preferably by a light irradiation, and the irradiating light is preferably a flush exposure (so-called solid exposure, blanket exposure or non-imagewise exposure).

A light source to be employed can be a visible light laser, an ultraviolet light laser, an infrared light laser, a carbon arc lamp, a high-pressure mercury lamp, a xenon lamp, a metal halide lamp, a fluorescent lamp, a tungsten lamp, an LED or an organic EL. For irradiating a light of a specified wavelength region, a sharp-cut filter, a band-pass filter or a diffraction grating can be advantageously employed if necessary.

The light irradiated in the second step preferably has a shorter wavelength than that of the light irradiated at the two-photon absorption. Also the light irradiated in the second step is preferably of a wavelength within a region where the two-photon absorption dye has a molar absorption coefficient of 1,000 or less, preferably 100 or less and more preferably where the two-photon absorption dye does not have an absorption.

Also the light irradiated in the second step preferably has a wavelength within a region where the decolorizable dye has a molar absorption coefficient of 5,000 or more, and the decolorizable dye preferably has $\lambda_{max}$ of a linear absorption within a region from a wavelength of the light irradiated at the two-photon absorption to a wavelength shorter by 300 nm.

In the two-photon absorption polymerization method of the invention, it is preferable, in consideration of a storability and a non-destructive readout, to decompose and fix the two-photon absorption dye in any one of the first step, the second step and a subsequent fixing step by a light irradiation and/or a heat application, and more preferable to decompose and fix the two-photon absorption dye in any one of the first step, the second step and a subsequent fixing step by a light irradiation and/or a heat application and to decompose and fix the residual decolorizable dye in the second step or a subsequent fixing step by a light irradiation and/or a wheat application.

In the invention, for executing the two-photon absorption polymerization method, without employing a decolorizer precursor, there is preferred a group of compounds including at least:

1) a two-photon absorption dye capable of executing a two-photon absorption to generate an excited state in the first step;

2) a decolorizable dye having a molar absorption coefficient equal to or less than 100 at a wavelength of a light irradiated at the two-photon absorption, that can be decolorized as a result of an electron transfer or an energy transfer directly from the excited state of the two-photon absorption dye in the first step;

3) a polymerization initiator capable of initiating a polymerization of a polymerizable compound by an electron transfer or an energy transfer from an excited state of the residual decolorizable dye in the second step;

4) a polymerizable compound; and 5) a binder.

Also in the invention, for executing the two-photon absorption polymerization method, employing a decolorizer precursor, there is preferred a group of compounds including at least:

1) a two-photon absorption dye capable of executing a two-photon absorption to generate an excited state in the first step;

2) a decolorizable dye having a molar absorption coefficient equal to or less than 100 at a wavelength of a light irradiated at the two-photon absorption, that can be decolorized as a result of an electron transfer or an energy transfer from the excited state of the two-photon absorption dye to a decolorizer precursor in the first step;

3) a decolorizer precursor capable of generating a decolorizer by an electron transfer or an energy transfer from the excited state of the two-photon absorption dye in the first step;

4) a polymerization initiator capable of initiating a polymerization of a polymerizable compound by an electron transfer or an energy transfer from an excited state of the residual decolorizable dye in the second step, the polymerization initiator being servable also as 3) decolorizer precursor;

5) a polymerizable compound; and 6) a binder.

In the following, a two-photon absorption polymerization material of the invention will be explained.

Preferred examples of the two-photon absorption dye and the decolorizable dye are same as those explained in the two-photon absorption decolorizable material.

The polymerizable compound and the binder have different refractive indexes and that a composition ratio of the polymerizable compound or a polymerization product thereof and the binder becomes uneven, in a photopolymerization, between a laser focused position and a laser unfocused position, thereby enabling a recording by a refractive index modulation. In such case, the two-photon absorption polymerization material of the invention can be utilized as a two photon absorption refractive index modulation material.

In case, it is preferred that either of the polymerizable compound and the binder contains, and the other does not contain, at least an aryl group, an aromatic heterocyclic group, a chlorine atom, a bromine atom, an iodine atom or a sulfur atom.

Also at least one of the polymerizable compounds is a liquid having a boiling point equal to or higher than 100° C.

A polymerization initiator can be a radical polymerization initiator (radical generator), a cationic polymerization initiator (acid generator) or an initiator having both functions, such as a ketone, an organic peroxide, a trihalomethyl-substituted triazine, a diazonium salt, a diaryliodonium salt, a sulfonium salt, a borate salt, a diaryliodonium-organic boron complex, a sulfonium-organic boron complex, a cationic two-photon absorption dye-organic boron complex, an anionic two-photon absorption dye-onium salt complex, a metal allene complex or a sulfonate ester. Preferred examples are explained in the acid generator and the radical generator for the decolorizer precursor.

Preferred specific examples of the polymerization initiator, the polymerizable compound and the binder are described, for example, in Japanese Patent Application No. 2003-300057.

Also an acid amplifier is preferably employed for achieving a high sensitivity. Preferred specific examples of the acid amplifier are described for example in Japanese Patent Application No. 2003-182849.

There is also preferred a case of employing an anionic polymerization and a base generator as the polymerization initiator. Examples of the preferred base generator are same as those described for the base generator for the decolorizer precursor.

Also a base amplifier is preferably employed for achieving a high sensitivity. Preferred specific examples of the base amplifier are described for example in Japanese Patent Application No. 2003-178083.

In case of employing a radical polymerization initiator, the polymerizable compound preferably has an ethylenic unsaturated group such as an acryloyl group, a methacryloyl group, a styryl group or a vinyl group, and in case of employing a cationic polymerization initiator or a base generator, the polymerizable compound preferably has an oxylane ring, an oxetane ring or a vinyl ether group.

In the "residual decolorizable dye latent image-latent image sensitized polymerization method" of the invention, it is also preferable that the decolorizer precursor and the polymerization initiator are partially or entirely same and serve for both functions.

In a case where a decolorizable dye is added separately from the two-photon absorption dye and the decolorizer precursor and the polymerization initiator are different (for example a case where the decolorizer precursor is an acid generator or a base generator and the polymerization initiator is a radical polymerization initiator, or a case where the decolorizer precursor is radical generator or a nucleophilic agent generator and the polymerization initiator is an acid generator or a base generator), it is preferred that the two-photon absorption dye is capable of a sensitization by an electron transfer only to the decolorizer precursor and the polymerization initiator is capable of sensitization by an electron transfer only by the decolorizable dye.

In the following, there will be explained a concept of the "residual decolorizable dye latent image-latent image sensitized polymerization method".

For example a two-photon absorption polymerization material is irradiated with a Ti:sapphire femtosecond pulsed laser of 740 nm to cause the two-photon absorption dye to execute a two-photon absorption thereby generating an excited state. An energy transfer or an electron transfer is executed from such excited state of the two-photon absorption dye to the decolorizer precursor to generate a decolorizer, thereby decolorizes the decolorizable dye. As a result, a latent image can be formed by the residual decolorizable dye (foregoing constituting a first step). Then a light of a wavelength region of 660-740 nm is irradiated to induce a linear absorption of the residual decolorizable dye latent image, thereby activating a polymerization initiator by an electron transfer or an energy transfer and initiating a polymerization. For example, in case the polymerizable compound has a refractive index lower than that of the binder, a portion where the polymerization takes place shows a low refractive index because of a concentration of the polymerizable compound (foregoing constituting a second step). In a portion at a focused position of the laser in the first step, because of a reduced amount of the residual decolorizable dye constituting the latent image, the polymerization does not proceed much in the second step to increase a proportion of the binder, whereby a large refractive index modulation can be formed between a laser focused position and a laser unfocused position, and a recording can be achieved as a two-photon absorption refractive index modulating material. By decomposing and decolorizing the two-photon absorption dye and the decolorizable dye in the first step, the second step or the subsequent fixing step, there can be obtained a two-photon absorption polymerization (refractive index modulation) material excellent in the non-destructive reproducing property and the storability.

By irradiating the two-photon absorption polymerization (refractive index modulation) material after recording with a laser for example of 740 nm, the recorded information can be reproduced by detecting a difference in the reflectance or the transmittance between the recorded part and the unrecorded part, and the material can function as a three-dimensional optical recording material.

In such case, there is preferred a reproduction method for a three-dimensional optical recording material by irradiating a three-dimensional optical recording medium, after recording, with a laser same as or different from, in a power or a pulse shape, a laser employed for recording, and detecting a difference in reflectance or transmittance between a recorded part and a non-recorded part.

The two-photon absorption polymerization material or the two-photon absorption refractive index modulation material of the present invention is also advantageously applicable as an optical material or a three-dimensional photoshaping composition.

The two-photon absorption polymerization material or the two-photon absorption refractive index modulation material of the present invention may advantageously include, in addition to the two-photon absorption dye, the decolorizable dye, the decolorizer precursor, the polymerization initiator and the binder, various additives if necessary, such as an electron donating compound, an electron accepting compound, a crosslinking agent, a thermal stabilizer, a plasticizer, and a solvent.

An electron donating compound has a power of reducing the radical cation of the two-photon absorption dye while an electron accepting compound has a power of oxidizing the radical anion of the two-photon absorption dye, thus both having a function of regenerating the two-photon absorption dye.

In particular, the electron donating compound is effective for achieving a high sensitivity because it can promptly regenerate the radical cation of the two-photon absorption dye after the electron transfer to the decolorizer precursor. The electron donating compound preferably has an oxidation potential baser (more minus) than that of the two-photon absorption dye.

Preferred examples of the electron donating compound include an alkylamine (such as triethylamine, tributylamine, trioctylamine, N,N-dimethyldodecylamine, triethanolamine or triethoxyethylamine), an aniline (such as N,N-dioctylaniline, N,N-dimethylaniline, 4-methoxy-N,N-dibutylaniline, or 2-methoxy-N,N-dibutylaniline), a phenylenediamine (such as N,N,N',N'-tetramethyl-1,4-phenylenediamine, N,N,N',N'-tetramethyl-1,2-phenylenediamine, N,N,N',N'-tetraethyl-1,3-phenylenediamine, or N,N'-dibutylphenylenediamine), a triphenylamine (such as triphenylamine, tri(4-methoxyphenyl)amine, tri(4-dimethylaminophenyl)amine or TPD), a carbazole (such as N-vinylcarbazole, or N-ethylcarbazole), a phenothiazine (such as N-methylphenothiazine, or N-phenylphenothiazine), a phenoxazine (such as N-methylphenoxazine, or N-phenylphenoxazine), a phenazine (such as N,N'-dimethylphenazine or N,N'-diphenylphenazine), a hydroquinone (such as hydroquinone, 2,5-dimethylhydroquinone, 2,5-dichlorohydroquinone, 2,3,4,5-tetrachlorohydroquinone, 2,6-dichloro-3,5-dicyanohydroquinone, 2,3-dichloro-5,6-dicyanohydroquinone, 1,4-dihydroxynaphthalene or 9,10-dihydroxyanthracene), a cathecol (such as cathecol or 1,2,4-trihydroxybenzene), an alkoxybenzene (such as 1,2-dimethoxybenzene, 1,2-dibutoxybenzene, 1,2,4-tributoxybenzene or 1,4-dihexyloxybenzene), an aminophenol (such as 4-(N,N-diethylamino)phenol or N-octylaminophenol), an imidazole (such as imidazole, N-methylimidazole, N-octylimidazole or N-butyl-2-methylimidazole), a pyridine (such as pyridine, picoline, lutidine, 4-t-butylpyridine, 4-octyloxypyridine, 4-(N,N-dimethylamino)pyridine, 4-(N,N-dibutylamino)pyridine or 2-(N-octylamino)pyridine), a metallocene (such as ferrocene, titanocene or ruthenocene), a metal complex (such as Ru-bisbipyridine complex, Cu-phenanthroline complex, Co-trisbipyridine complex, Fe-EDTA complex, or complexes of Ru, Fe, Re, Pt, Cu, Co, Ni, Pd, W, Mo, Cr, Mn, Ir and Ag), and semiconductor fine particles (such as Si, CdSe, GaP, PbS or ZnS), more preferably a phenothiazine compound (such as N-methylphenothiazine, N-(4'-methoxyphenyl)phenothiazine), a triphenylamine compound (such as triphenylamine, tri(4'-methoxyphenyl)amine), a TPD compound (such as TPD), a phenoxazine, and a phenazine, further preferably a phehothiazine compound, and most preferably N-methylphenothiazine.

On the other hand, preferred examples of the electron accepting compound include an aromatic compound in which an electron attracting group is introduced (such as 1,4-dinitrobenzene, 1,4-dicyanobenzene, 4,5-dichloro-1,2-dicyanobenzene, 4-nitro-1,2-dicyanobenzene, 4-octanesulfonyl-1,2-dicyanobenzene, or 1,10-dicyanoanthracene), a heterocyclic compound or a heterocyclic compound in which an electron attracting group is introduced (such as pyrimidine, pyrazine, triazine, dichloropyrazine, 3-cyanopyrazole, 4,5-dicyano-1-methyl-2-octanoylaminoimidazole, 4,5-dicyanoimidazole, 2,4-dimethyl-1,3,4-thiadiazole, 5-chloro-3-phenyl-1,2,4-thiadiazole, 1,3,4-oxadiazole, 2-chlorobenzothiazole, or N-butyl-1,2,4-triazole), an N-alkylpyridinium salt (such as N-butylpyridinium iodide, N-butylpyridinium bis(trifluoromethanesulfonyl)imide, N-butyl-3-ethoxycarbonyl-pyridinium butanesulfonate, N-octyl-3-carbamoylpyridinium bis(trifluoromethanesulfonyl)imide, N,N-dimethylbiologen di(hexafluorophosphate), or N,N-diphenylbiologen bis(bis(trifluoromethanesulfonyl)imide), a benzoquinone (such as benzoquinone, 2,5-dimethylbenzoquinone, 2,5-dichlorobenzoquinone, 2,3,4,5-tetrachlorobenzoquinone, 2,6-dichloro-3,5-dicyanobenzoquinone, 2,3-dichloro-5,6-dicyanobenzoquinone, naphthoquinone or anthraquinone), an imide (such as N,N'-dioctylpyromellitimide or 4-nitro-N-octylphthalimide), a metal complex (such as a Ru-trisbipyridine complex, a Ru-bisbipyridine complex, a Co-trisbipyridine complex, a Cr-trisbipyridine complex, a $PtCl_6$ complex, or complexes of Ru, Fe, Re, Pt, Cu, Co, Ni, Pd, W, Mo, Cr, Mn, Ir or Ag), and semiconductor fine particles (such as $TiO_2$, $Nb_2O_5$, ZnO, $SnO_2$, $Fe_2O_3$ or $WO_3$).

The electron accepting compound preferably has a reduction potential more precious (more plus) than the reduction potential of the excited state of the two-photon absorption dye.

In the two-photon absorption decolorizable material of the invention, a binder is preferably employed. The binder is usually employed for the purposes of improving a film forming property of the composition, a unifonnity of film thickness and a stability in storage. The binder preferably has a satisfactory mutual solubility with the two-photon absorption dye, the decolorizable dye and the decolorizer precursor.

The binder is preferably a thermoplastic polymer soluble in a solvent, and may be employed singly or in a combination.

The binder may have a reactive site and may be crosslinked or cured by a reaction with a crosslinking agent, a polymerizable monomer or an oligomer. A reactive site in such case can preferably be a radical reactive site for example an ethylenic unsaturated group such as an acryl group or a methacryl group, a cationic reactive site for example an oxilane compound, an oxetane compound or a vinyl ether group, or a condensation polymerization reactive site for example a carboxylic group, an alcohol or an amine.

Examples of a preferred binder to be employed in the invention include an acrylate, an α-alkyl acrylate ester, an acidic polymer and an interpolymer (such as polymethyl methacrylate, polyethyl methacrylate, or a copolymer of methyl methacrylate and another alkyl (meth)acrylate ester), a polyvinyl ester (such as polyvinyl acetate, polyvinyl acetate/acrylate, polyvinyl acetate/methacrylate and hydrolyzed polyvinyl acetate), an ethylene/vinyl acetate copolymer, a saturated or unsaturated polyurethane, a butadiene or isoprene polymer/copolymer, a high-molecular polyoxyethylene of a polyglycol having a weight-averaged molecular weight of about 4,000-1,000,000, an epoxide (such as an epoxide having an acrylate group or a methacrylate group), a polyamide (such as N-methoxymethyl polyhexamethyleneazipamide), a cellulose ester (such as cellulose acetate, cellulose acetate succinate or cellulose acetate butyrate), a cellulose ether (such as methylcellulose, ethylcellulose, or ethylbenzylcellulose), polycarbonate, polyvinylacetal (such as polyvinyl butyral or polyvinyl formal), polyvinyl alcohol, polyvinylpyrrolidone, and an acid-containing polymer/copolymer functioning as a binder as described in U.S. Pat. Nos. 3,458,311 and 4,273,857.

There are also included a polystyrene polymer, or a copolymer thereof with acrylonitrile, maleic anhydride, acrylic acid, methacrylic acid or an ester thereof, a vinylidene chloride copolymer (such as a vinylidene chloride/acrylonitrile copolymer, a vinylidene chloride/methacrylate copolymer, or a vinylidene chloride/vinyl acetate copolymer), polyvinyl chloride and a copolymer thereof (such as polyvinyl chloride/acetate, or a vinyl chloride/acrylonitrile copolymer), a polyvinyl benzal synthetic rubber (such as a butadiene/acrylonitrile copolymer, an acrylonitrile/butadiene/styrene copolymer, a methacrylate/acrylonitrile/butadiene/styrene copolymer, a 2-chlorobutadiene-1,3-polymer, chlorinated rubber, a styrene/butadiene/styrene or styrene/isoprene/styrene block copolymer), a copolyester (such as a reaction product prepared from polymethylene glycol represented by a formula $HO(CH_2)_nOH$ (wherein N being an integer of 2-10) and (1) hexahydroterephthalic acid, sebacic acid and terephthalic acid, (2) terephthalic acid, isophthalic acid and sebacic acid, (3) terephthalic acid and sebacic acid, or (4) terephthalic acid and isophthalic acid, or from (5) the aforementioned glycol and (i) terephthalic acid, isophthalic acid and sebacic acid or (ii) terephthalic acid, isophthalic acid, sebacic acid and adipic acid), poly-N-vinylcarbazole and a copolymer thereof, a carbazole-containing polymer disclosed by H. Kamogawa et al., Journal of Polymer Science, Polymer Chemistry Edition, vol. 18, p. 9-18(1979), and a polycarbonate formed from bisphenol and a carbonate ester.

Also a fluorine-containing polymer is preferable as a low refractive index binder.

In the two-photon absorption decolorizable material of the invention, a thermal stabilizer may be added for improving storability in storage.

A useful thermal stabilizer can be hydroquinone, phenidone, p-methoxyphenol, an alkyl- or aryl-substituted hydroquinone or quinone, cathecol, t-butylcathecol, pyrogallol, 2-naphthol, 2,6-di-t-butyl-p-cresol, phenothiazine, or chloranile. Dinitrodimers described by Pazos in U.S. Pat. No. 4,168,982 can also be employed advantageously.

A plasticizer is employed for varying various mechanical properties such as an adhesion property, a flexibility, a hardness and the like of the two-photon absorption decolorizable material. The plasticizer can be, for example, triethylene glycol dicaprylate, triethylene glycol bis(2-ethylhexanoate), tetraethylene glycol diheptanoate, diethyl sebacate, dibutyl suberate, tris(2-ethylhexyl) phosphate, tricresyl phosphate, or dibutyl phthalate.

The two-photon absorption decolorizable material of the invention can be prepared by an ordinary method. For example, it can be prepared from the aforementioned essential components and arbitrary components, or by adding a solvent if necessary.

The solvent can be, for example, a ketone solvent such as methyl ethyl ketone, methyl isobutyl ketone, acetone, or cyclohexanone; an ester solvent such as ethyl acetate, butyl acetate, ethylene glycol diacetate, ethyl lactate, or cellosolve acetate; a hydrocarbon solvent such as cyclohexane, toluene or xylene; an ether solvent such as tetrahydrofuran, dioxane or diethyl ether; a cellosolve solvent such as methyl cellosolve, ethyl cellosolve, butyl cellosolve, or dimethyl cellosolve; an alcohol solvent such as methanol, ethanol, n-propanol, 2-propanol, n-butanol, or diacetone alcohol; a fluorinated solvent such as 2,2,3,3-tetrafluoropropanol; a halogenated hydrocarbon solvent such as dichloromethane, chloroform or 1,2-dichloroethane; an amide solvent such as N,N-dimethylformamide; or a nitrile solvent such as acetonitrile or propionitrile.

The two-photon absorption decolorizable material of the invention can be directly coated on a substrate or spin coated, or cast as a film and laminated on a substrate by an ordinary method. The employed solvent can be eliminated by evaporation at the drying.

In case of employing the two-photon absorption decolorizable material or the two-photon absorption polymerization material of the invention for an optical recording medium, the two-photon absorption decolorizable material or the two-photon absorption polymerization material is preferably stored, in a storage state, in a light-shielding cartridge. It is also preferable that the two-photon absorption decolorizable material or the two-photon absorption polymerization material is provided on a front surface and/or a rear surface thereof with a light cut-off filter capable of intercepting a part of the ultraviolet, visible and infrared wavelength regions, excluding the wavelengths of the recording light and the reproducing light.

In case of employing the two-photon absorption decolorizable material or the two-photon absorption polymerization material of the invention for an optical recording medium, the optical recording medium may have a disk shape, a card shape, a tape shape or any other shape.

EXAMPLES

In the following there will be shown examples of the present invention based on experimental results, but the invention is not limited to such examples.

Example 1

Synthesis of Two-Photon Absorption Dye of the Invention (1) Synthesis of D-73

A two-photon absorption dye D-73 of the invention can be synthesized by a following method.

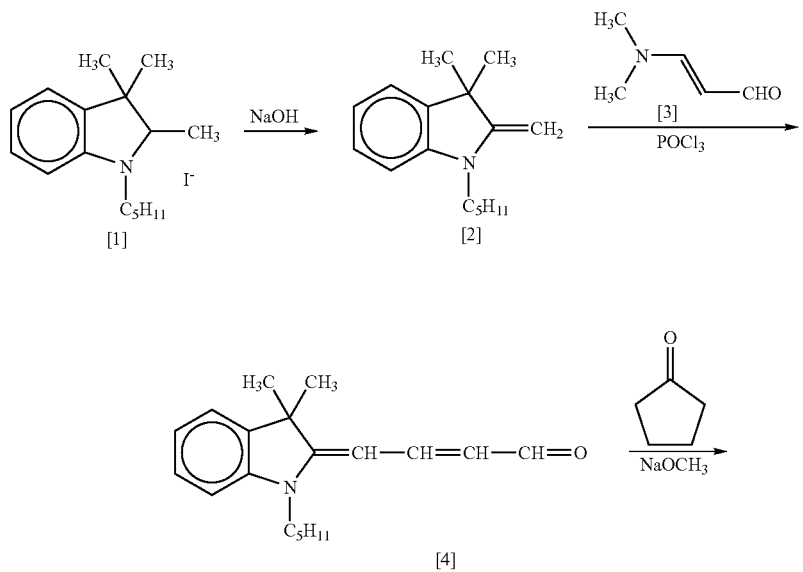

-continued

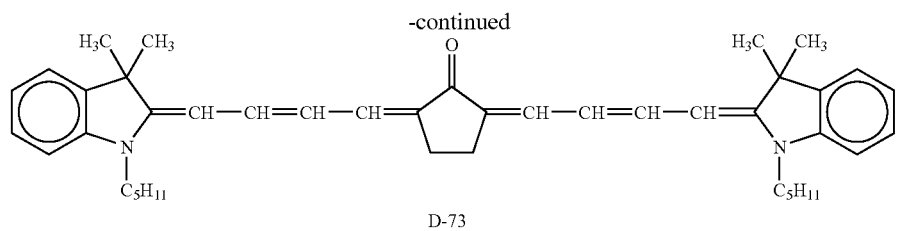

D-73

14.3 g (40 mmol) of a quaternary salt [1] were dissolved in 50 ml of water, then 1.6 g (40 mmol) of sodium hydroxide were added and the mixture was agitated for 30 minutes at the room temperature. An extraction with ethyl acetate was conducted three times, and the extract was dried over magnesium sulfate and concentrated to obtain 9.2 g (yield 100%) of a methylene base oil [2].

3.97 g (40 mmol) of dimethylacrolein [3] were dissolved in 50 ml of acetonitrile, then 6.75 g (44 mmol) of phosphor oxychloride were dropwise added under cooling at 0° C., and the mixture was agitated for 10 minutes at 0° C. Then an acetonitrile solution of 9.2 g of methylene base [2] was dropwise added, and the mixture was agitated for 4 hours at 35° C. After it was poured in 100 ml of iced water, 16 g of sodium hydroxide were added, and the mixture was refluxed for 10 minutes. After cooling, an extraction with ethyl acetate was conducted three times, and the extract was dried over magnesium sulfate and concentrated. A purification with silica gel chromatography (developing solvent: ethyl acetate:hexane=1:10→1:3) provided 4.4 g (yield 39%) of oil of an aldehyde [4]

0.126 g (1.5 mmol) of cyclopentanone and 0.85 g (3 mmol) of aldehyde [4] were dissolved in 30 ml of dehydrated methanol, and were refluxed in a nitrogen atmosphere and in a dark place. After the mixture became uniform, 0.69 g (3.6 mmol) of a 28% methanol solution of sodium methoxide were added, and refluxing was continued for 6 hours. After cooling, precipitated crystals were separated by a filtration and washed with methanol to obtain 0.50 g (yield 54%) of deep green crystals of D-73. The structure was confirmed by an NMR spectrum, an MS spectrum and an elementary analysis.

(2) Synthesis of D-84

A two-photon absorption dye D-84 of the invention can be synthesized by a following method.

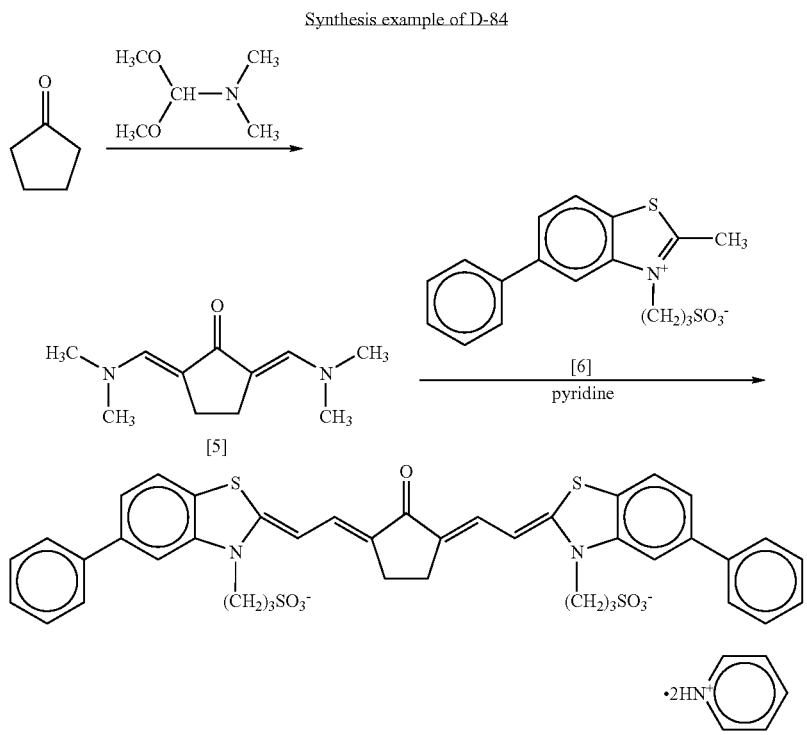

33.6 g (0.4 mol) of cyclopentanone, 2 ml of DBN and 400 g of N,N-dimethylformamide dimethylacetal were refluxed for 5 days. The mixture, after concentration, was added with acetone and cooled, and resulting crystals were separated by filtration and washed with cold acetone to obtain 32.4 g (yield 42%) of crystals [5].

0.78 g (4 mmol) of the compound [5], 2.78 g (8 mmol) of a quaternary salt [6] and 20 ml of pyridin were in a nitrogen atmosphere and in a dark place. After cooling, ethyl acetate was added and resulting crystals were separated by filtration and washed with ethyl acetate. The crystals were dispersed in methanol and separated by filtration to obtain 2.14 g (yield 56%) of deep blue crystals of the desired compound D-84.

The structure was confirmed by an NMR spectrum, an MS spectrum and an elementary analysis.

Also, other two-photon absorption dyes of the general formula (1) of the invention can be synthesized by methods similar to those for D-73 or D-84 or a method described in Tetrahedron Lett., vol. 42, p. 6192(2001).

(3) Synthesis of D-1

A two-photon absorption dye D-1 of the invention can be synthesized by a following method.

Synthesis example of D-1

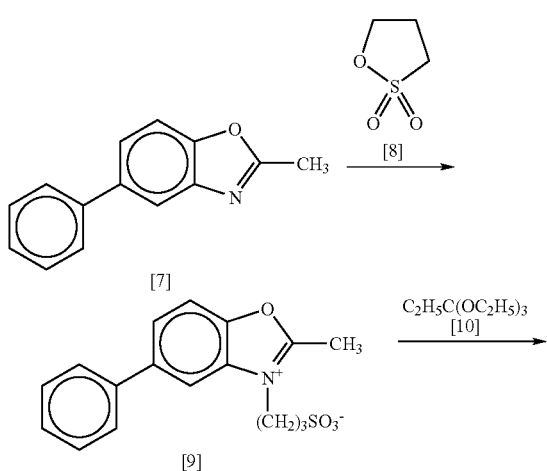

-continued

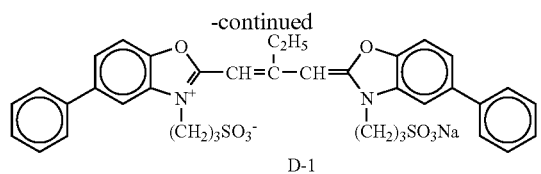

D-1

52.25 g (0.2 mol) of benzoxazole [7] and 45.75 g (0.375 mol) of propanesultone [8] were agitated under heating at 140° C. for 4 hours. After cooling, acetone was added and resulting crystals were separated by filtration, and washed with acetone to obtain 70.42 g (yield 85%) of a quaternary salt [9].

66.2 g (0.2 mol) of the quaternary salt [9], 200 ml of triethyl orthopropionate [10], 200 mol of pyridine, and 80 ml of acetic acid were agitated under heating at 120° C. for 1 hour. After cooling, a product was decantation washed with ethyl acetate three times, and dissolved in 100 ml of methanol, then a solution of 4.0 g (50 mmol) of sodium acetate in 20 ml of methanol was added under agitation, and resulting crystals were separated by filtration. The crystals were again dispersed in methanol and separated by filtration to obtain 31.36 g (yield 43.4%) of carmine colored crystals of the desired compound D-1.

The structure was confirmed by an NMR spectrum, an MS spectrum and an elementary analysis.

(4) Synthesis of D-42

A two-photon absorption dye D-42 of the invention can be synthesized by a following method.

Synthesis example of D-42

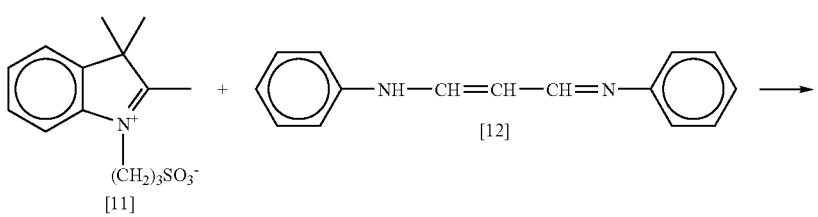

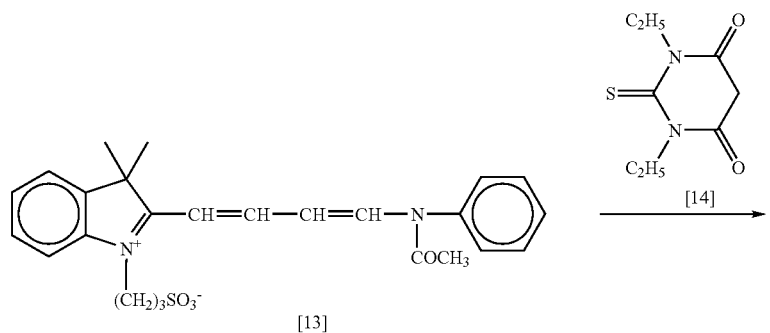

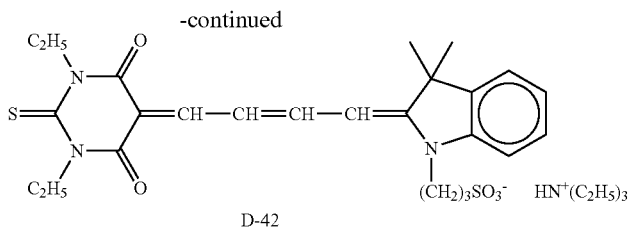
D-42

2.81 g (10 mmol) of a quaternary salt [11], 6.67 g (30 mmol) of a compound [12], 10 g of acetic anhydride and 50 ml of acetonitrile were refluxed for 30 minutes. The mixture, after concentration, was subjected to a decantation with ethyl acetate to obtain a crude anil compound [13].

The crude anil compound [13] was refluxed with 2.00 g (10 mmol) of thiobarbituric acid [14], 3.0 g (30 mmol) of triethylamine and 100 ml of ethanol. After concentration, a purification with silica gel chromatography (developing solvent: chloroform:methanol=20:1→10:1) provided 2.55 g (total yield 41.3%) of crystals of the desired compound D-42.

The structure was confirmed by an NMR spectrum, an MS spectrum and an elementary analysis.

(4) Synthesis of D-56

A two-photon absorption dye D-56 of the invention can be synthesized by a following method.

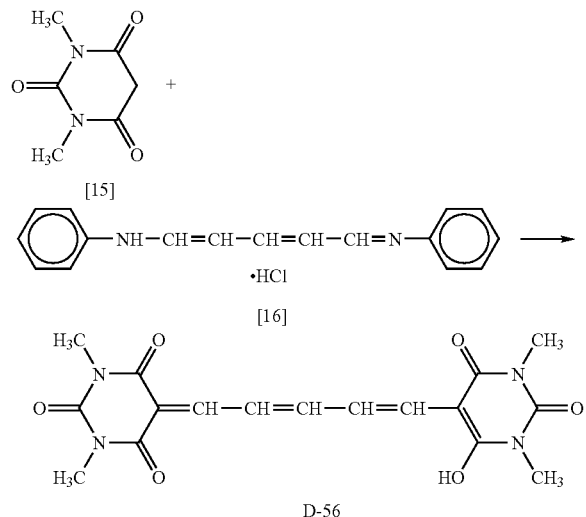

Sythesis example of D-56

3.12 g (20 mmol) of barbituric acid [15], 2.85 g (10 mmol) of a compound [16] and 4.1 g (40 mmol) of triethylamine were dissolved in 30 ml of DMF and agitated for 2 hours at the room temperature. Crystals resulting by an addition of dilute hydrochloric acid, washed with water and dried to obtain 2.99 g (yield 80.0%) of the desired compound D-56.

The structure was confirmed by an NMR spectrum, an MS spectrum and an elementary analysis.

Also other cyanine dyes, merocyanine dyes, oxonol dyes and the like can be synthesized according to methods described for example in F. M. Harmer, "Heterocyclic Compounds-Cyanine Dyes and Related Compounds", John Wiley & Sons, New York-London, 1964, and D. M. Sturmer, "Heterocyclic Compounds-Special topics in heterocyclic chemistry", chap. 18, paragraph 14, p. 482-515, John Wiley & Sons, New York-London.

However, the synthetic method for the two-photon absorption dye of the invention is not limited thereto.

A decolorizable dye and a decolorizer precursor of the invention are often commercially available or can be synthesized by known methods.

Example 2

[Evaluation of Three-Dimensional Refractive Index/Absorbance Modulation by Two-Photon Absorption Decolorizable Material]

In the following, there will be explained a three-dimensional refractive index modulation method and a three-dimensional absorbance modulation method utilizing a decolorization of a decolorizable dye, caused by a two-photon absorption of the two-photon absorption material of the invention.

Samples 101-103 of the two-photon absorption decolorizable material of the present invention and Comparative Samples 1-3 were prepared with following compositions.

<Sample 101: Two-Photon Absorption Decolorizable Material Composition of the Invention (Combination of Acid Generator and Acid Decolorizable Dye)>

| | |
|---|---|
| two-photon absorption dye: D-128 | 2 parts by mass |
| electron donating compound: ED-1 | 21 parts by mass |
| decolorizer precursor: diphenyliodonium hexafluorophosphate | 25 parts by mass |
| decolorizable dye: G-57 | 10 parts by mass |
| binder: poly(methyl methacrylate - 5% ethyl acrylate) copolymer (Aldrich Inc.) (average molecular weight: 101,000) | 42 parts by mass |
| solvent: methylene chloride (acetone, acetonitrile or methanol employed if necessary) | 300 parts by mass |

<Comparative Sample 1>

| | |
|---|---|
| decolorizer precursor: diphenyliodonium hexafluorophosphate | 25 parts by mass |
| decolorizable dye: G-57 | 10 parts by mass |
| binder: poly(methyl methacrylate - 5% ethyl acrylate) copolymer (Aldrich Inc.) (average molecular weight: 101,000) | 65 parts by mass |
| solvent: methylene chloride (acetone, acetonitrile or methanol employed if necessary) | 300 parts by mass |

<Sample 102: Two-Photon Absorption Decolorizable Material Composition of the Invention (Combination of Base Generator and Base Decolorizable Dye)>

| | |
|---|---|
| two-photon absorption dye: D-128 | 2 parts by mass |
| electron donating compound: ED-1 | 21 parts by mass |
| decolorizer precursor: PB-3 | 20 parts by mass |
| decolorizable dye: G-88 ($X_{51}$:$PF_6^-$) | 10 parts by mass |
| binder: polymethyl methacrylate (Aldrich Inc.)(average molecular weight: 120,000) | 47 parts by mass |
| solvent: methylene chloride (acetone, acetonitrile or methanol employed if necessary) | 300 parts by mass |

<Comparative Sample 2>

| | |
|---|---|
| decolorizer precursor: PB-3 | 20 parts by mass |
| decolorizable dye: G-88 ($X_{51}$:$PF_6^-$) | 10 parts by mass |
| binder: polymethyl methacrylate (Aldrich Inc.)(average molecular weight: 120,000) | 70 parts by mass |
| solvent: methylene chloride (acetone, acetonitrile or methanol employed if necessary) | 300 parts by mass |

<Sample 103: Two-Photon Absorption Decolorizable Material Composition of the Invention (Utilizing a Decolorizable Dye Decolorized by a Bond Cleavage by an Electron Transfer as Shown in G-106 to 129)>

| | |
|---|---|
| two-photon absorption dye: D-128 | 2 parts by mass |
| electron donating compound: ED-1 | 21 parts by mass |
| decolorizer precursor: G-111 | 20 parts by mass |
| base: trioctylamine | 5 parts by mass |
| binder: polymethyl methacrylate (Aldrich Inc.)(average molecular weight: 120,000) | 52 parts by mass |
| solvent: methylene chloride (acetone, acetonitrile or methanol employed if necessary) | 300 parts by mass |

<Comparative Sample 3>

| | |
|---|---|
| decolorizer precursor: G-111 | 20 parts by mass |
| base: trioctylamine | 5 parts by mass |
| binder: polymethyl methacrylate (Aldrich Inc.)(average molecular weight: 120,000) | 75 parts by mass |
| solvent: methylene chloride (acetone, acetonitrile or methanol employed if necessary) | 300 parts by mass |

Each of the samples 101-103 and Comparative Samples 1-3 was coated on a glass substrate with a blade so as to obtain a thickness of about 40 μm thereby forming a photosensitive layer, and the solvent was distilled off by drying at 40° C. for 3 minutes. Then the photosensitive layer was covered with a TAC film to obtain two-photon absorption decolorizable materials 101-103 and comparative samples 1-3.

A refractive index of the film of the samples 101, 102 and 103, measured with an ellipsometer, was respectively 1.62, 1.60 and 1.65 at 740 nm.

For evaluating the performance of the two-photon absorption polymerizable composition of the invention, a Ti:sapphire pulsed laser (pulse width: 100 fs, repeating frequency: 80 MHz, average output: 1 W, peak power: 100 kW) measurable within a wavelength range of 700-1000 nm was employed to irradiate the two-photon absorption decolorizable material of the invention with a laser beam concentrated with a lens of an NA 0.6.

The irradiation was conducted at a wavelength showing a maximum cross section δ of two-photon absorption in a $10^{-4}$ M solution of the two-photon absorption dye.

In Samples 101-103 and Comparative Samples 1-3, a two-photon absorption was induced by a laser light irradiation of a wavelength of 740 nm. As a result, in Samples 101-103, a decolorization of the decolorizable dye was confirmed at a laser focused position in an irradiated portion. A refractive index in the decolorized part, measured with an ellipsometer, was respectively 1.50, 1,50 and 1.58, showing a significant decrease in comparison with a residual portion of the decolorizable dye. Also under an irradiation with a laser light of 740 nm, a difference in a reflectance could be confirmed between a recorded part where the decolorizable dye was decolorized and a non-recorded part where the decolorizable dye remained. Also a difference in the absorbance between the recorded part and the non-recorded part could be confirmed by an observation under a microscope.

On the other hand, Comparative Samples 1-3 not containing the two-photon absorption dye D-128 of the invention did not show any change under a laser light irradiation of 740 nm. Therefore, the decolonization of the decolorizable dye in the two-photon absorption decolorizable material is evidently caused by an excited state which the two-photon absorption dye generates by a two-photon absorption.

It was also confirmed that, by moving a laser focus position in a scanning motion in a horizontal and vertical direction, the decolorization could be caused in an arbitrary position in the three-dimensional space, whereby a three-dimensional modulation in refractive index or absorbance was made possible.

It was also confirmed that the decolorizable dye could be similarly decolorized by the two-photon absorption in case of changing, in Samples 101-103, the two-photon absorption dye to D-1, D-5, D-22, D-41, D-56, D-58, D-73, D-75, D-77, D-117, D-118, D-123, D-132, D-142 or D-143; or in Sample 101, changing the decolorizer precursor (acid generator) to 2-(4'-methoxyphenyl)-4,6-bis(trichloromethyl)-1,3,5-triazine, 4-diethylaminophenyl diazonium tetrafluoroborate, di(t-butylphenyl)iodonium tetra(pentafluorophenyl)borate, diphenyliodonium methanesulfonate, tris(4-methylphenyl) sulfonium tetra(pentafluorophenyl)borate, triphenylsulfonium methanesulfonate, triphenylsulfonium perfluoropentanoate, bis(1-(4-diphenylsulfonium)phenylsulfide triflate, dimethylphenacylsulfonium hexafluorophosphate, benzoin toxylate, 2,6-dinitrobenzyl tosylate or N-tosylphthalimide; or in Sample 101, changing the acid decolorizable dye to G-38, G-40, G-44, G-45, G-46, G-50, G-51, G-56, G-68, G-69, G-70, G-71, G-72, G-75, G-76, G-79 or G-81; or in Sample 102, changing the decolorizer precursor (base generator) to PB-4, PB-8, PB-10, PB-12, PB-13, PB-19, PB-22, PB-32, PB-33 or PB-52; or in Sample 102, changing the base decolorizable dye to G-84, G-87, G-89, G-90, G-92, G-93, G-95, G-96 or G-102; or in Sample 103, changing the decolorizable dye to G-107, G-109, G-110, G-114, G-117, G-119, G-120, G-122, G-123, G-126 or G-129; or in Samples 101-103, changing the electron donating compound (ED-1: N-methylphenothiazine) to N-phenylphenothiazine, N-(methoxyphenyl)phenothiazine, tri(methoxyphenyl)amine, triphenylamine or TPD; or in Samples 101-103, changing the binder to poly(butyl methacrylate-co-isobutyl methacrylate), polyvinyl acetate, cellulose acetate butyrate, polystyrene or polycarbonate.

In the foregoing, the two-photon absorption was induced with a laser wavelength optimum to each system.

Example 3

[Two-Photon Absorption Polymerization Method by Residual Decolorizable Dye Latent Image—Latent Image Sensitized Polymerization Method]

In the following, there will be explained a three-dimensional refractive index modulation method by a two-photon absorption polymerization material which causes a polymerization by a latent image of the residual decolorizable dye.

Two-photon absorption polymerization materials 201-204 were prepared, in a dark room, by dissolving a two-photon absorption dye, an electron donating compound, a decolorizable dye, a decolorizer precursor, a polymerization initiator, a polymerizable compound and a binder in methylene chloride of 2-5 times amount (acetone, acetonitrile or methanol being partially employed if necessary) as shown in Table 1. In Table 1, percentage is represented by wt. %.

TABLE 1

| sample | two-photon absorption dye electron donating compound | | decolorizable dye | | decolorizer precursor polymeriza-tion initiator | | polymerizable compound binder | |
|---|---|---|---|---|---|---|---|---|
| 201 | D-128 | 1% | G-57 | 5% | I-101 | 13% | M-1 | 35% |
|  | ED-1 | 10% |  |  |  |  | polymethylphenyl siloxane | 36% |
| 202 | D-128 | 1% | G-57 | 5% | I-101 | 13% | TEGDA | 35% |
|  | ED-1 | 10% |  |  |  |  | poly(styrene-acrylonitrile) 75:25 | 36% |
| 203 | D-128 | 1% | G-93 | 5% | PB-3 | 13% | M-1 | 35% |
|  | ED-1 | 10% | ($X_{51}$:$PF_6$) |  |  |  | polymethylphenyl siloxane | 36% |
| 204 | D-128 | 1% | G-108 | 13% |  |  | DDA 28%, PFOM 7% |  |
|  | ED-1 | 10% |  |  | I-102 | 2.4% + MBO 1.6% | polystyrene | 37% |

I-101

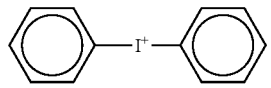

I-102

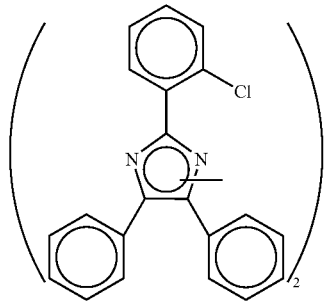

MBO

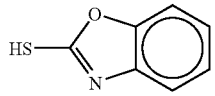

ED-1

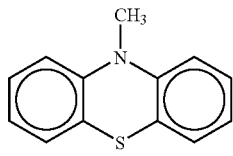

M-1

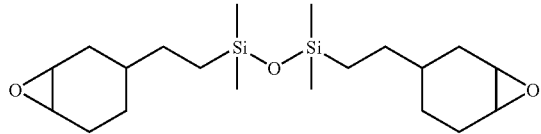

DDA

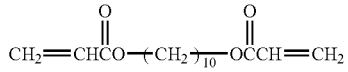

PFOM

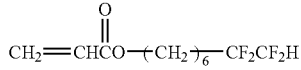

TEGDA

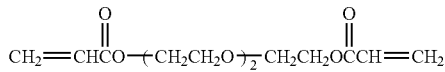

Each of the samples 201-204 was coated on a glass substrate with a blade so as to obtain a thickness of about 40 μm thereby forming a photosensitive layer, and the solvent was distilled off by drying at 40° C. for 3 minutes. Then the photosensitive layer was covered with a TAC film to obtain two-photon absorption polymerization materials 201-204.

For evaluating the performance of the two-photon absorption polymerizable composition of the invention, a Ti:sapphire pulsed laser (pulse width: 100 fs, repeating frequency: 80 MHz, average output: 1 W, peak power: 100 kW) measurable within a wavelength range of 700-1000 nm was employed to irradiate the two-photon absorption polymerization material of the invention with a laser beam concentrated with a lens of an NA 0.6.

The irradiation was conducted at a wavelength showing a maximum cross section δ of two-photon absorption in a $10^{-4}$ M solution of the two-photon absorption dye.

In Samples 201-204, a two-photon absorption was induced by a laser light irradiation of a wavelength of 740 nm (first step). As a result, a decolorization of the decolorizable dye was slightly confirmed at a laser focused position in an irradiated portion. Then by a flush exposure to a light of a wavelength range of 660-740 nm (second step), it was confirmed that a polymerization was induced, utilizing the residual decolorizable dye as a latent image. As a result, it was confirmed that, in each of Samples 201-204, a refractive index difference of about 0.04 was formed between a laser focused position (recorded part) and a laser non-focused position (non-recorded part). Also under an irradiation with a laser light of 740 nm in Samples 201-204, a difference in a reflectance, resulting from a difference in the refractive index, could be confirmed between a recorded part and a non-recorded part.

Also in Samples 201-204, a refractive index modulation only by the laser irradiation of 740 nm in the first step only was found to require an irradiation time of about 5 times, in order to obtain a similar modulation as in the case of employing the second step. This result indicates that the recording method of the invention is capable of an amplification of about 5 times in the second step. It was also confirmed that a further amplification was also possible by further extending the irradiation time in the second step.

Therefore, in the two-photon absorption polymerization method utilizing the two-photon absorption dye of a high sensitivity of the invention, by forming a latent image of the residual decolorizable dye by a two-photon absorption in a laser focused (recorded) part and in a laser unfocused (non-recorded) part (first step), and by irradiating such latent image of the residual decolorizable dye with a laser of a wavelength region in which the two-photon absorption compound does not have a linear absorption and the decolorizable dye has a linear absorption thereby causing only the decolorizable dye to execute a linear absorption and inducing a polymerization (second step), it is rendered possible to induce a polymerization efficiently according to the latent image (a linear absorption being generally far better in efficiency than a two-photon absorption). It is thus possible to induce a polymerization with a much higher efficiency than in a prior case where a polymerization is induced by a two-photon absorption only, and to achieve a refractive index modulation utilizing such polymerization, whereby a recording by a polymerization and a refractive index modulation is made possible with a sensitivity much higher than in the prior methods. Also since the recording relies on the two-photon absorption, the refractive index can be modulated three-dimensionally between a laser focused (recorded) part and an unfocused (non-recorded) part, thereby varying an optical reflectance, and enabling applications to a three-dimensional optical recording material, a recording/reproducing method therefor and an optical material.

It was also confirmed that, by moving a laser focus position in a scanning motion in a horizontal and vertical direction, the decolorization could be caused in an arbitrary position in the three-dimensional space, whereby a three-dimensional modulation in refractive index or absorbance was made possible.

It was also confirmed that the polymerization could be similarly induced utilizing the residual decolorizable dye as the latent image, in case of changing, in Samples 201-204, the two-photon absorption dye to D-1, D-5, D-22, D-41, D-56, D-58, D-73, D-75, D-77, D-117, D-118, D-123, D-132, D-142 or D-143; or in Samples 201 and 202, changing the decolorizer precursor serving also as the acid or radical polymerization initiator (acid generator or acid/radical generator) to 2-(4'-methoxyphenyl)-4,6-bis(trichloromethyl)-1,3,5-triazine, 4-diethylaminophenyl diazonium tetrafluoroborate, di(t-butylphenyl)iodonium tetra(pentafluorophenyl)borate, diphenyliodonium methanesulfonate, tris(4-methylphenyl)sulfonium tetra(pentafluorophenyl)borate, triphenylsulfonium methanesulfonate, triphenylsulfonium perfluoropentanoate, bis(1-(4-diphenylsulfonium)phenylsulfide triflate, dimethylphenacylsulfonium hexafluorophosphate, benzoin toxylate, 2,6-dinitrobenzyl tosylate or N-tosylphthalimide; or in Samples 201 and 202, changing the acid decolorizable dye to G-38, G-40, G-44, G-46, G-50, G-51, G-56, G-68, G-69, G-70, G-71, G-72, G-75, G-76, G-79 or G-81; or in Sample 203, changing the decolorizer precursor serving also as an anionic polymerization initiator (base generator) to PB-4, PB-8, PB-10, PB-12, PB-13, PB-19, PB-22, PB-32, PB-33 or PB-52; or in Sample 203, changing the base decolorizable dye to G-87, G-88, G-89, G-90, G-92, G-95, G-96 or G-102; or in Sample 204, changing the decolorizable dye to G-107, G-114, G-117, G-119, G-120, G-126 or G-129; or in Samples 201-204, changing the electron donating compound (ED-1: N-methylphenothiazine) to N-phenylphenothiazine, N-(methoxyphenyl)phenothiazine, tri(methoxyphenyl)amine, triphenylamine or TPD.

In the foregoing, the laser wavelength for the two-photon absorption, the wavelength of the light for flush exposure and the wavelength of the light for observing the change in the reflectance by the refractive index modulation were selected as wavelengths optimum to each system.

A two-photon absorption decolorizable material or a two-photon absorption polymerization method utilizing a highly sensitive two-photon absorption dye of the present invention allows to achieve a three-dimensional modulation in a refractive index or an absorbance, between a laser focused position (recorded part) and a laser unfocused position (unrecorded part) with a significantly higher sensitivity than in a prior method, and is therefore applicable to a three-dimensional optical recording material, a three-dimensional display or an optical material.

The entire disclosure of each and every foreign patent application from which the benefit of foreign priority has been claimed in the present application is incorporated herein by reference, as if fully set forth.

What is claimed is:

1. A two-photon absorption decolorizable material comprising:
  a two-photon absorption dye executing a two-photon absorption;

a separate or additional decolorizable dye having a molar absorption coefficient equal to or less than 100 at a wavelength of a light irradiated at the two-photon absorption; and an electron donating compound capable of reducing a radical cation of the two-photon absorption dye, wherein the decolorizable dye is decolorized by an electron transfer or an energy transfer utilizing an excitation energy obtained by the two-photon absorption of the two-photon absorption dye, and wherein the electron donating compound is a phenothiazine.

2. A two-photon absorption polymerization method comprising:

a first step in which a two-photon absorption dye executes a two-photon absorption to generate an excited state, and, utilizing an excitation energy thereof, decolorizes a decolorizable dye having a molar absorption coefficient equal to or less than 100 at a wavelength of a light irradiated at the two-photon absorption, thereby forming a latent image by a residual decolorizable dye that is not decolorized; and a second step of irradiating the latent image of the residual decolorizable dye with a light thereby inducing a polymerization based on a linear absorption of the residual decolorizable dye.

3. A two-photon absorption polymerization method according to claim 2, wherein, in the first step, the two-photon absorption dye executes a two-photon absorption to generate an excited state, and executes an energy transfer or an electron transfer with a decolorizer precursor different from the decolorizable dye and the two-photon absorption dye, to generate therefrom a decolorizer, which decolorizes the decolorizable dye, thereby forming a latent image by a residual decolorizable dye that is not decolorized, and in the second step, the latent image of the residual decolorizable dye is irradiated with a light to generate an excited state based on a linear absorption of the residual decolorizable dye, and a polymerization initiator is activated by an energy transfer or an electron transfer, thereby inducing a polymerization.

4. A two-photon absorption polymerization material comprising a group of compounds capable of the two-photon absorption polymerization method according to claim 2, the compounds comprising:

1) a two-photon absorption dye capable of executing a two-photon absorption to generate an excited state in the first step;

2) a decolorizable dye having a molar absorption coefficient equal to or less than 100 at a wavelength of a light irradiated at the two-photon absorption, that can be decolorized as a result of an electron transfer or an energy transfer directly from the excited state of the two-photon absorption dye in the first step;

3) a polymerization initiator capable of initiating a polymerization of a polymerizable compound by an electron transfer or an energy transfer from an excited state of the residual decolorizable dye in the second step;

4) a polymerizable compound; and 5) a binder.

5. A two-photon absorption polymerization material comprising a group of compounds capable of the two-photon absorption polymerization method according to claim 3, the compounds comprising:

1) a two-photon absorption dye capable of executing a two-photon absorption to generate an excited state in the first step;

2) a decolorizable dye having a molar absorption coefficient equal to or less than 100 at a wavelength of a light irradiated at the two-photon absorption, that can be decolorized as a result of an electron transfer or an energy transfer from the excited state of the two-photon absorption dye to a decolorizer precursor in the first step;

3) a decolorizer precursor capable of generating a decolorizer by an electron transfer or an energy transfer from the excited state of the two-photon absorption dye in the first step;

4) a polymerization initiator capable of initiating a polymerization of a polymerizable compound by an electron transfer or an energy transfer from an excited state of the residual decolorizable dye in the second step, the polymerization initiator being servable also as 3) decolorizer precursor;

5) a polymerizable compound; and 6) a binder.

6. A two-photon absorption refractive index modulation material comprising a two-photon absorption polymerization material according to claim 4, wherein a recording by a refractive index modulation is executed by a fact that the polymerizable compound and the binder have different refractive indexes and that a composition ratio of the polymerizable compound or a polymerization product thereof and the binder becomes uneven, in a photopolymerization in the second step, between a portion where a two-photon absorption takes place and a portion where a two-photon absorption does not take place.

7. A two-photon absorption refractive index modulation material comprising a two-photon absorption polymerization material according to claim 5, wherein a recording by a refractive index modulation is executed by a fact that the polymerizable compound and the binder have different refractive indexes and that a composition ratio of the polymerizable compound or a polymerization product thereof and the binder becomes uneven, in a photopolymerization in the second step, between a portion where a two-photon absorption takes plate and a portion where a two-photon absorption does not take place.

8. A three-dimensional optical recording material comprising a two-photon absorption decolorizable material, which comprises:

a two-photon absorption dye executing a two-photon absorption; and a separate or additional decolorizable dye having a molar absorption coefficient equal to or less than 100 at a wavelength of a light irradiated at the two-photon absorption, and wherein the decolorizable dye is decolorized by an electron transfer or an energy transfer utilizing an excitation energy obtained by the two-photon absorption of the two-photon absorption dye, said three-dimensional optical recording material being stored in a light-shielding cartridge.

9. A three-dimensional optical recording material comprising a two-photon absorption refractive index modulation material, which comprises a two-photon absorption decolorizable material, said two-photon absorption decolorizable material comprising:
  a two-photon absorption dye executing a two-photon absorption; and
  a separate or additional decolorizable dye having a molar absorption coefficient equal to or less than 100 at a wavelength of a light irradiated at the two-photon absorption,
  wherein the decolorizable dye is decolorized by an electron transfer or an energy transfer utilizing an excitation energy obtained by the two-photon absorption of the two-photon absorption dye,
said three-dimensional optical recording material being stored in a light-shielding cartridge.

* * * * *